United States Patent
Booth, Jr. et al.

(10) Patent No.: US 7,550,773 B2
(45) Date of Patent: Jun. 23, 2009

(54) FINFET WITH TOP BODY CONTACT

(75) Inventors: Roger A. Booth, Jr., Wappingers Falls, NY (US); Kangguo Cheng, Beacon, NY (US); Jack A. Mandelman, Flat Rock, NC (US)

(73) Assignee: International Business Machines Corporation, Armonk, NY (US)

( * ) Notice: Subject to any disclaimer, the term of this patent is extended or adjusted under 35 U.S.C. 154(b) by 180 days.

(21) Appl. No.: 11/769,032

(22) Filed: Jun. 27, 2007

(65) Prior Publication Data

US 2009/0001464 A1    Jan. 1, 2009

(51) Int. Cl.
*H01L 29/04* (2006.01)
*H01L 31/036* (2006.01)

(52) U.S. Cl. .................. 257/72; 257/347; 257/E29.117

(58) Field of Classification Search .................. 257/72, 257/347, 377, 382, E27.112, E29.117, E29.287
See application file for complete search history.

(56) References Cited

U.S. PATENT DOCUMENTS

| 6,774,390 B2 * | 8/2004 | Sugiyama et al. ............. 257/19 |
| 6,913,960 B2 | 7/2005 | Bryant et al. |
| 2006/0091463 A1 | 5/2006 | Donze et al. |

\* cited by examiner

*Primary Examiner*—Hoai v Pham
(74) *Attorney, Agent, or Firm*—Scully, Scott, Murphy & Presser, P.C.; Joseph P. Abate, Esq.

(57) ABSTRACT

FinFETs are provided with a body contact on a top surface of a semiconductor fin. The top body contact may be self-aligned with respect to the semiconductor fin and the source and drain regions. Alternately, the source and drain regions may be formed recessed from the top surface of the semiconductor fin. The body or an extension of the body may be contacted above the channel or above one of the source and drain regions. Electrical shorts between the source and drain and the body contacts are avoided by the recessing of the source and drain regions from the top surface of the semiconductor fin.

1 Claim, 48 Drawing Sheets

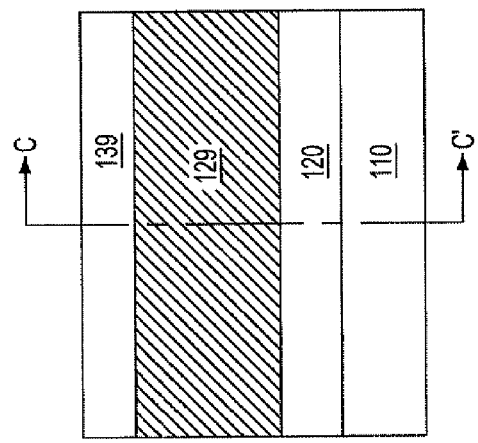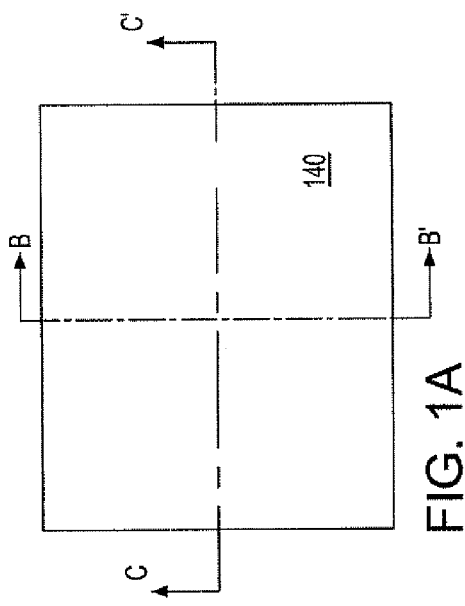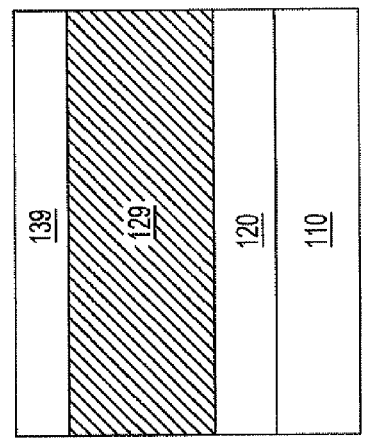

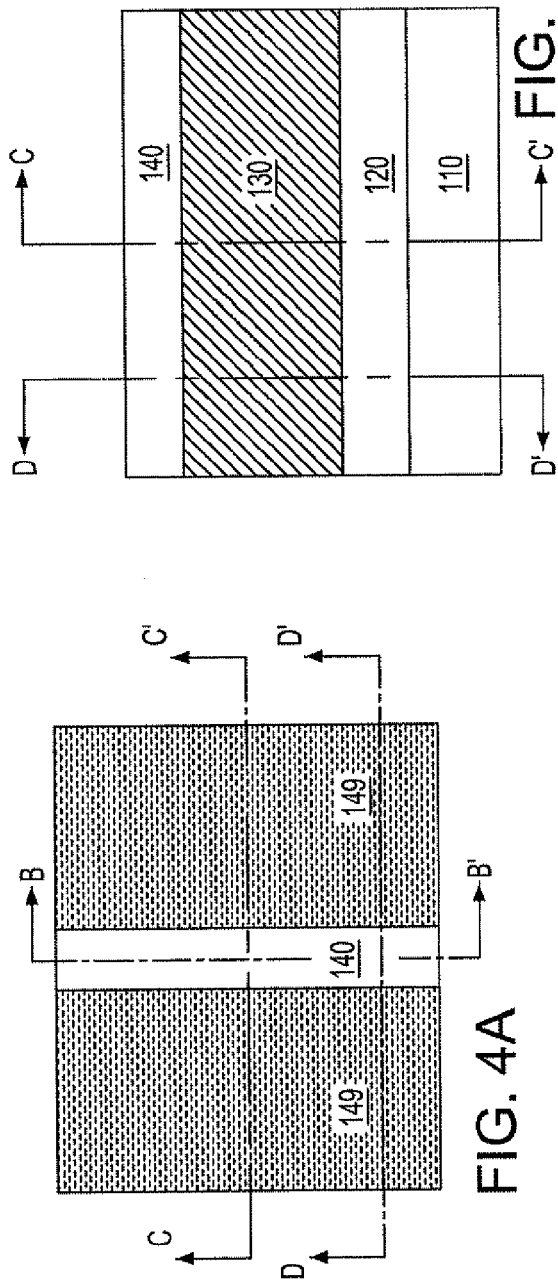
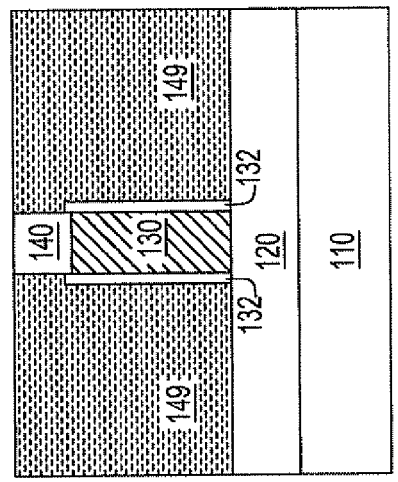
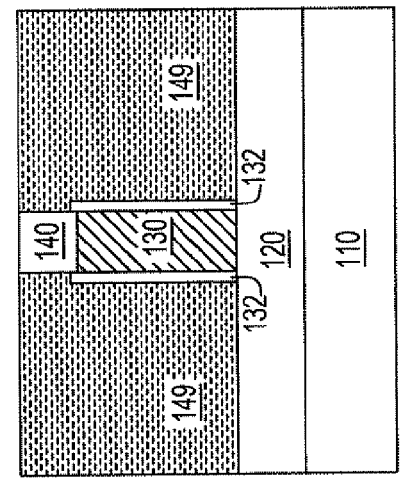
FIG. 4A
FIG. 4B
FIG. 4C
FIG. 4D

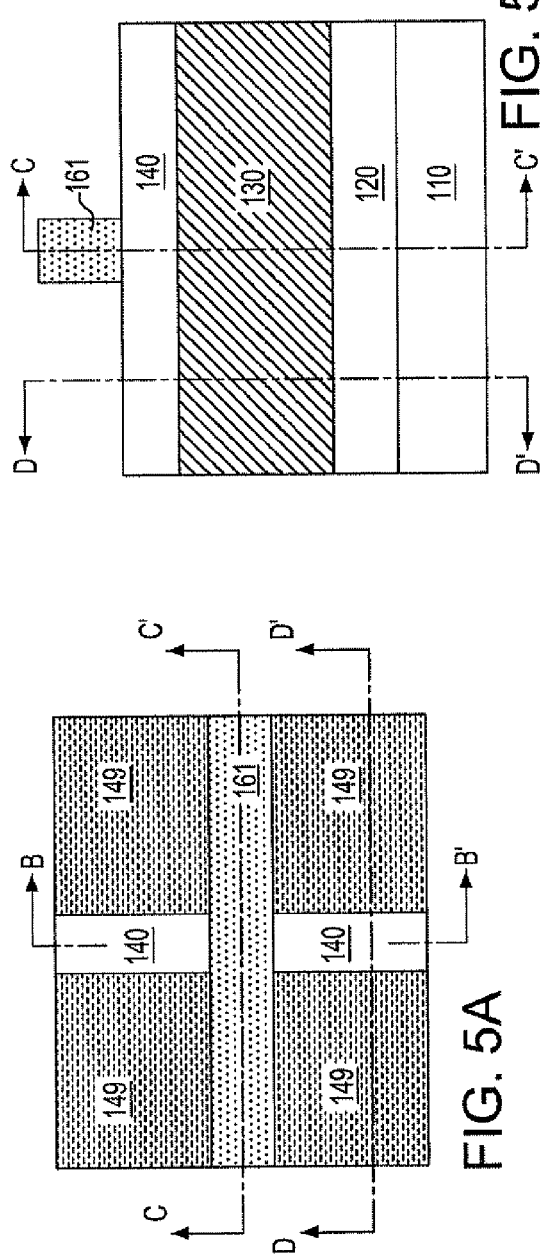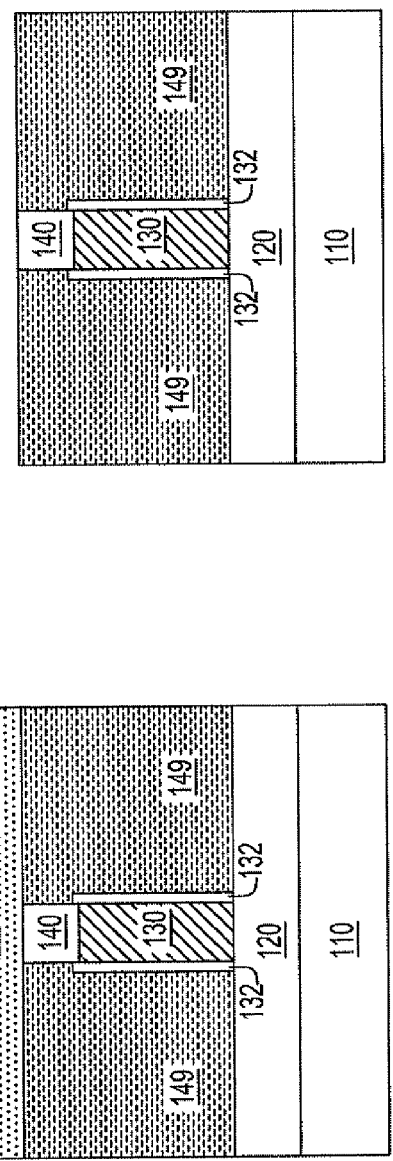

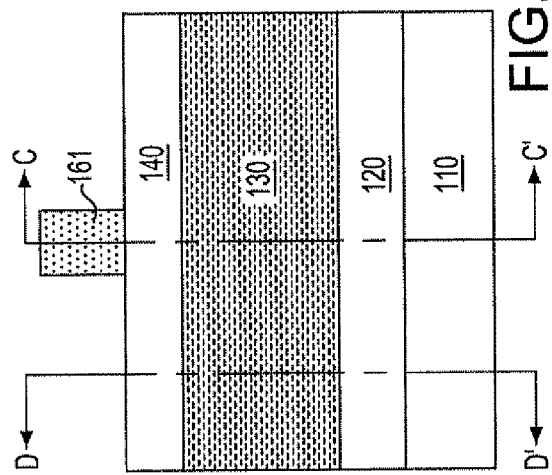
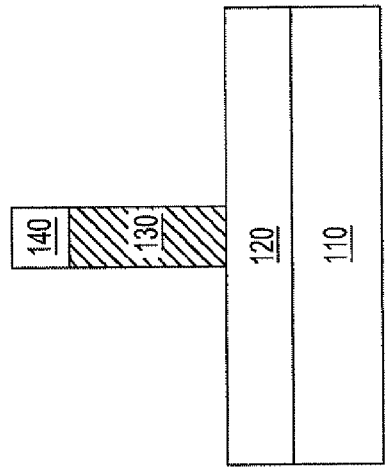
FIG. 6B
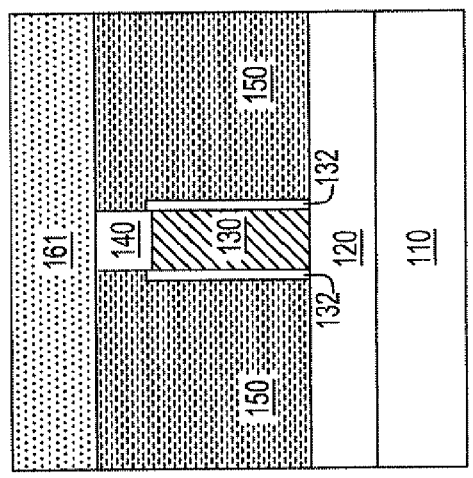
FIG. 6D
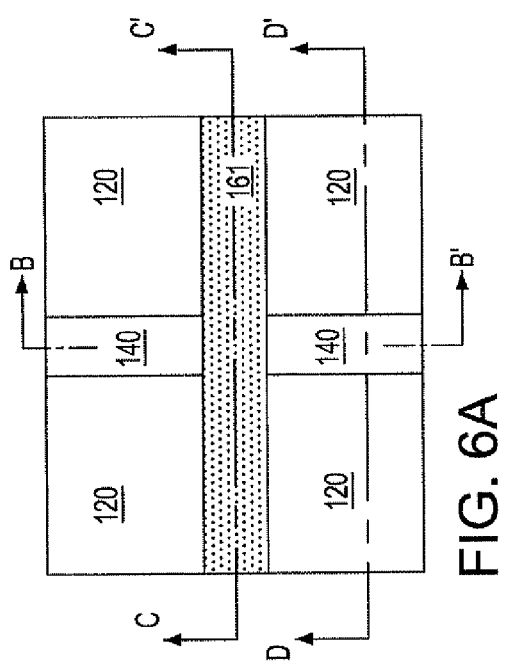
FIG. 6A
FIG. 6C

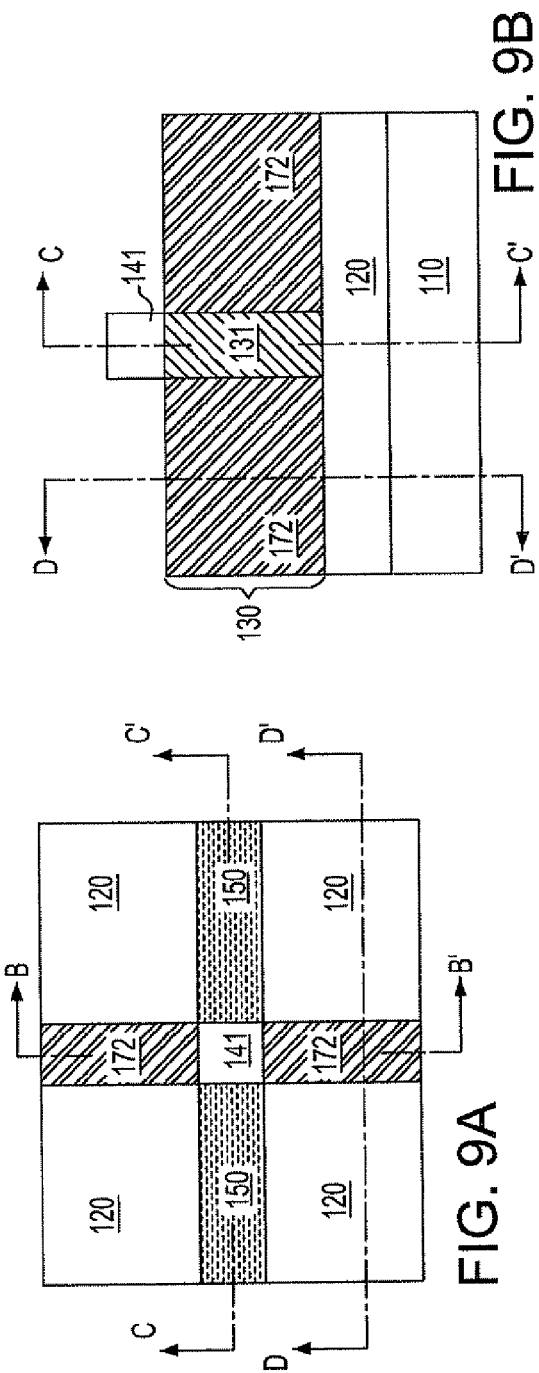
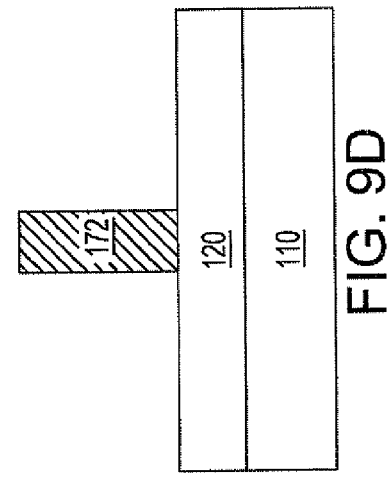
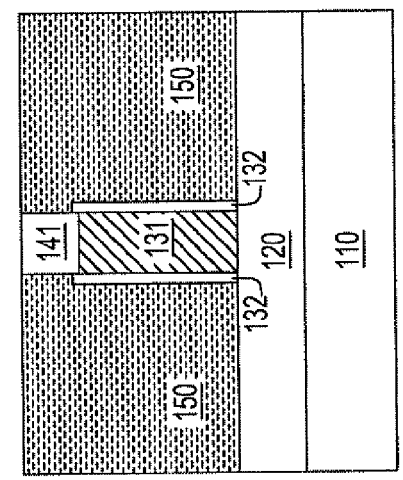

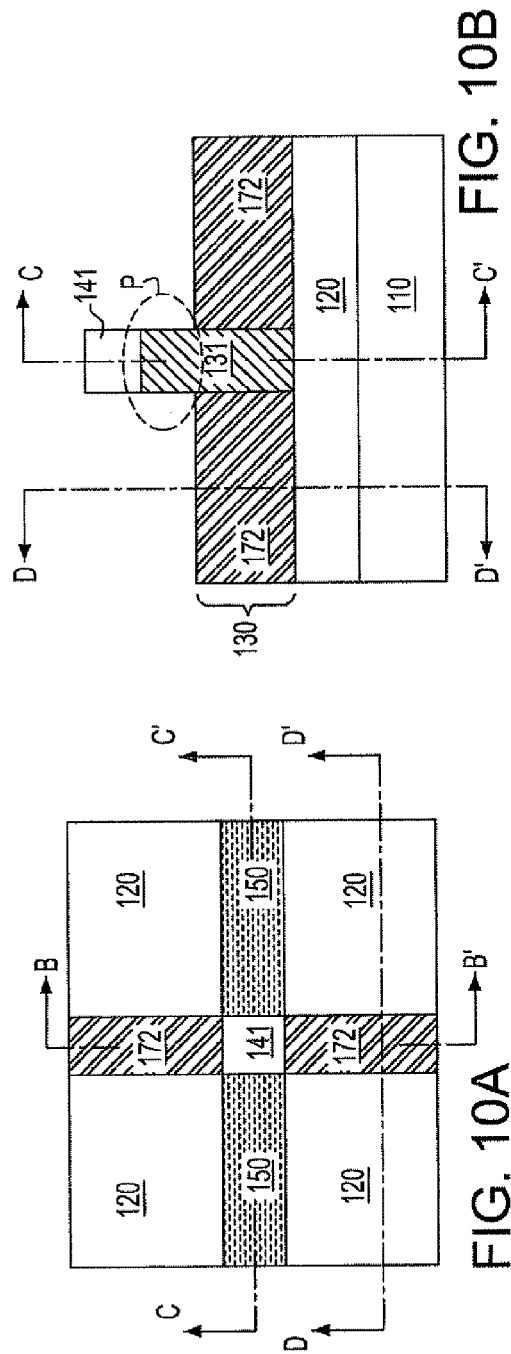
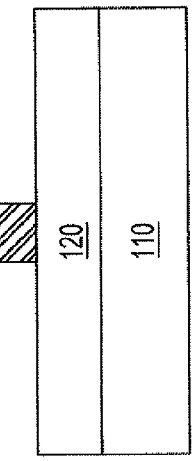
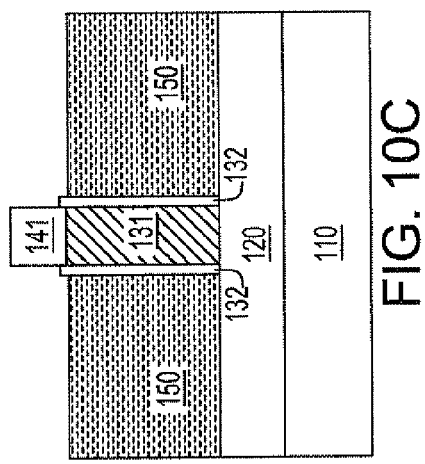
FIG. 10A
FIG. 10B
FIG. 10C
FIG. 10D

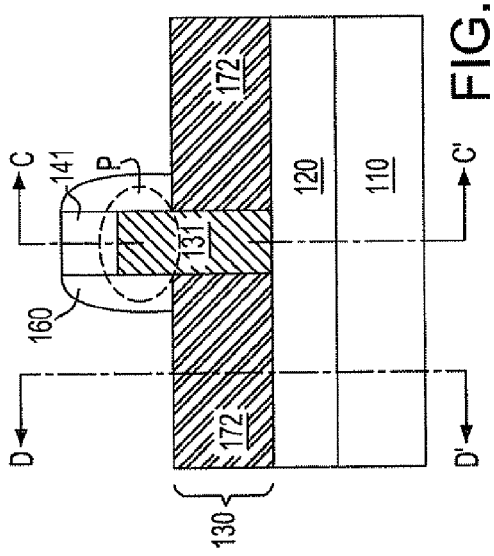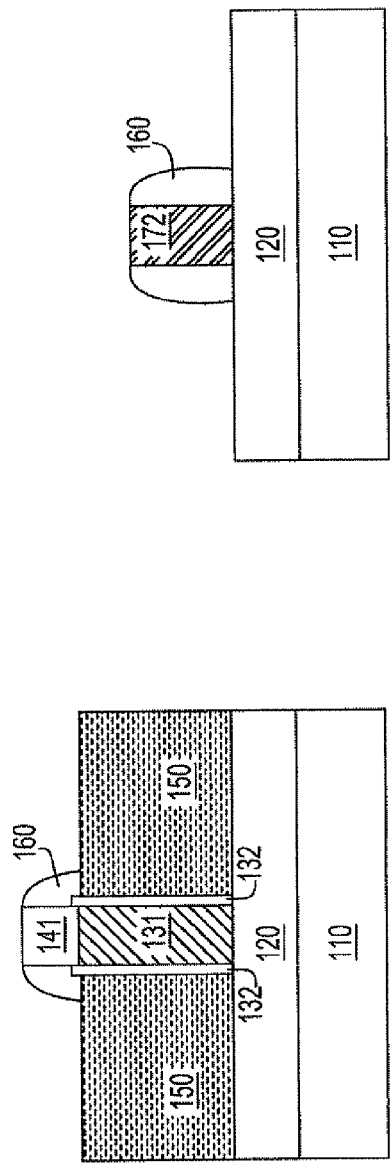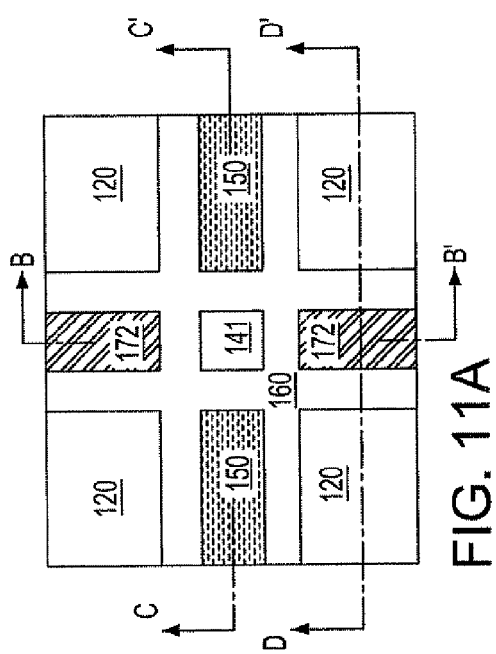

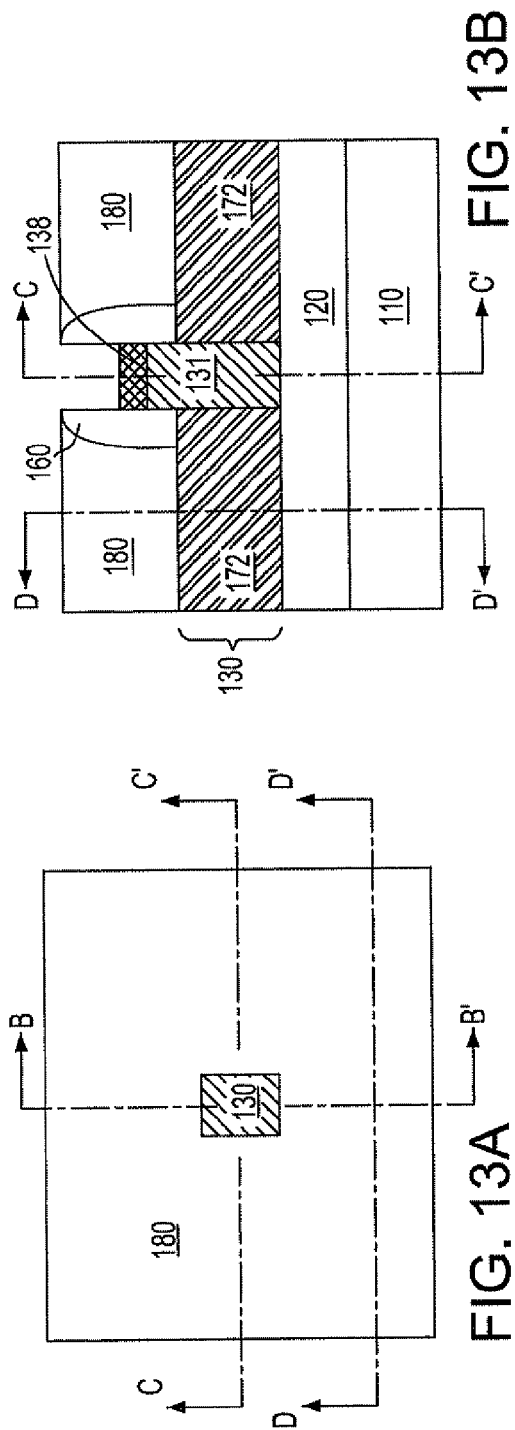
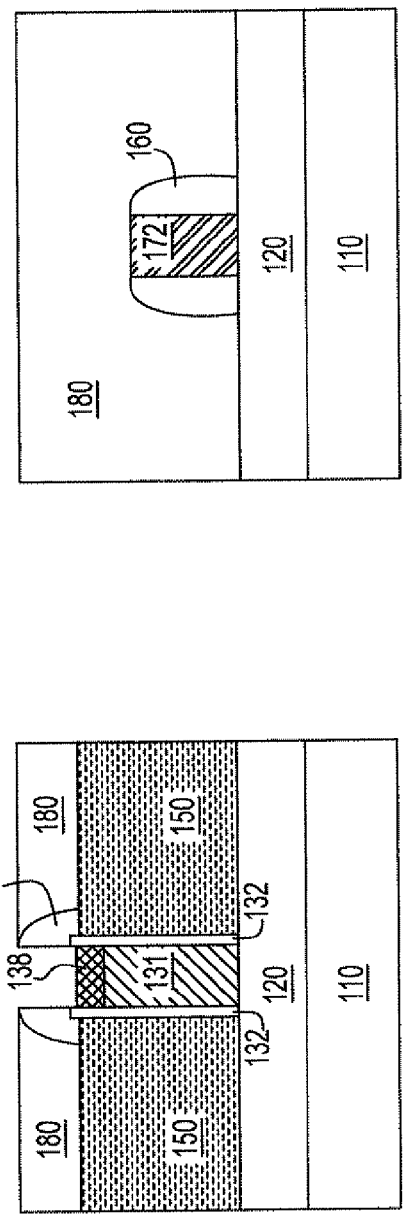
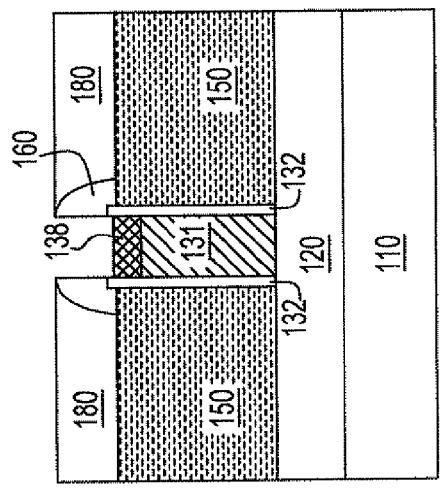
FIG. 13A
FIG. 13B
FIG. 13C
FIG. 13D

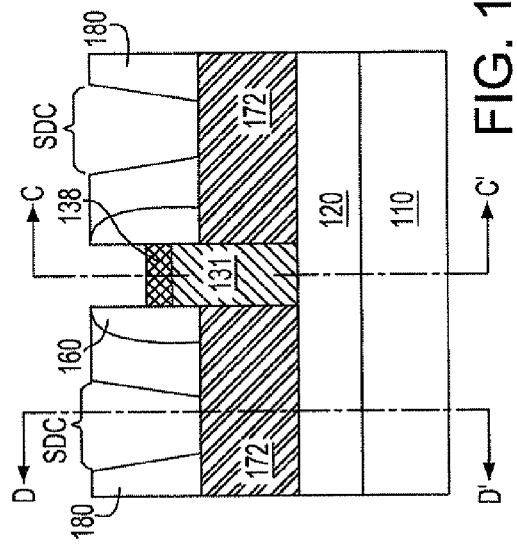
FIG. 14B
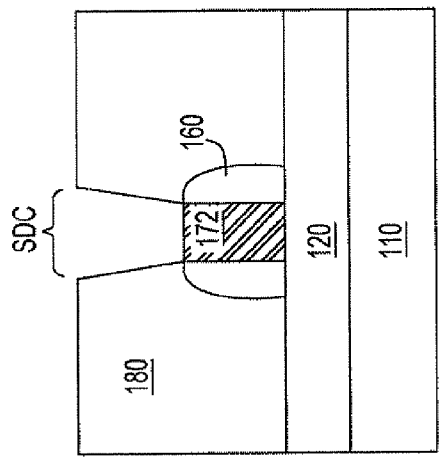
FIG. 14D
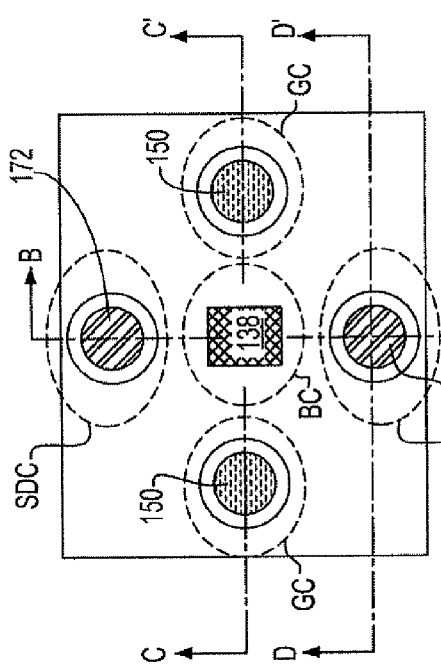
FIG. 14A
FIG. 14C

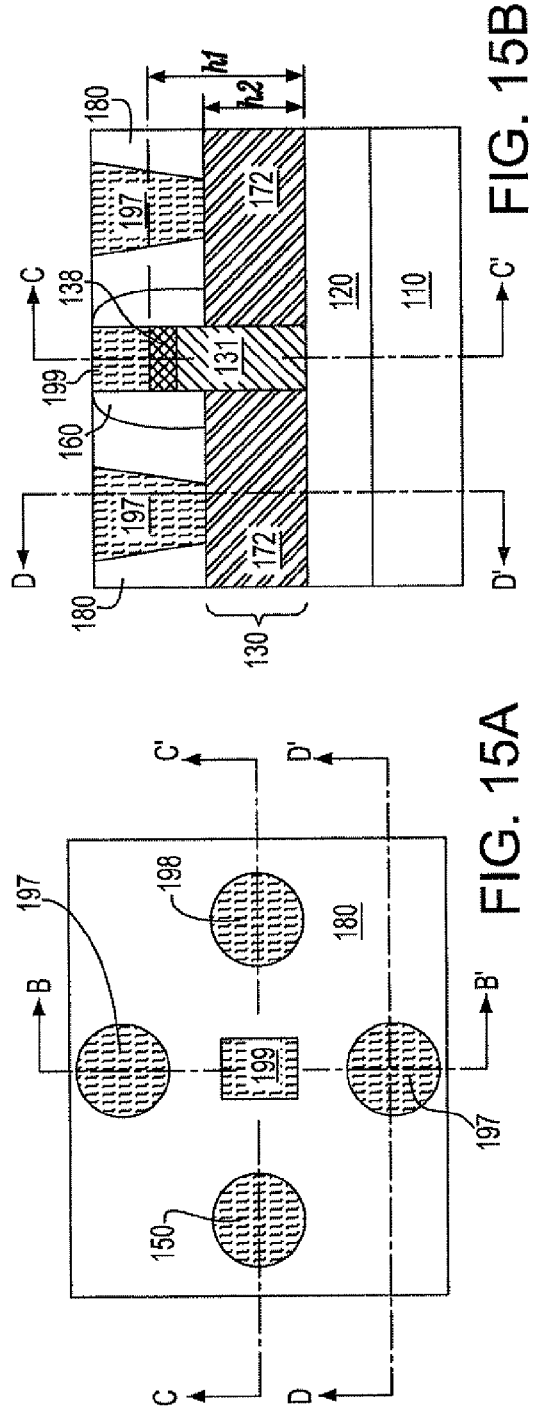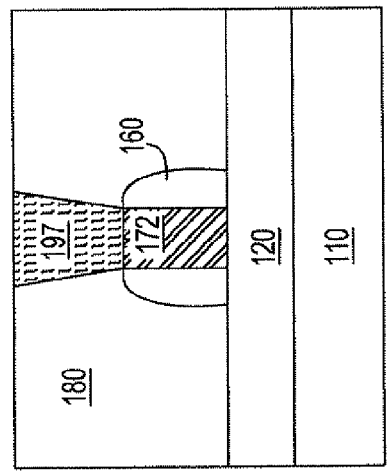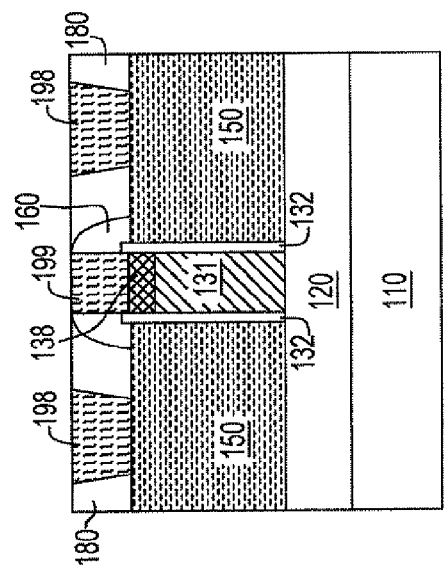

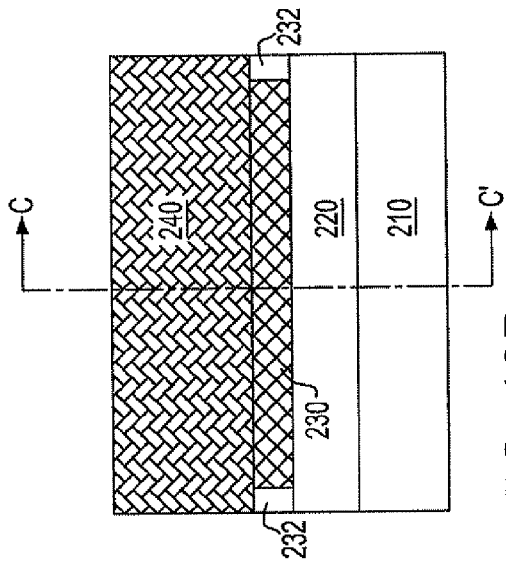
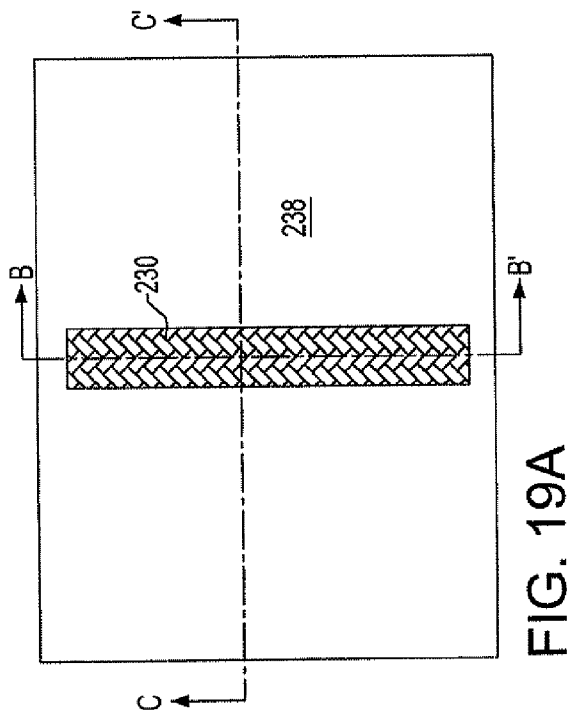
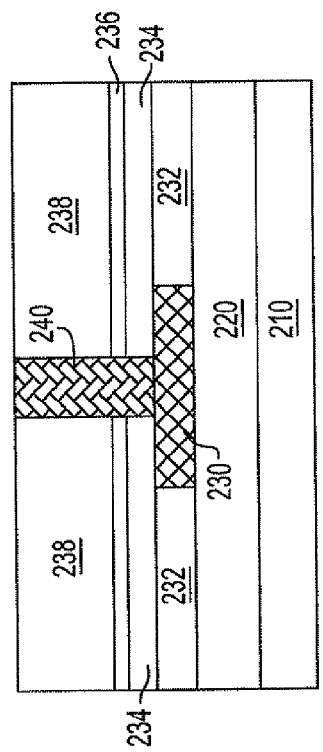
FIG. 19B
FIG. 19A
FIG. 19C

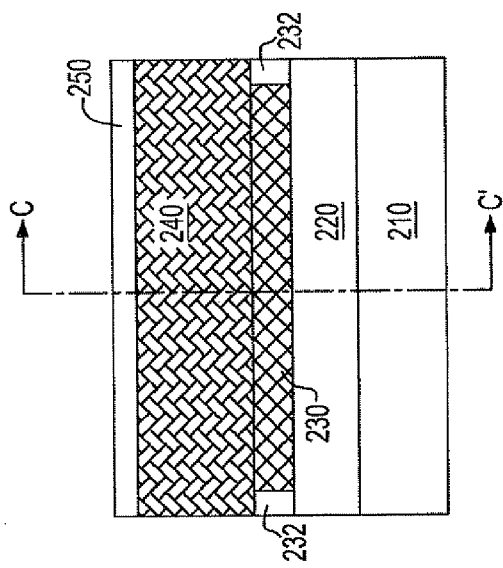
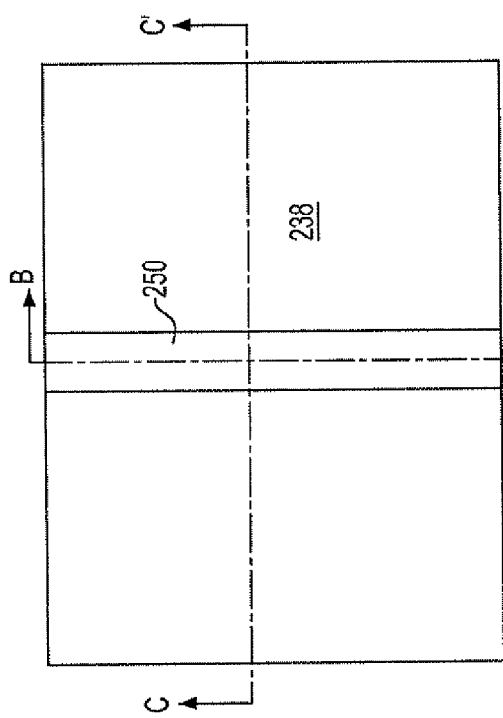
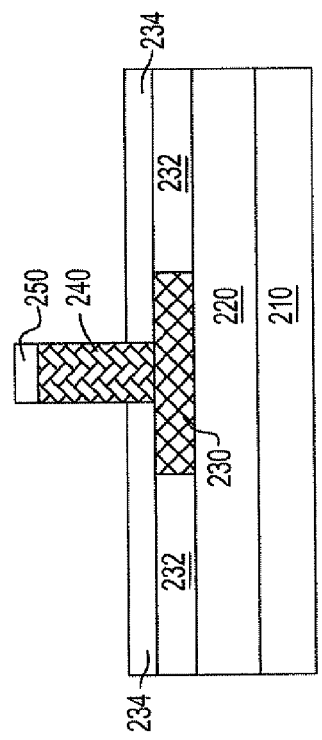
FIG. 21A
FIG. 21B
FIG. 21C

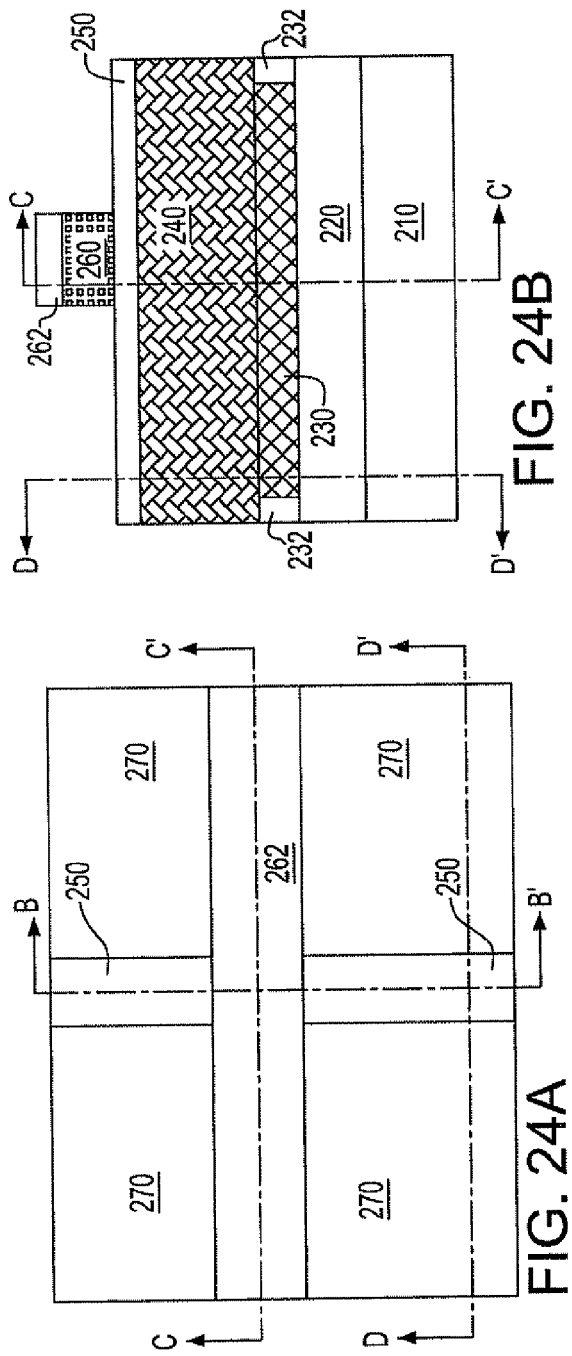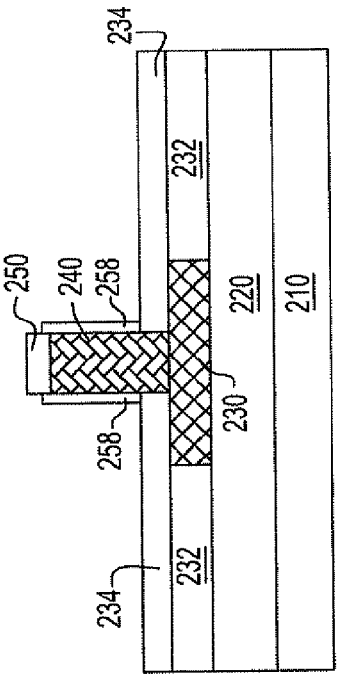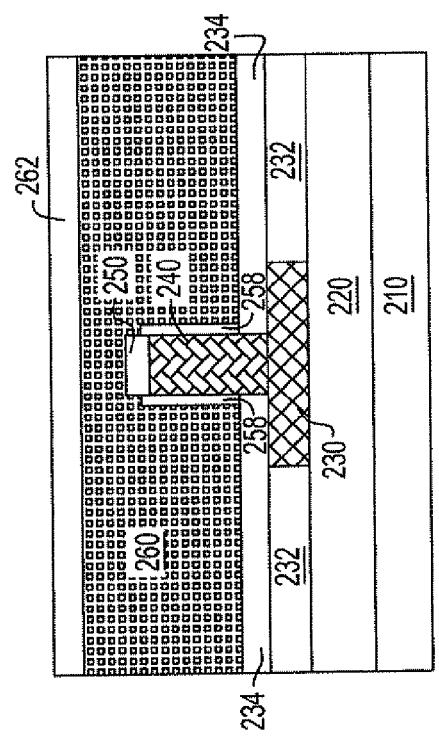

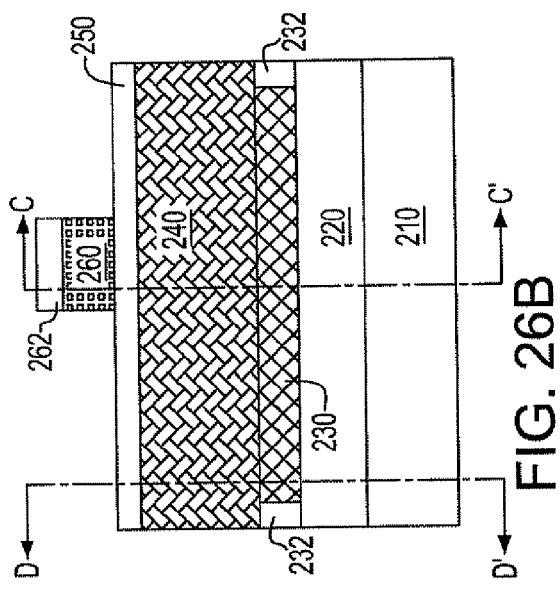
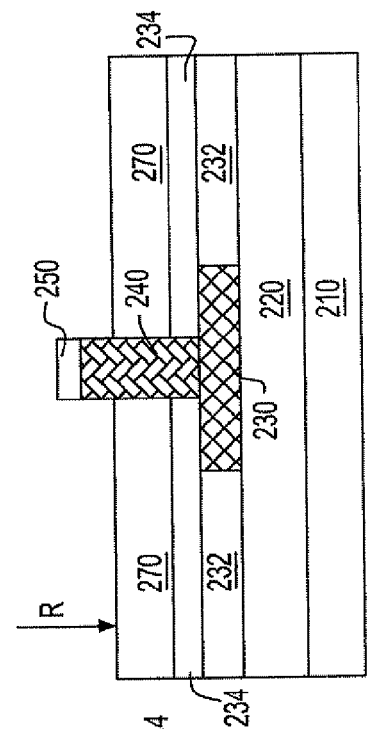
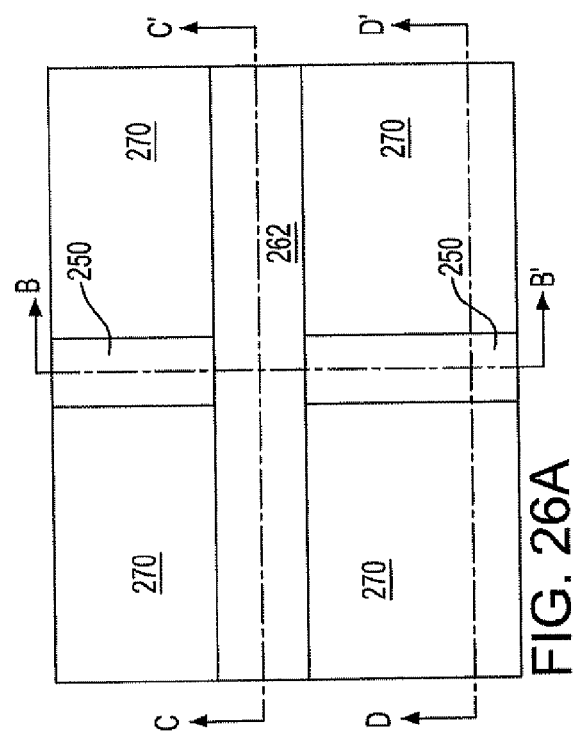
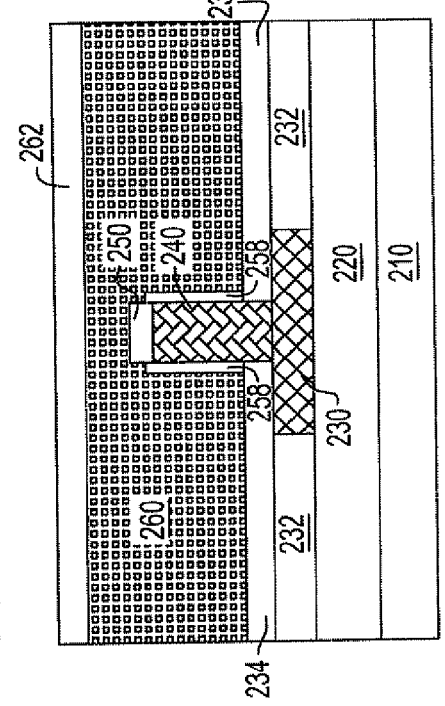
FIG. 26A
FIG. 26B
FIG. 26C
FIG. 26D

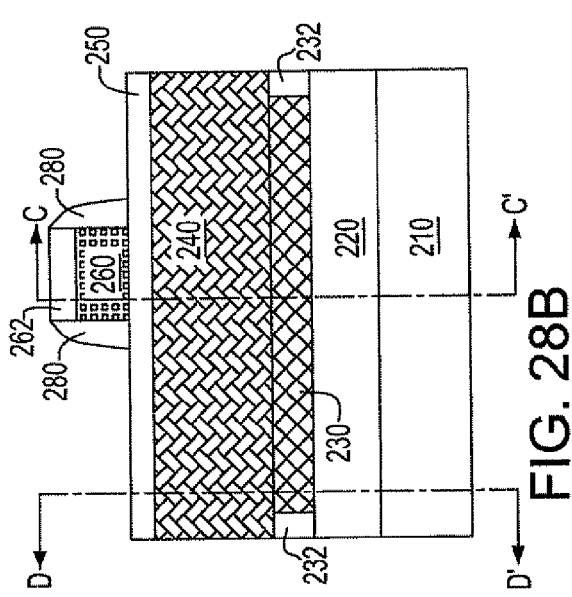
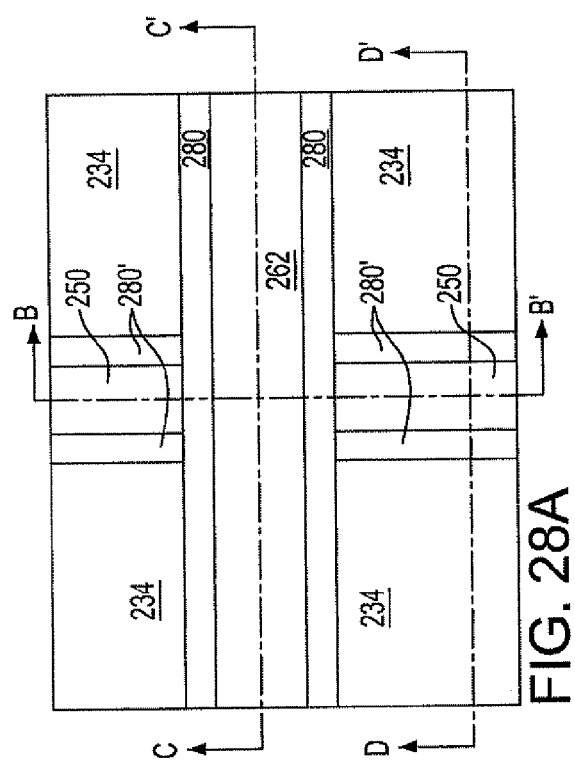
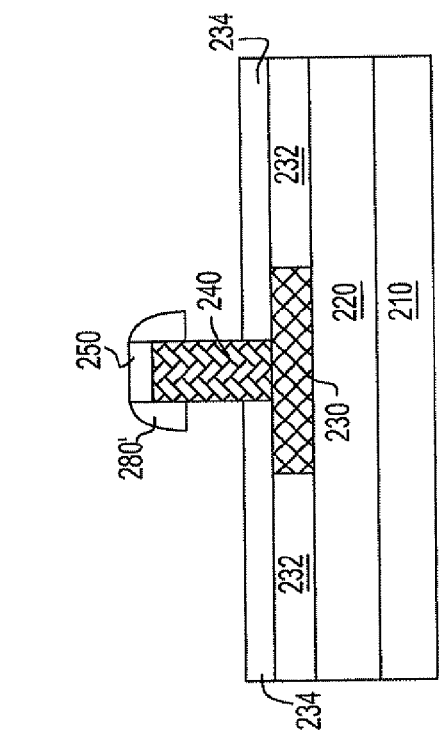
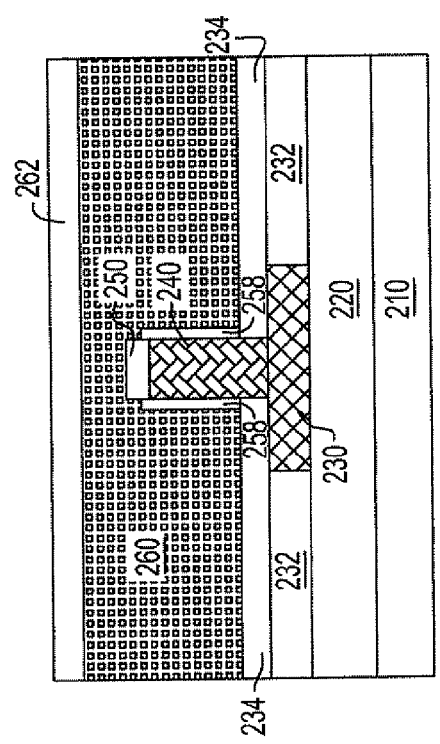
FIG. 28A
FIG. 28B
FIG. 28C
FIG. 28D

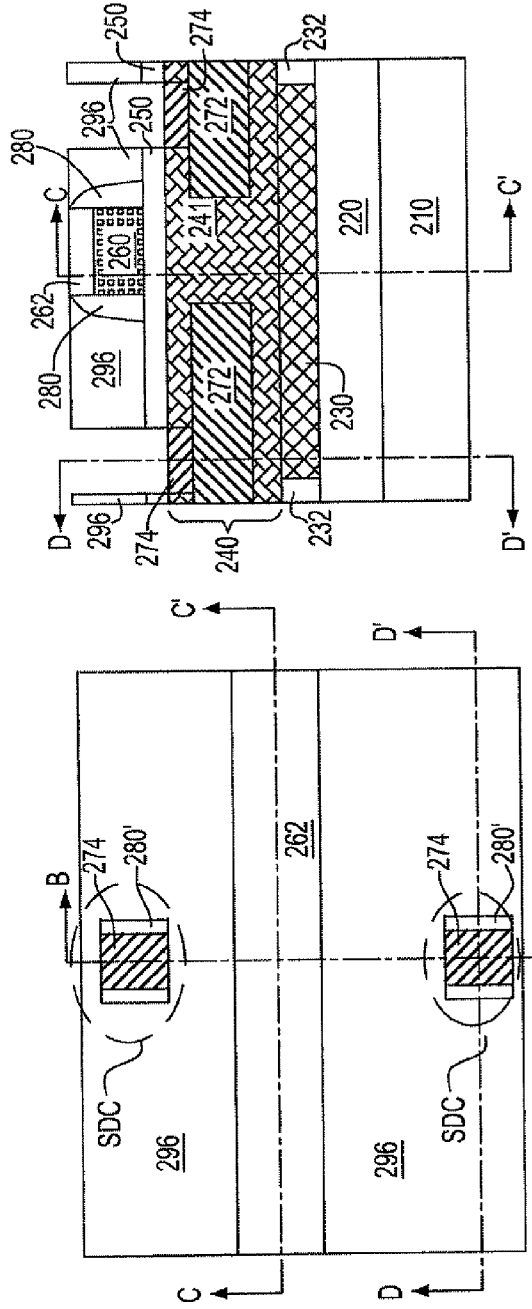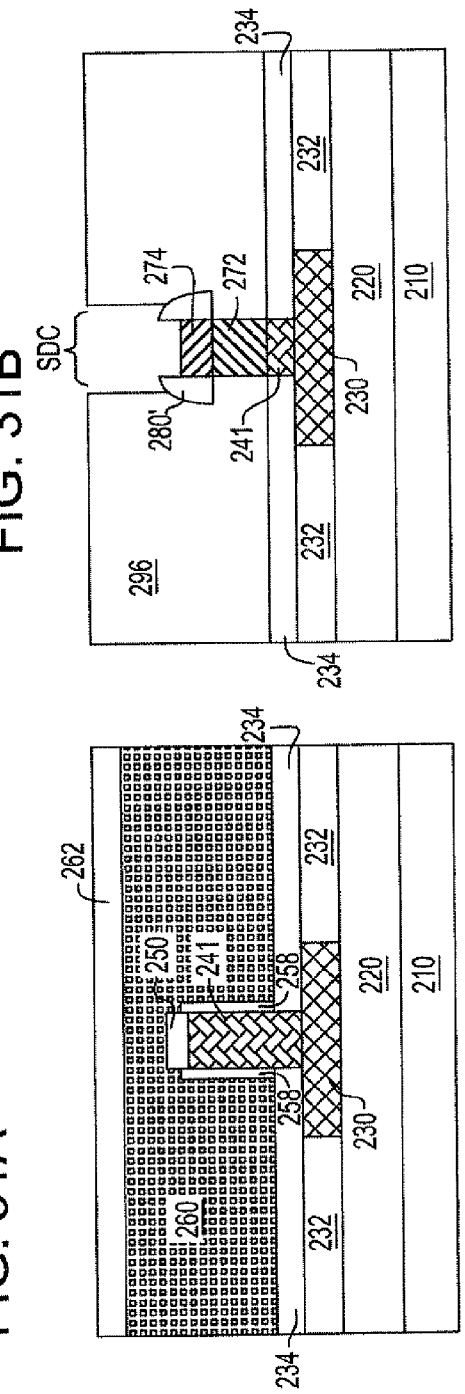
FIG. 31A
FIG. 31B
FIG. 31C
FIG. 31D

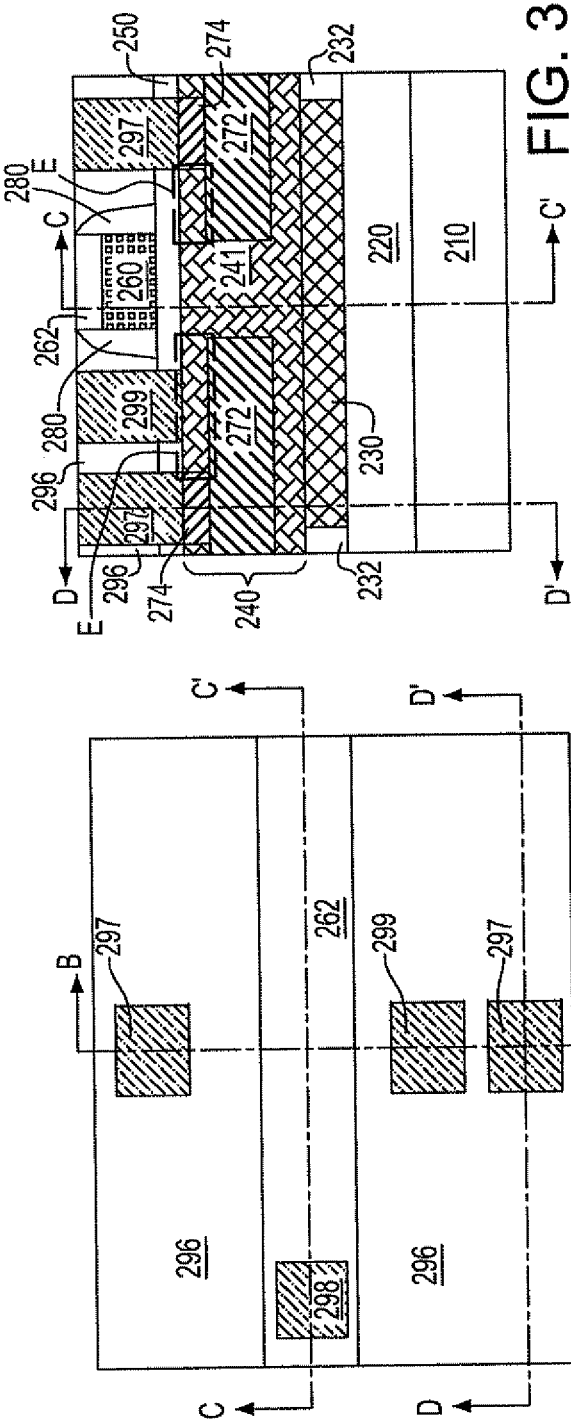
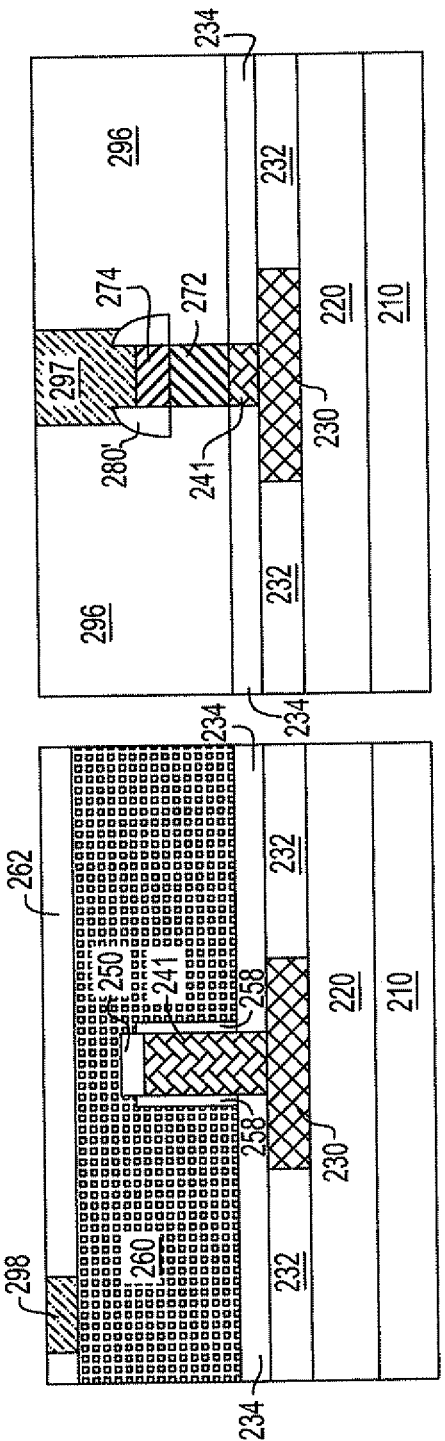
FIG. 33A
FIG. 33B
FIG. 33C
FIG. 33D

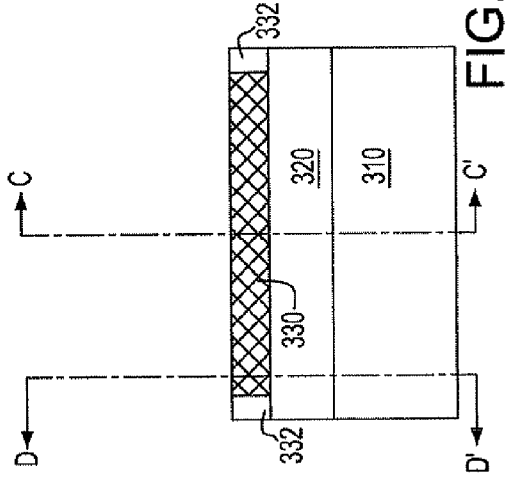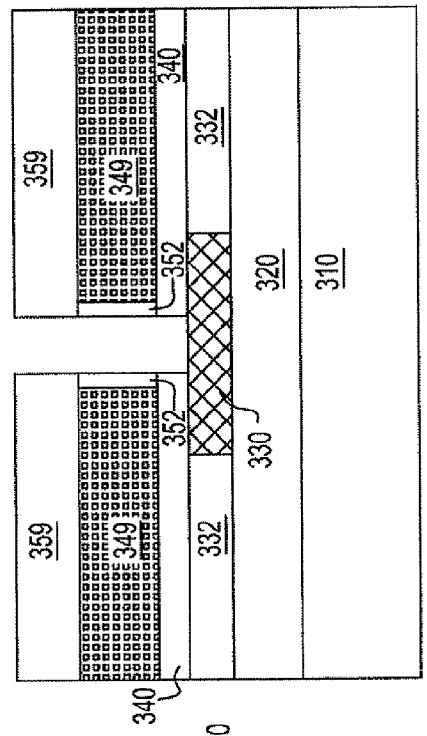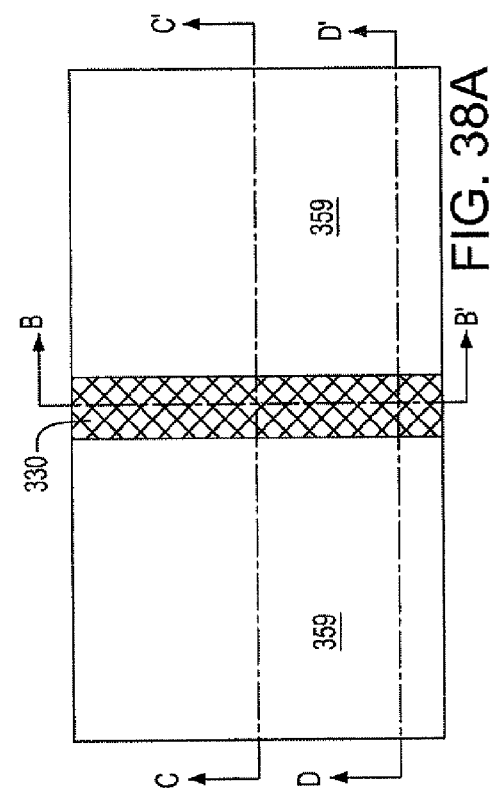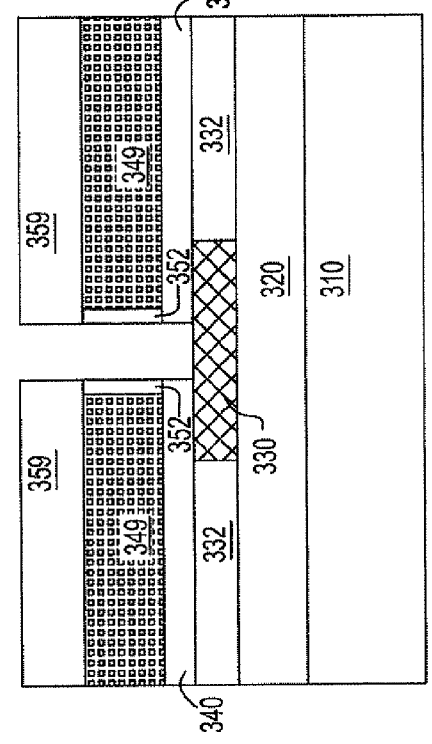

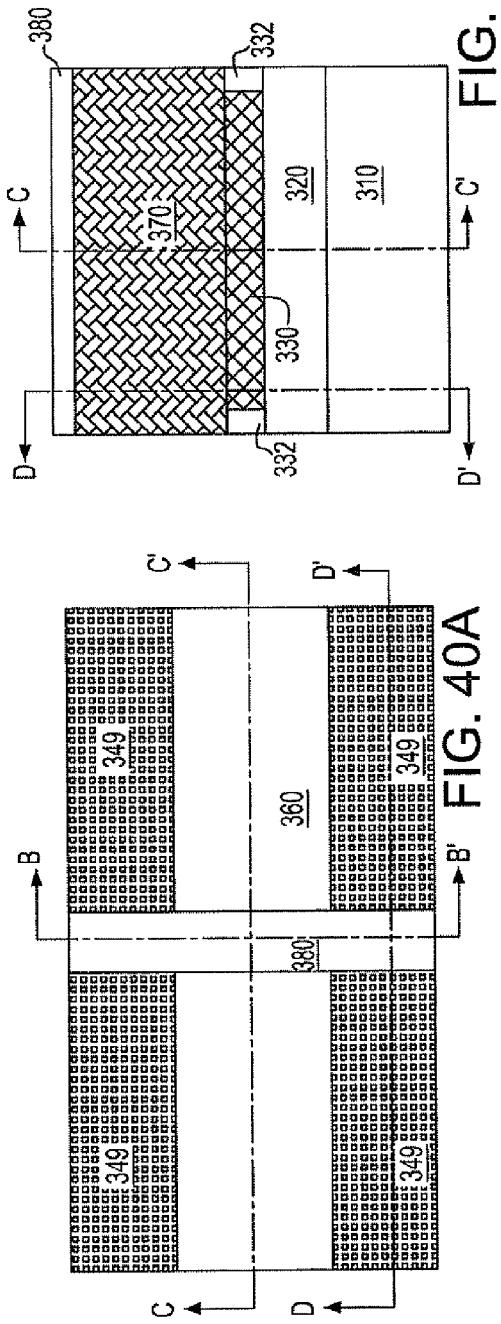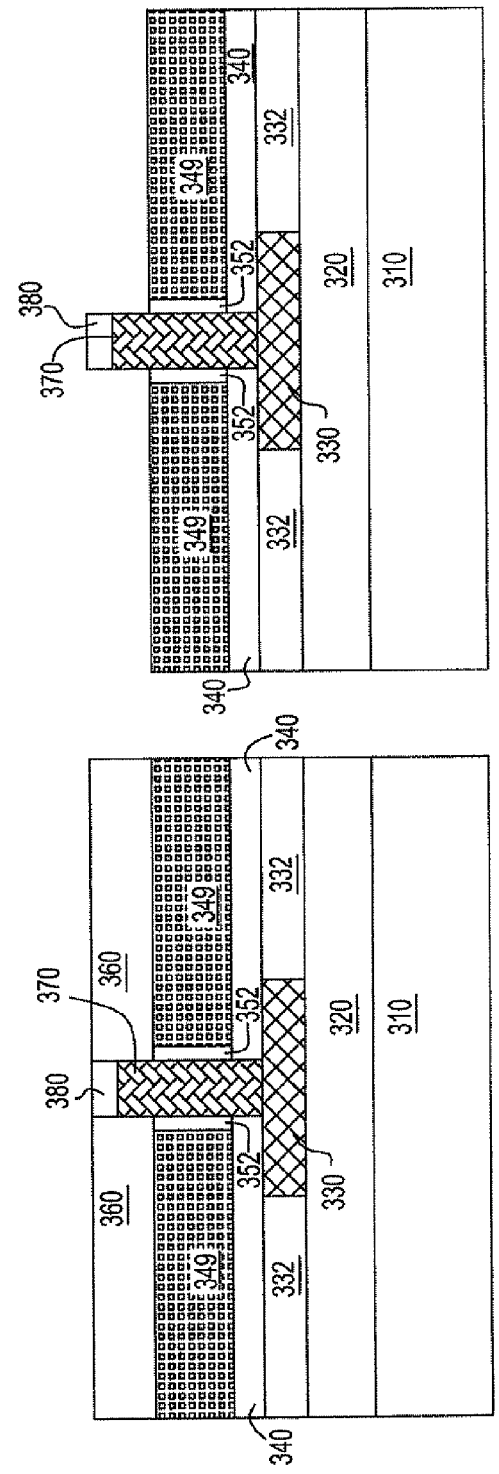

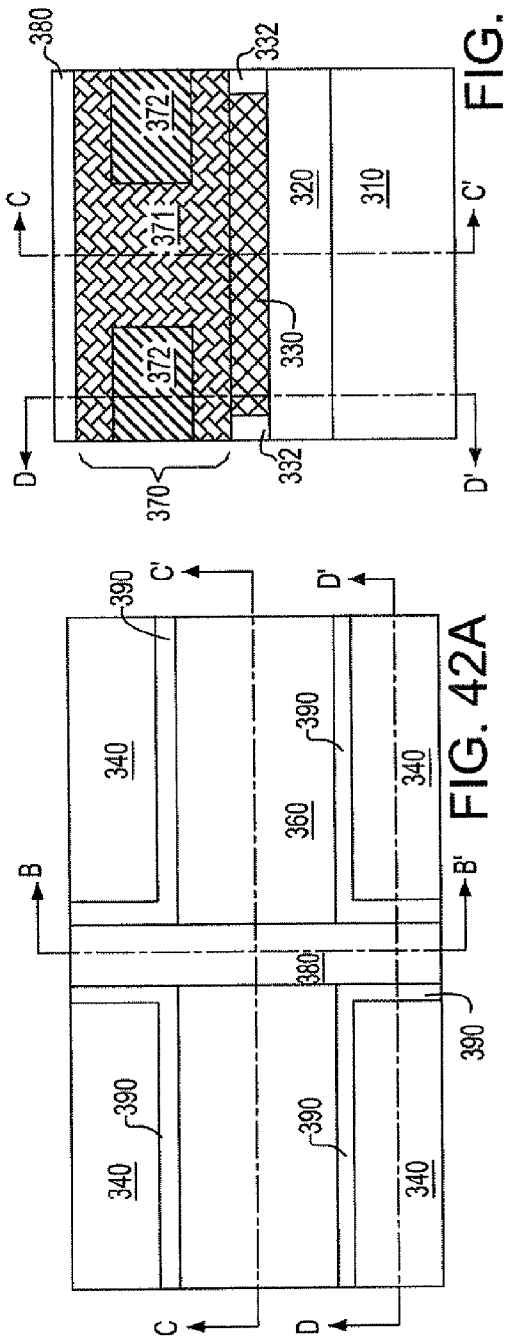
FIG. 42A
FIG. 42B
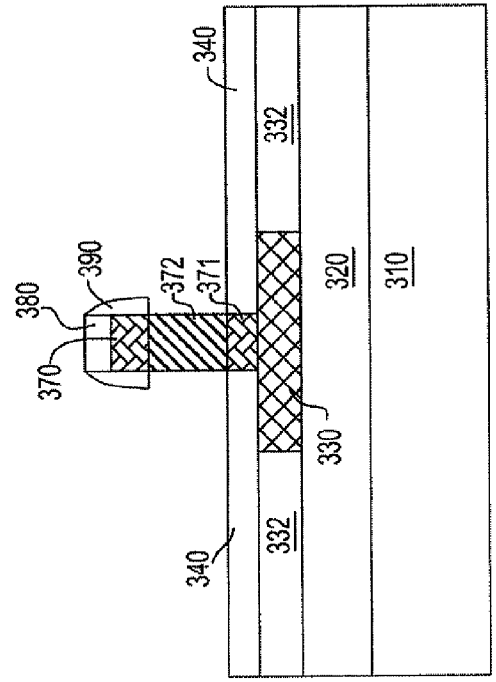
FIG. 42D
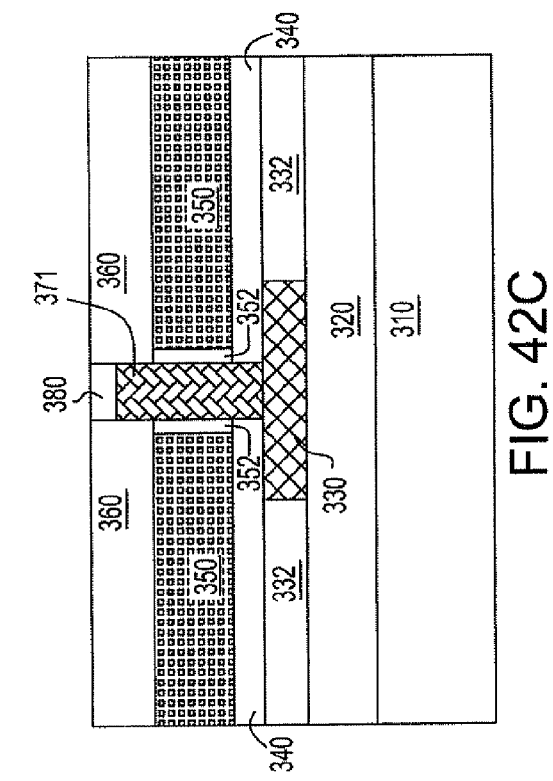
FIG. 42C

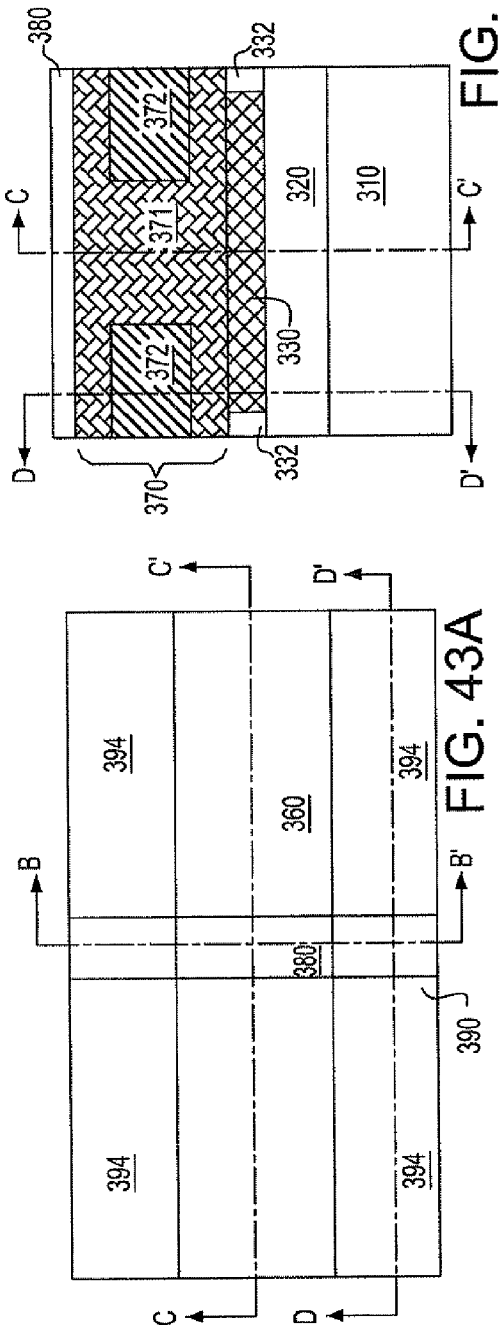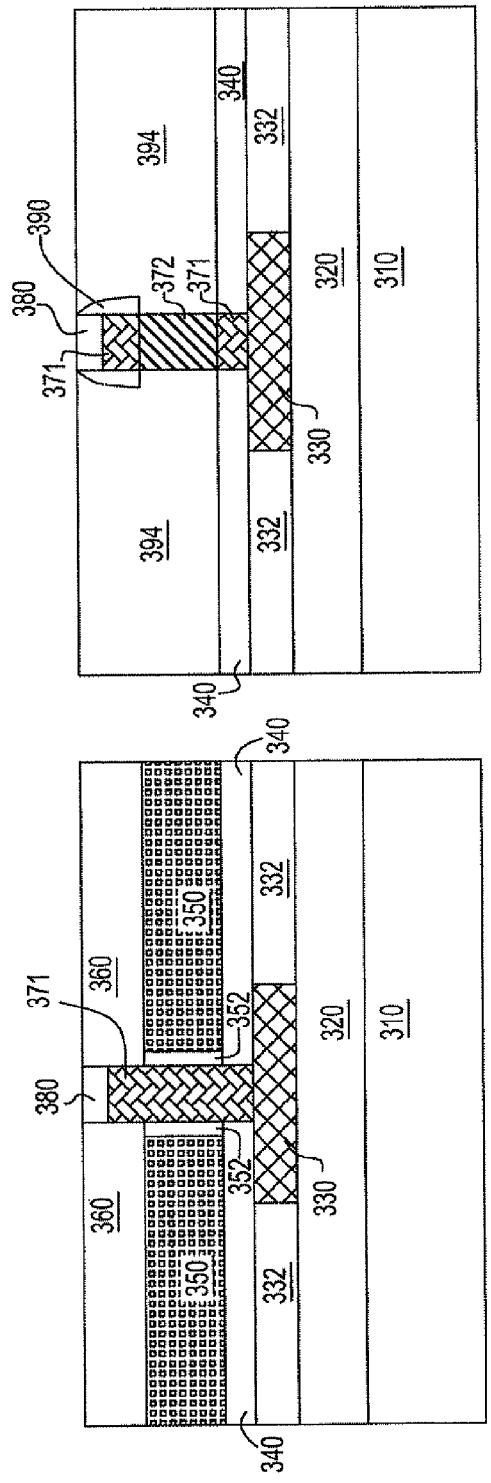

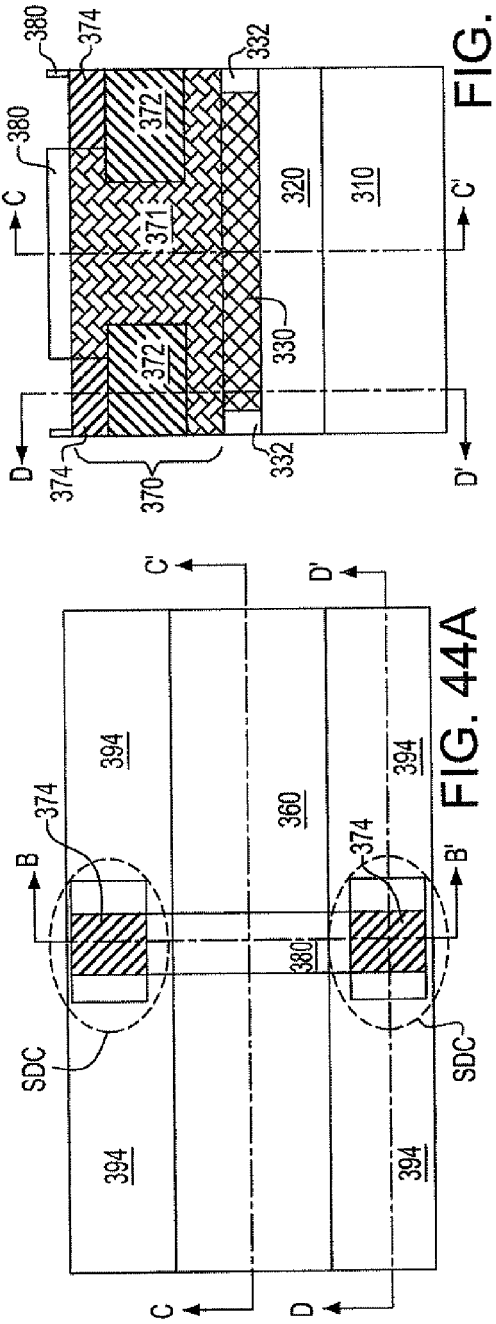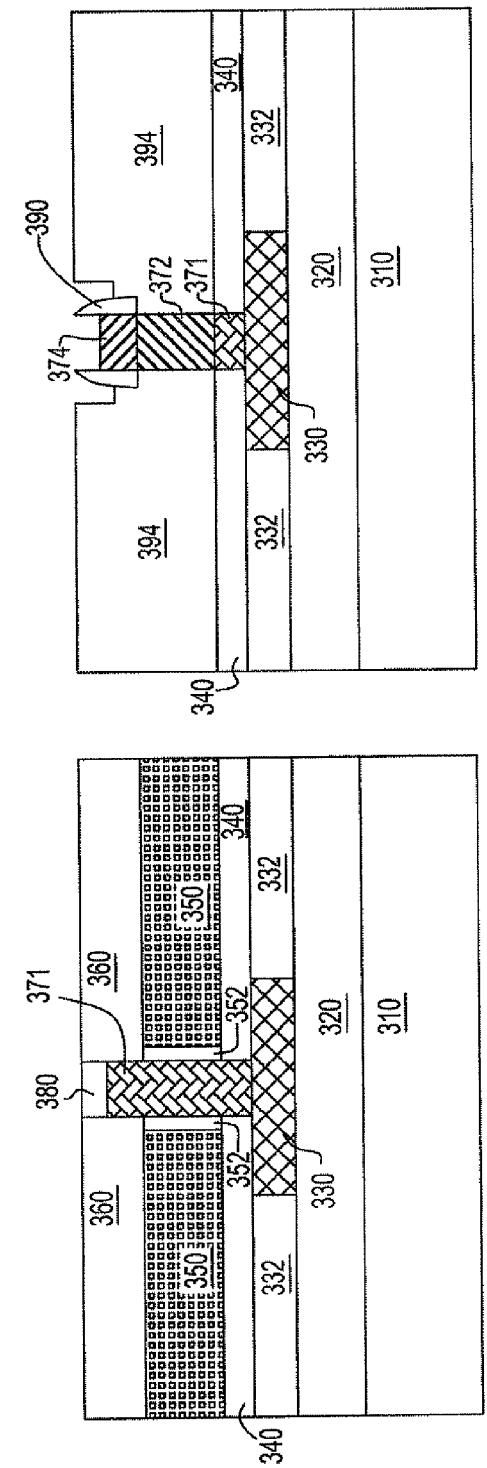

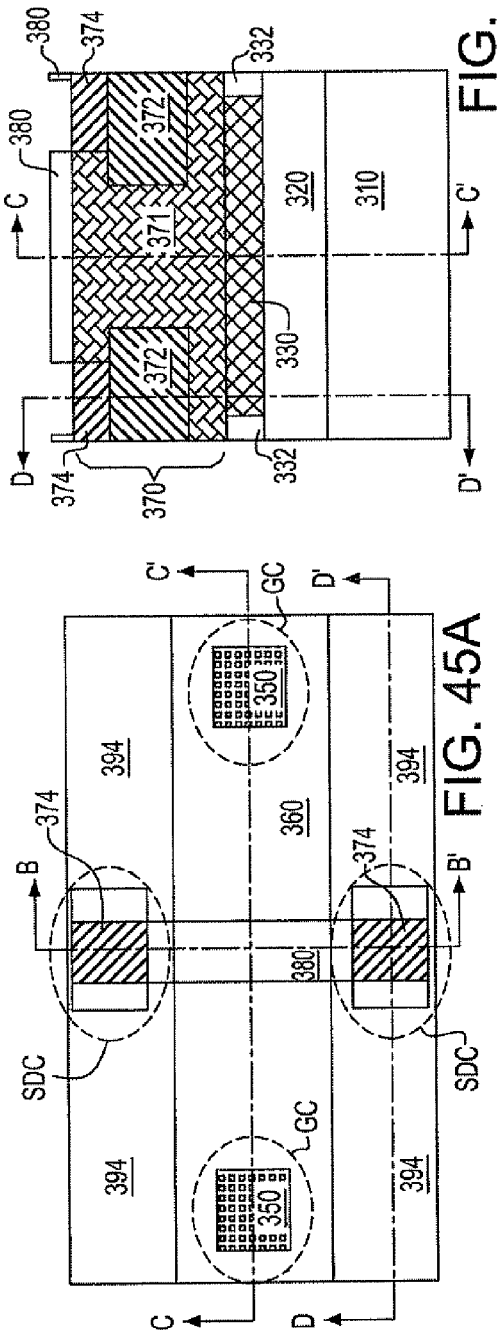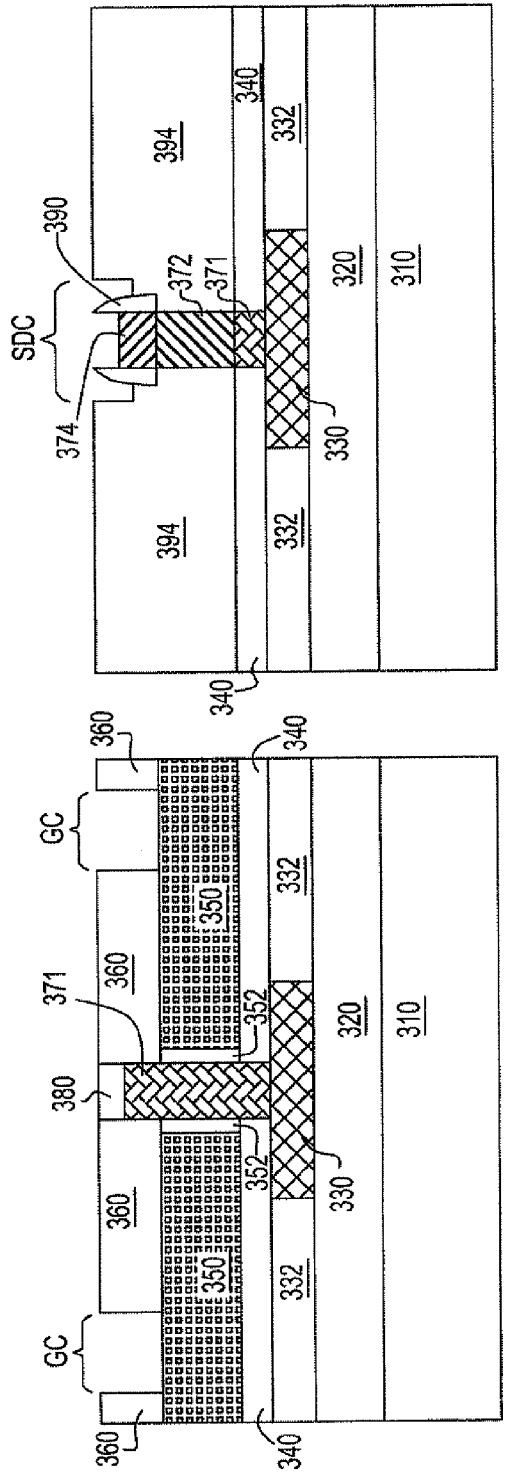

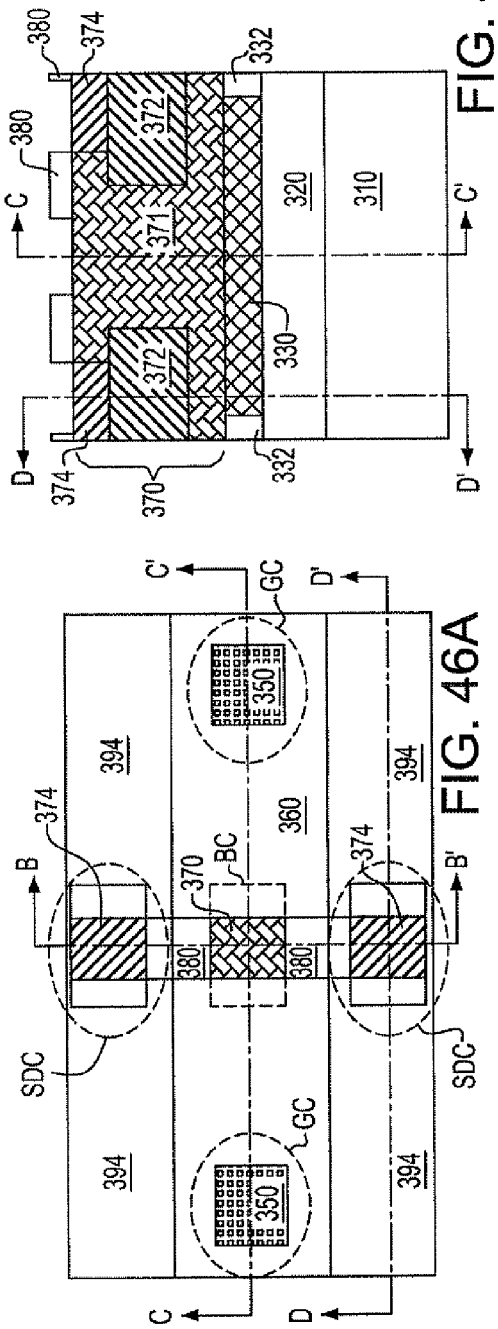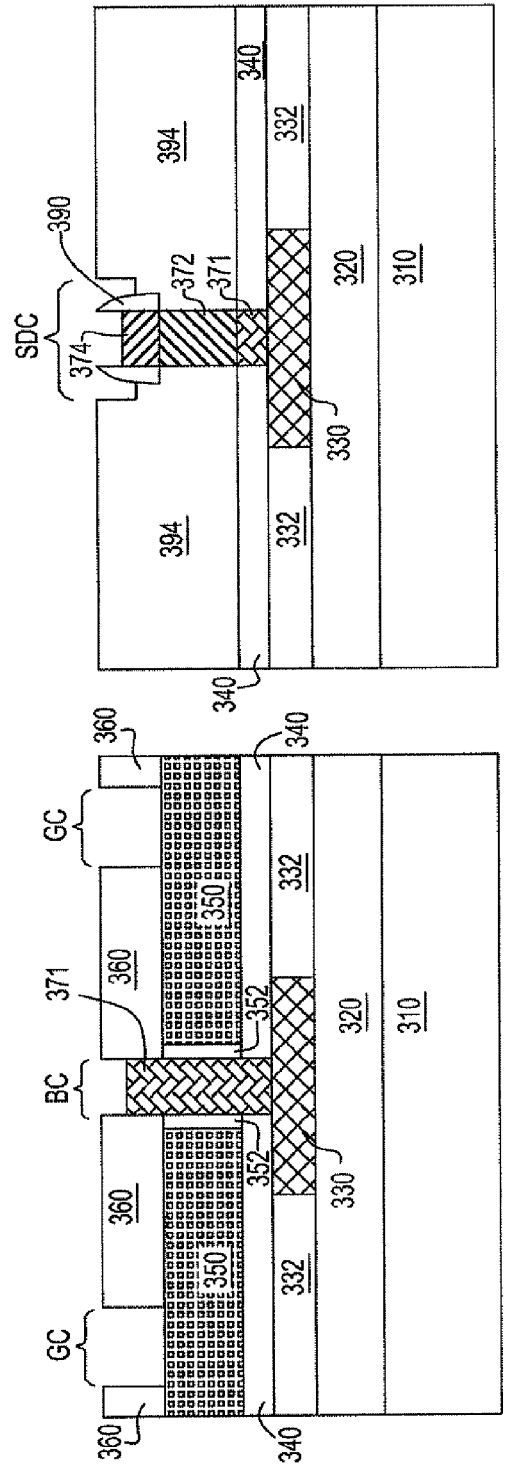
FIG. 46A
FIG. 46B
FIG. 46C
FIG. 46D

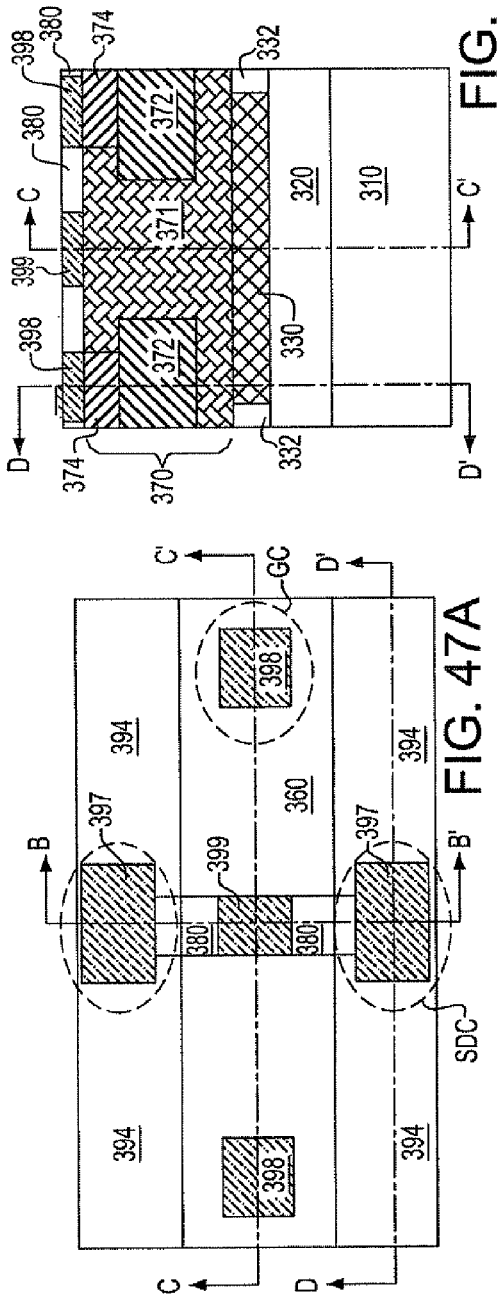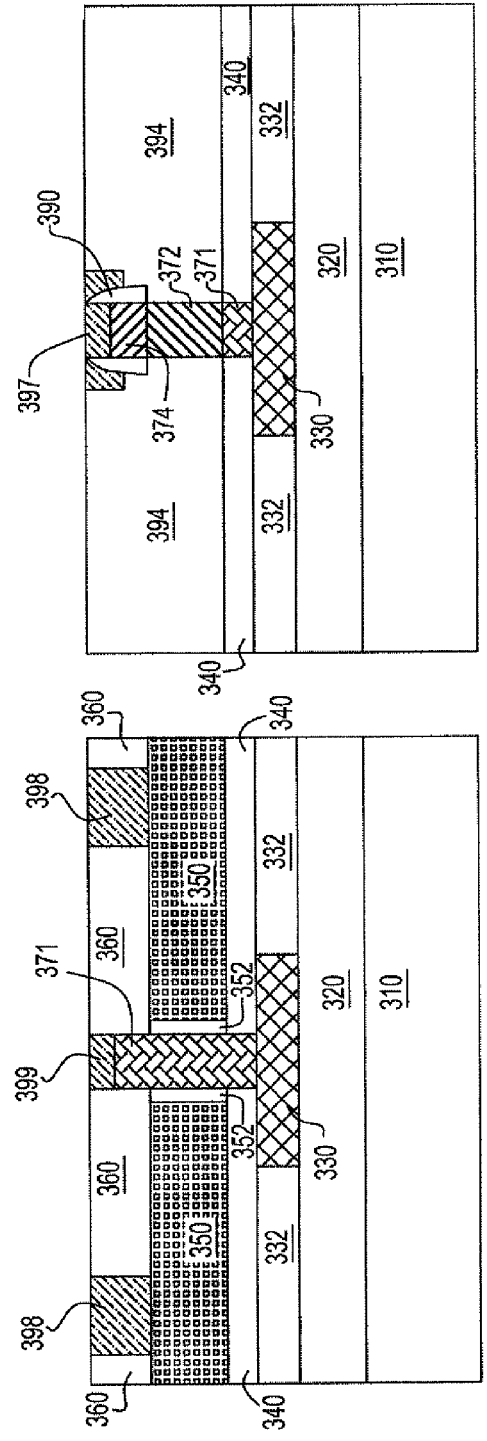
FIG. 47A
FIG. 47B
FIG. 47C
FIG. 47D

FINFET WITH TOP BODY CONTACT

FIELD OF THE INVENTION

The present invention relates to semiconductor devices, and particularly to finFET structures with a body contact and methods of manufacturing the same.

BACKGROUND OF THE INVENTION

Fin metal-oxide-semiconductor field effect transistor (Fin-MOSFET) is an emerging technology which provides solutions to metal-oxide-semiconductor field effect transistor (MOSFET) scaling problems at, and below, the 45 nm node. FinMOSFET structures include fin field effect transistors (finFETs), which comprise at least one narrow (preferably <10 nm wide) semiconductor fin gated on at least two opposing sides of each of the at least one semiconductor fin. Preferred prior art finFET structures are formed on a semiconductor-on-insulator (SOI) substrate, because of low source/drain diffusion to substrate capacitance and ease of electrical isolation by shallow trench isolation structures.

However, finFETs fabricated on a SOI substrate suffer from floating body effects, as is well known for conventional planar MOSFETs. The body of a finFET on an SOI substrate stores charge which is a function of the history of the device, hence becoming a "floating" body. As such, floating body finFETs experience threshold voltages which are difficult to anticipate and control, and which vary in time. The body charge storage effects result in dynamic sub-threshold voltage (sub-Vt) leakage and threshold voltage (Vt) mismatch among geometrically identical adjacent devices. Floating body effects in finFETs are particularly a concern in SRAM cells, where Vt matching is extremely important as operating voltages continue to be scaled down. The floating body also poses leakage problems for pass gate devices. Still another concern with floating body finFETs is with stacked devices, as used in logic gates, in which the conductive state of devices higher up in the stack are strongly influenced by stored body charge, because of reduced gate-to-source voltage (Vgs) overdrive available to these devices. In view of the above stated problems with finFETs fabricated on SOI substrates, it is desirable to eliminate floating body effects by building finFETs incorporating body contacts.

The challenge in forming a body-contacted finFET is to do so without degrading its positive attributes, such as high immunity to short channel effects, steep sub-Vt slope, and high current drive capability due to volume inversion. Although several prior art contacted body finFETs have been identified, all fail to preserve the desirable attributes of the device.

For example, U.S. Patent Application Publication No. 2006/0091463 provides an elongated widened portion of a semiconductor fin between source-drain regions formed in adjacent narrow fin regions. The widened portion of the fin is contacted from above. The presence of the widened portion of the fin in the channel current path seriously degrades the desirable attributes of the finFET. In addition to loss of short channel Vt control, the widened fin portion has a different threshold voltage and channel conductance, which would degrade the channel current. The channel length needs to be much greater than a lithographically printable minimum dimension to avoid body contact to diffusion shorts.

U.S. Pat. No. 6,913,960 discloses another body contacted finFET in which a contact to the body of the finFET is formed on a first side of the fin and the second side of the fin is gated through a thin dielectric by a gate conductor. The gate conductor contacts the body on the first side of the fin, providing a dynamic Vt device. For this structure to work properly, shorting between the body contact and the source-drain diffusions must be avoided. Therefore, the source-drain diffusions must be confined to close to the second sidewall surface of the fin. Due to the extremely narrow width of the fin, shorting between body contact and source-drain diffusions is virtually assured to occur. If the width of the fin is increased to prevent the source-drain diffusions from approaching the second (body contact) side of the fin, many of the desirable attributes of the finFET would be seriously degraded.

In view of the above, there is a need to provide a finFET formed on an insulating substrate, whereby a body contact is provided in such a way that does not degrade the desirable attributes of the finFET.

SUMMARY OF THE INVENTION

The present invention addresses the needs described above by providing structures and fabrication methods for finFET devices formed on a semiconductor-on-insulator (SOI) substrate, wherein the finFET devices are provided with a body contact that preserves the desirable attributes of the finFET.

Three embodiments of the present invention are disclosed herein. All finFET structures employ a semiconductor fin of a constant width formed on an SOI substrate. According to a first embodiment of the present invention, a body contact is provided to a top surface of the body of the finFET, and is self-aligned with respect to the semiconductor fin and the source and drain regions. The source and drain regions and the gate conductor of the finFET are recessed with respect to a top surface of a body portion, forming a body contact pedestal, which is an extension of the body to which a body contact may be made. A dielectric spacer is formed around the body contact pedestal over the recessed source and drain regions and the gate conductor, thus avoiding electrical shorts between the body contact and the source and drain regions and the gate electrode.

According to a first embodiment of the present invention, a first exemplary semiconductor structure comprises:
  a. a semiconductor fin located on a buried insulator layer of a semiconductor-on-insulator (SOI) substrate and having a width that is substantially the same throughout the semiconductor fin and having a body portion with a first height and source and drain regions with a second height, wherein the body portion abuts the source and drain regions, the first height is greater than the second height, and the extent of the body portion above the second height constitutes a body contact pedestal; and
  b. a body contact via abutting a top surface of the body contact pedestal.

The first semiconductor structure may further comprise source and drain contact vias abutting a top surface of the source and drain regions.

The first semiconductor structure may further comprise:
  a. a gate dielectric located on two sidewalls of the body portion of the semiconductor fin;
  b. two disjoined portions of a gate conductor directly contacting the gate dielectric; and
  c. two gate contact vias, each of which contacting one of the two disjoined portions of the gate conductor.

According to a second embodiment of the present invention, a body contact is provided to a top surface of a semiconductor fin. Unlike the first embodiment, the entire top surface of the fin is planar. The source and drain regions are formed recessed from the top surface of the semiconductor fin such that the portion of the semiconductor fin between the upper extent of the source and drain regions and the top surface of the semiconductor fin has the same doping polarity as the body, i.e., forms an extension of the body. A body contact is formed to the extended portion of the body above the source and drain region. To avoiding shorting between the body contact and the gate conductor, the body contact is offset from the channel and the gate conductor.

According to a second embodiment of the present invention, a second exemplary semiconductor structure comprises:
  a. a semiconductor fin located on a buried insulator layer of a semiconductor-on-insulator (SOI) substrate and having a width that is substantially the same throughout the semiconductor fin and having:
  b. source and drain regions disjoined from a top surface of the semiconductor fin;
  c. source and drain reach-through regions abutting the source and drain regions and the top surface of the semiconductor fin; and
  d. a body separating the source and drain regions, abutting the top surface of the semiconductor fin, and having an extended portion above the source and drain regions; and
  e. a body contact via abutting the extended portion of the body.

The second semiconductor structure may further comprise source and drain contact vias abutting the source and drain reach-through regions.

The second semiconductor structure may further comprise:
  a. a gate dielectric located on two sidewalls of the body of the semiconductor fin;
  b. a gate conductor of unitary construction directly contacting the gate dielectric; and
  c. a gate contact via contacting the gate conductor.

According to a third embodiment of the present invention, the gate conductor is split into two portions. The gate conductor on a first side of the fin operates independently of the gate conductor on a second side of the fin. Each independent gate conductor is contacted separately. In addition to allowing each side gate to operate independently, the body contact is formed on the top surface of the fin above the channel region. The source and drain regions are recessed beneath the top surface of the semiconductor fin. This provides a large area for the body contact to land without shorting to the source and drain regions.

According to a third embodiment of the present invention, a third exemplary semiconductor structure comprises:
  a. a semiconductor fin located on a buried insulator layer of a semiconductor-on-insulator (SOI) substrate and having a width that is substantially the same throughout the semiconductor fin and having:
  b. source and drain regions disjoined from a top surface of the semiconductor fin;
  c. source and drain reach-through regions abutting the source and drain regions and the top surface of the semiconductor fin; and
  d. a body separating the source and drain regions and abutting the top surface of the semiconductor fin; and
  e. a body contact via abutting the body at the top surface of the semiconductor fin.

The third semiconductor structure may further comprise source and drain contact vias abutting the source and drain reach-through regions.

The third semiconductor structure may further comprise
  a. a gate dielectric located on two sidewalls of the body of the semiconductor fin;
  b. two disjoined portions of a gate conductor directly contacting the gate dielectric; and
  c. two gate contact vias, each of which contacting one of the two disjoined portions of the gate conductor.

BRIEF DESCRIPTION OF THE DRAWINGS

FIGS. 1A-15D show sequential views of a first exemplary finFET structure according to a first embodiment of the present invention. Figures with the same numeric label correspond to the same stage of manufacturing. Figures with the suffix "A" are top-down views. Figures with the suffix "B," "C," or "D" are vertical cross-sectional views along the plane B-B', C-C', or D-D' respectively, of the corresponding figure with the same numeric label and the suffix "A."

FIGS. 16A-33D show sequential views of a second exemplary finFET structure according to a second embodiment of the present invention. The same suffix convention applies to these figures as the figures of the first embodiment.

FIGS. 34A-48D show sequential views of a third exemplary finFET structure according to a third embodiment of the present invention. The same suffix convention applies to these figures as the figures of the first embodiment.

DETAILED DESCRIPTION OF THE INVENTION

Figure 2B:
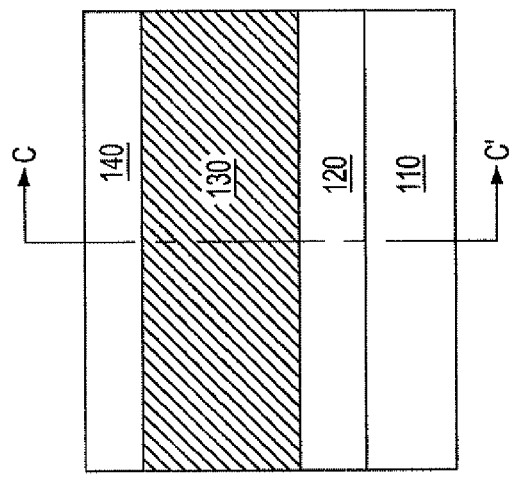

As stated above, the present invention relates to finFET structures with a body contact and methods of manufacturing the same, three embodiments of which are now described in detail with accompanying figures. It is noted that like and corresponding elements are referred to by like reference numerals.

EMBODIMENT #1

Referring to FIGS. 1A-1C, a first exemplary structure according to a first embodiment of the present invention comprises a semiconductor-on insulator (SOI) substrate which includes a handle substrate 110, a buried insulator layer 120, and a semiconductor-on-insulator (SOI) layer 129. The SOI layer 129 may comprise any semiconductor material including, but not limited to: Si, SiC, SiGe, SiGeC, Ge alloys, GaAs, InAs, InP, other III-V or II-VI compound semiconductors. It is preferred that the SOI layer 129 be composed of a Si-containing semiconductor material, i.e., a semiconductor material that includes silicon. The SOI layer 129 may be p-doped or n-doped with a dopant concentration typically in the range from about $5.0 \times 10^{14}/cm^3$ to about $3.0 \times 10^{17}/cm^3$. The doping type of the SOI layer 129 is herein referred to as a first conductivity type. Optionally, the thickness of the SOI layer 129 may be increased by an epitaxial growth prior to deposition of a cap layer 139. The cap layer 139 may be formed by chemical vapor deposition (CVD) of an insulator material. The cap layer 139 is preferably a silicon nitride layer having a preferred thickness from about 20 nm to about 300 nm.

Figure 2A:
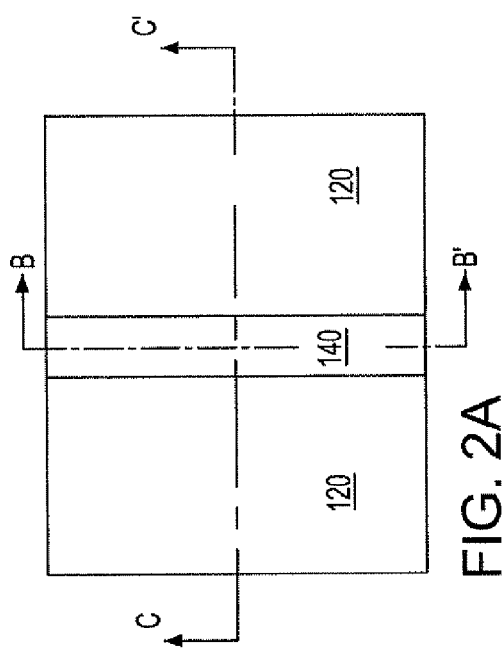
Figure 2C:
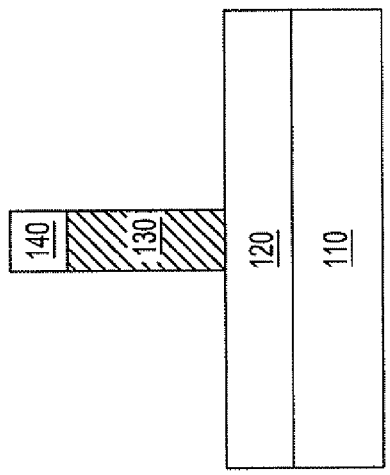

Referring to FIGS. 2A-2C, a semiconductor fin 130 is formed by any of several known methods. For example, a first photoresist (not shown) is applied to a top surface of the cap layer 139 and lithographically patterned. The pattern in the first photoresist is transferred into the cap layer 139 to form a fin cap 140 by a first reactive ion etch (RIE). The pattern is further transferred into the underlying SOI layer 129 by a second reactive ion etch (RIE). The patterned first photoresist may be removed after the fin cap 140 is formed and prior to etching the SOI layer 129. Thereafter, the fin cap 140 may be used as a hard mask for etching the SOI layer 129. Alternatively, the first photoresist may be used as a mask during the etch of the SOI layer 129. A semiconductor fin 130 is formed out of the remaining portion of the SOI layer 129. Other known or future developed methods such as electron beam lithography patterning or spacer imaging can also be used for forming the semiconductor fin 130. The preferred thickness of the SOI layer 129 prior to etching, and the height of the semiconductor fin 130, range from about 50 nm to 500 nm, although larger or smaller thicknesses are also contemplated. The width of the semiconductor fin 130 preferably is from about 10 nm to 100 nm, although larger or smaller widths are also contemplated.

Figure 3B:
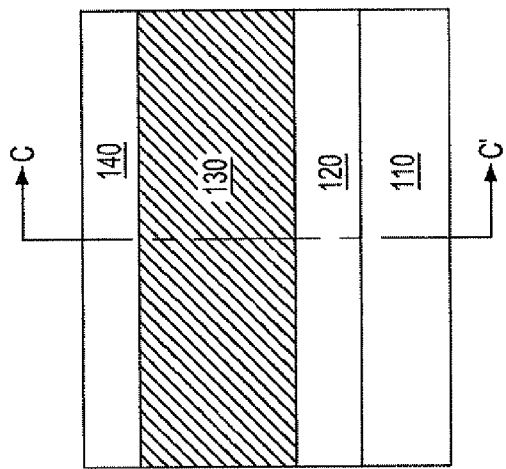
Figure 3A:
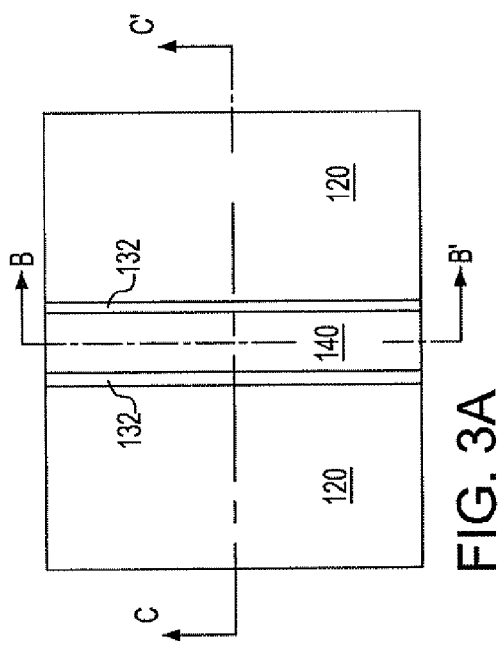
Figure 3C:
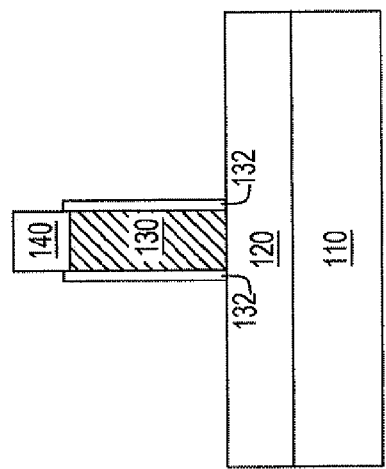
Figure 7B:
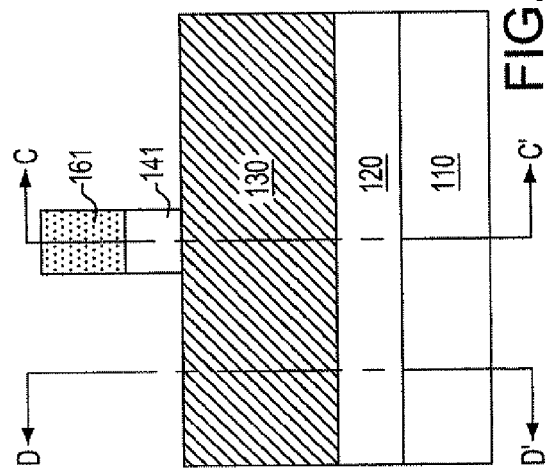
Figure 7D:
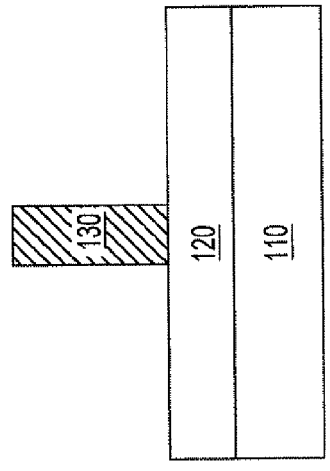
Figure 7A:
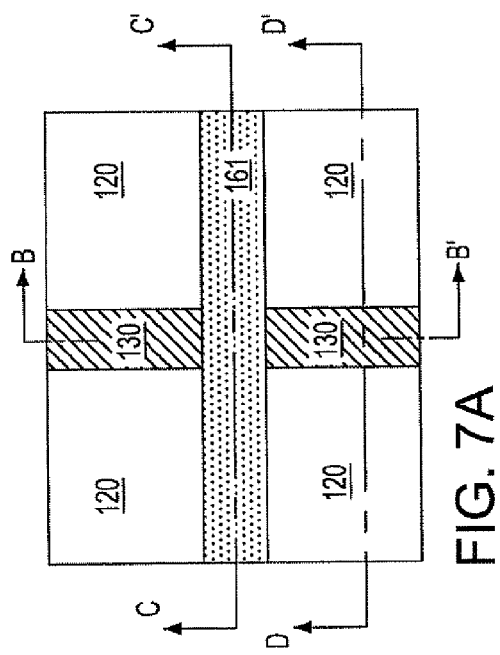
Figure 7C:
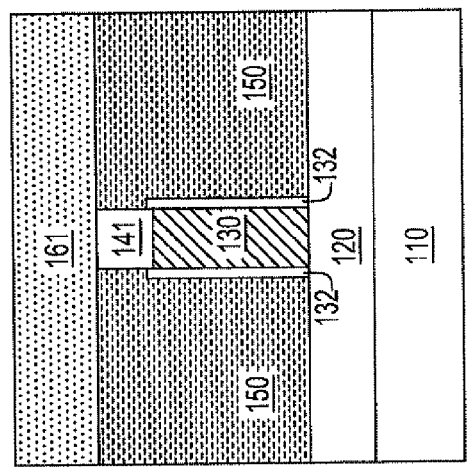
Figure 8A:
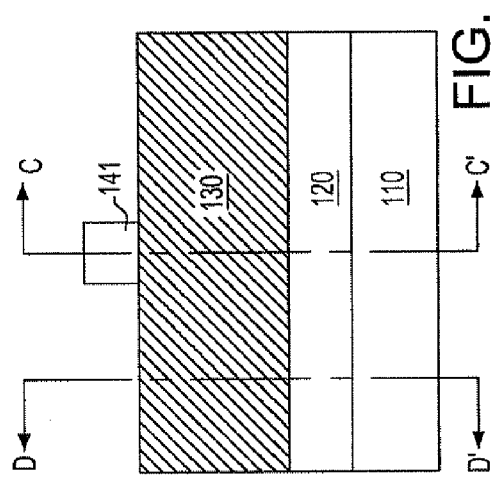
Figure 8B:
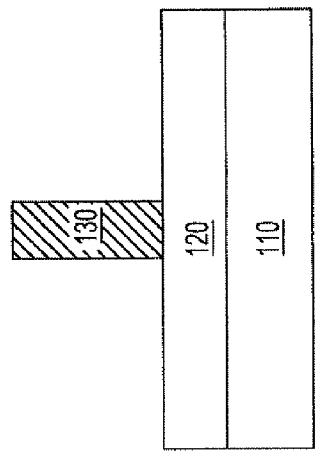
Figure 8C:
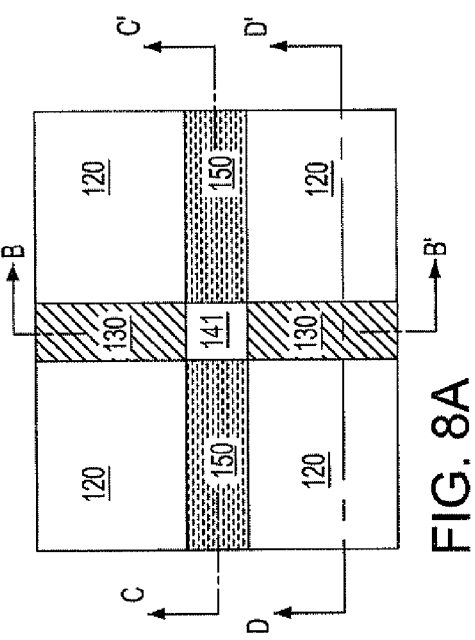
Figure 8D:
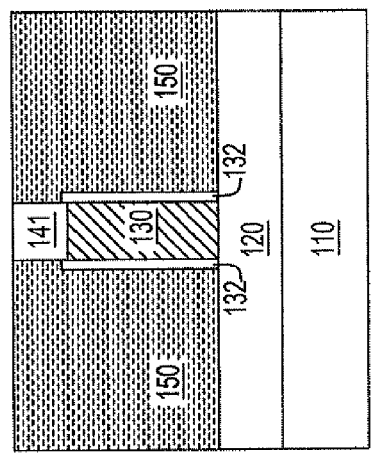
Figure 12B:
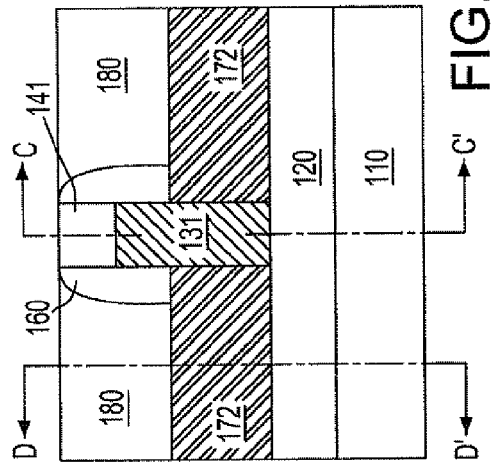
Figure 12D:
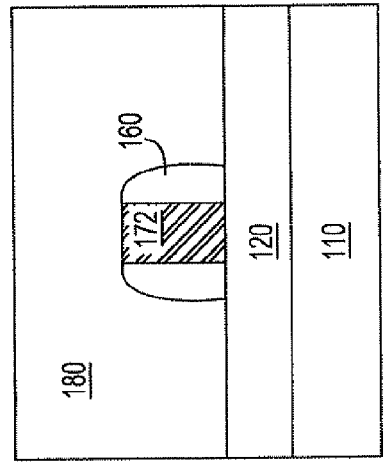
Figure 12A:
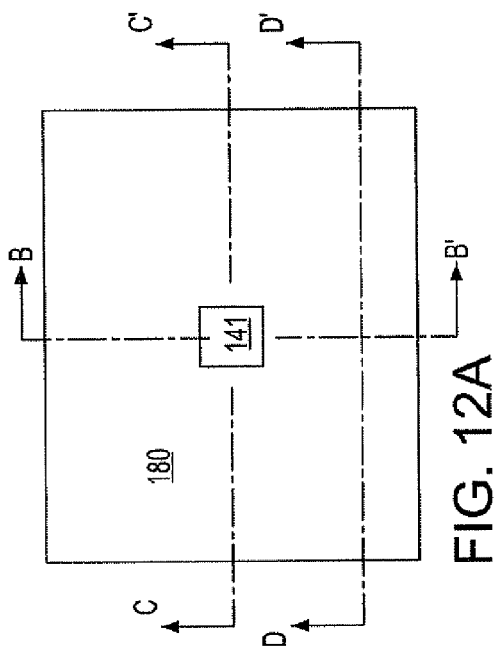
Figure 12C:
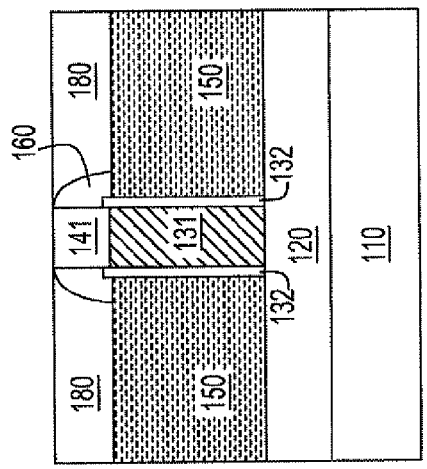

Referring to FIGS. 3A-3C, a gate dielectric 132 is formed on the sidewalls of the semiconductor fin 130. The gate dielectric may comprise a thermally grown or conformally deposited silicon dioxide, nitridated silicon oxide, other suitable insulating materials such as high-K dielectric materials, or combinations thereof.

Referring to FIGS. 4A-4D, a gate conductor material is deposited and planarized (e.g., by chemical mechanical polishing (CMP)) at least up to the top surface of the fin cap 140 to form a gate conductor layer 149. The gate conductor layer 149 is divided into two portions after planarization. The gate conductor layer 149 may comprise polysilicon, a silicide, a metal, other conductive materials, or combinations thereof. Choice of the gate conductor material is in part determined by the work function needs for the finFET device to be formed on the semiconductor fin 130.

Referring to FIG. 5A-5D, a gate mask 161 is formed over the area of gate electrodes to be formed. Standard photolithographic methods or any other suitable methods can be used to form the gate mask 161. The gate mask 161 may be a second photoresist and/or a hard mask, such as silicon oxide. The gate mask 161 covers at least a portion of the fin cap 140.

Referring to FIGS. 6A-6D, exposed portions of the gate conductor layer 149 is etched, for example, by a third reactive ion etch (RIE), using the gate mask 161 as a template. The third RIE is preferably selective to the buried insulator layer 120. The remaining portions of the gate conductor layer 149 underneath the gate mask 161 form a pair of gate electrodes 150.

Referring to FIGS. 7A-7D, with the gate mask 161 in place, exposed portions of the fin cap 140 is removed, for example, by a fourth reactive ion etch. The fourth reactive ion etch is preferably selective to the buried insulator layer 120 and to the semiconductor fin 130. The portion of the fin cap 140 underneath the gate mask 161 stays intact since it is protected from the fourth RIE by the gate mask 161. The remaining portion of the fin cap 140 forms a fin body cap 141.

Referring to FIGS. 8A-8D, the gate mask 161 is removed. A reactive ion etch and/or a wet etch may be employed to removed the gate mask 161. The gate dielectric 132 on the sidewalls of the semiconductor fin 130 that is not covered by the gate conductor may be removed, for example, by a wet etch. Optionally, the gate dielectric 132 may be allowed to remain on the sidewalls of the semiconductor fin 130.

Referring to FIGS. 9A-9D, the exposed portions of the semiconductor fin 130 are doped to form source and drain regions 172. The source and drain regions 172 are doped with dopants of a second conductivity type, which is the opposite conductivity of the first conductivity type. The source and drain regions 172 have a dopant concentration from about $1.0 \times 10^{19}/cm^3$ to about $5.0 \times 10^{21}/cm^3$, and preferably from about $1.0 \times 10^{20}/cm^3$ to about $1.0 \times 10^{21}/cm^3$. Doping is preferably achieved by angled ion implantation. The angling of the implanted ions may include a tilt and a twist to orient the impinging beam such that a desired profile (e.g., degree of doping under the edge of the gate electrodes 150) is obtained. Angled implantation may also include the formation of halos, if desired, to augment channel doping. The angled implantations may be done through the gate dielectric 132 on the sidewalls of the fin, if the gate dielectric 132 is still present. Alternatively, other suitable doping techniques such as gas phase doping, plasma doping, plasma immersion ion implantation, infusion doping, liquid phase doping, solid phase doping, may be used to form the source and drain region 172.

The portion of the semiconductor fin 130 that is not implanted with additional dopants and maintains the original doping of the first conductivity type as in the SOI layer 129 forms a body 131 of the finFET to be formed subsequently. The semiconductor fin 130 at this point comprises the body 131 doped with dopants having the first conductivity type and the source and drain regions 172 doped with dopants having the second conductivity type. For example, the body 131 may be doped with p-type dopants selected from a group of boron (B), gallium (Ga), indium (In), and thallium (Tl). The source and drain regions 172 may be doped with n-type dopants selected from a group of phosphorus (P), arsenic (As) and antimony (Sb), and a p-type dopant selected from a group of boron (B), boron fluoride (BF2), gallium (Ga), indium (In), and thallium (Tl).

Referring to FIGS. 10A-10D, using the fin body cap 141 over the semiconductor fin 130 as an etch hard mask, exposed portions of the source and drain regions 172 and gate conductor 150 are recessed, for example, by a fifth reactive ion etch (RIE). The amount of recess depth ranges from about 10 nm to 50 nm, although more or less recess depth is also anticipated during optimization of the first exemplary finFET device. This recessing step forms a body contact pedestal P which is capped by the fin body cap 141 and extends above the level of the source and drain regions 172. The body contact pedestal P is the portion of the body 131 above the top surfaces of the source and drain regions 172. Depending on the recess depth of the fifth RIE, the body contact pedestal P may be formed above the gate conductor 150.

Referring to FIGS. 11A-11D, a dielectric spacer 160 is formed on the sidewalls of the body contact pedestal P. The dielectric spacer 160 comprises one or multiple insulating materials such as nitride or oxide, and may be formed by standard conformal chemical vapor deposition (CVD) and a reactive ion etch (RIE) processes. Preferably, the width of the dielectric spacer 160 ranges from about 5 nm and 50 nm. The dielectric spacer 160 may be formed with at least five holes. The presence of the five holes is apparent in FIG. 11A. The first hole is formed by the fin body cap 141. Two holes are formed by the two portions of the gate conductor 150. Two other holes are formed by the source and drain regions 172 of the semiconductor fin 130. Topologically, the dielectric spacer 160 has five handles in this case.

Referring to FIGS. 12A-12D, a planarization dielectric 180 is deposited to a height that is at least equal to the height of the top surface of the fin body cap 141. The planarization dielectric 180 may be, for example, a CVD oxide. The CVD oxide may be an undoped silicate glass (USG), borosilicate glass (BSG), phosphosilicate glass (PSG), fluorosilicate glass (FSG), borophosphosilicate glass (BPSG), low-k dielectric, or a combination thereof. The planarization dielectric 180 is then planarized to the top of the fin body cap 141.

Referring to FIGS. 13A-13D, the fin body cap 141 is selectively etched while other elements of the first exemplary structure are preserved. A selective wet etch or a selective dry etch may be employed. In case the fin body cap 141 comprises silicon nitride, suitable etchants for a wet etch process include hot phosphoric acid or hydrofluoric ethylene glycol (HF/EG). Removal of the fin body cap 141 may also remove a top portion of the dielectric spacer 160, especially if the fin body cap 141 and the dielectric spacer 160 comprise the same material. However, partial removal of the dielectric spacer 160 at this point results in no detrimental consequences because the planarization dielectric 180 still surrounds the recessed area. In case the fin body cap 141 and the dielectric spacer 160 comprise a different material, the etch process is preferably selective to the dielectric spacer 160.

A heavy shallow ion implantation of the dopants of the first conductivity type is made through the aperture into a top portion of the body contact pedestal P to form a heavily doped body contact region 138. The heavily doped body contact region 138 has a dopant concentration from about $1.0 \times 10^{19}/cm^3$ to about $5.0 \times 10^{21}/cm^3$, and preferably from about $1.0 \times 10^{20}/cm^3$ to about $1.0 \times 10^{21}/cm^3$. This implant increases conductivity between a body contact via to be formed and the body 131 of the finFET. This implant also serves to compensate any residual doping that may have been caused by diffusion of second conductivity type dopants from the source and drain regions 172, thus avoiding shorts between the body contact via and the source and drain regions 172. The recessed region formed by the removal of the fin body cap 141 becomes a body contact aperture, beneath which the top surface of the heavily doped body contact region 138 is exposed. The body contact aperture is self aligned to the intersection of the semiconductor fin 130 and the space between the two gate electrodes 150.

Referring to FIGS. 14A-14D, contacts via holes are formed through the planarization layer 180 to the source and drain regions 172 and to the two gate electrodes 150. The aperture from which the fin body cap 141 is removed forms a body contact region BC. Each of the two contact via holes on each of the source and drain regions 172 forms a source/drain contact region SDC. Each contact via hole on the two gate electrodes 150 forms a gate contact region GC.

Referring to FIGS. 15A-15D, the various contacts via holes and the body contact aperture are filled with metal and planarized. Source and drain contact vias 197 are formed directly on the source and drain regions 172. A pair of disjoined gate electrodes 150 (split gate) are located on each side of the semiconductor fin 130 and a gate contact via 198 is formed directly on each of the gate electrodes 150. This enables each portion of the gate electrode 150 to be controlled independently of each other. A body contact via 199 fills the body contact aperture and directly contacts the body 131. The body contact via may have a substantially rectangular horizontal cross-sectional area. The body contact is self-aligned to the body contact pedestal P, or the heavily doped body contact region 138. The various contact vias (197, 198, and 199) may comprise a conductive metal such as Ti, Ta, W, Cu, or Al. Also, the various contact vias (197, 198, and 199) may also comprise a metal compound liner such as TaN, TiN, and WN to improve adhesion or other structural and electrical properties of the contact vias.

The first exemplary semiconductor comprises a semiconductor fin 130 located on a buried insulator layer 120 of a semiconductor-on-insulator (SOI) substrate. The semiconductor fin 130 has a body portion with a first height h1 and source and drain regions 172 with a second height h2. The body portion comprises a body 131 and a heavily doped body contact region 138. The body portion (131, 138) abuts the source and drain regions 172. The first height h1 is greater than the second height h2, and the extent of the body portion (131, 138) above the second height h2 constitutes a body contact pedestal P (See FIG. 10B). The first exemplary semiconductor structure further comprises a body contact via abutting a top surface of the body contact pedestal P.

The first exemplary semiconductor structure comprises source and drain contact vias 197 abutting a top surface of the source and drain regions 172. The first exemplary semiconductor structure further comprises a gate dielectric 132 located on two sidewalls of the body portion (131, 138) of the semiconductor fin 130, two portions of a gate conductor 150 directly contacting the gate dielectric 132, and two gate contact vias 198, wherein each of the two gate contact vias 198 contacts one of the two portions of the gate conductor 150.

The first exemplary semiconductor structure further comprises a dielectric spacer 160 abutting the body contact pedestal P, the two portions of the gate conductor 150, the top surface of the source and drain regions 172, sidewalls of the source and drain regions 172, and the buried insulator layer 120. The body contact via 199 is self aligned to an intersection of the semiconductor fin 130 and the two portions of the gate conductor 150. The body portion (131, 138) is doped with dopants of the first conductivity type, the source and drain regions 172 are doped with dopants of the second conductivity type, and the second conductivity type is the opposite of the first conductivity type.

Additional interlevel dielectric layers, metal wiring layers, and interconnect vias may then be formed and patterned by methods well known in semiconductor processing technology.

EMBODIMENT #2

Figure 16A:
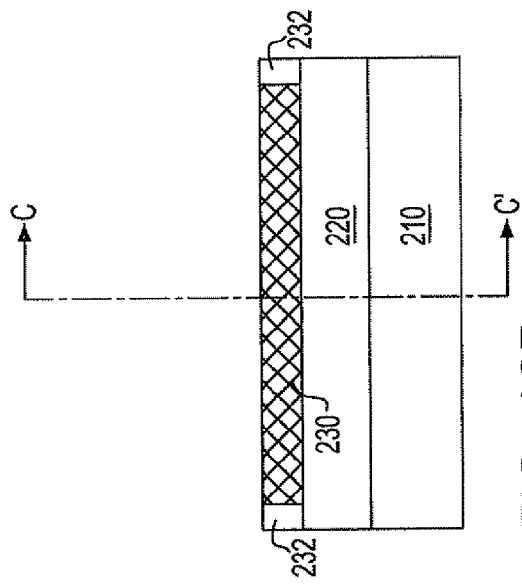
Figure 16B:
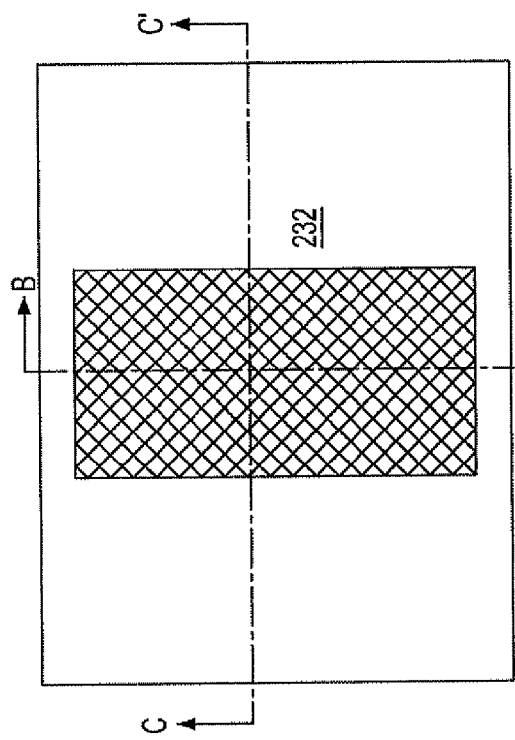
Figure 16C:
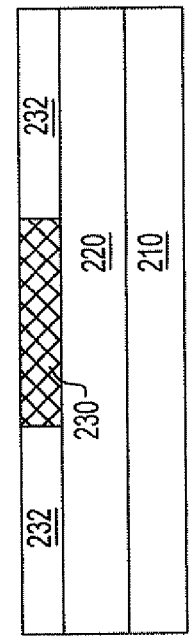

Referring to FIGS. 16A-16C, a second exemplary structure according to a second embodiment of the present invention comprises a semiconductor-on insulator (SOI) substrate including a handle substrate 210, a buried insulator layer 220, and a semiconductor-on-insulator (SOI) layer 230. The composition the SOI layer 230 may be the same as the SOI layer 129 of the first exemplary structure in the first embodiment. The SOI layer 230 may be doped with p-type dopants or with n-type dopants, or alternatively, may be substantially intrinsic. Shallow trench isolation (STI) 232 is formed by removing a portion of the SOI layer 230 and filling the resulting void with an insulator material using standard processes that are well known in the art. The STI 232 is planarized to the top surface of the SOI layer 230.

Figure 17A:
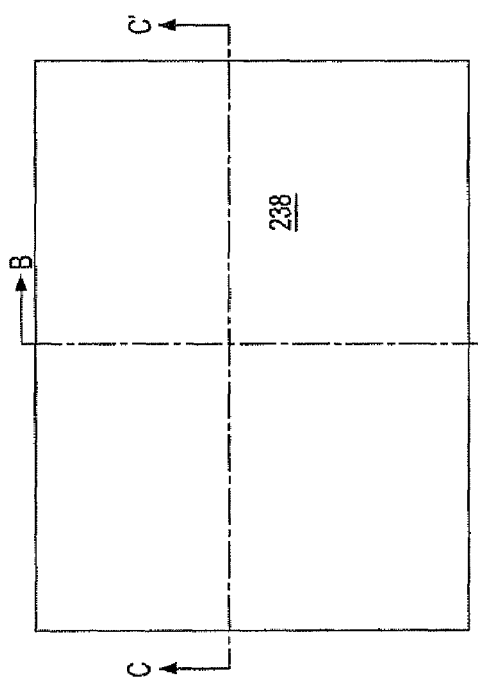
Figure 17B:
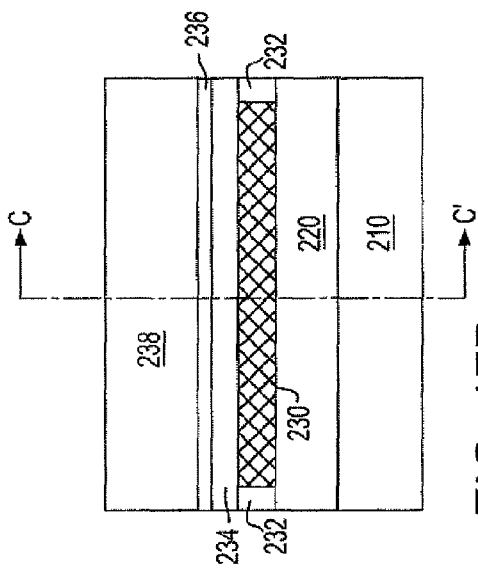
Figure 17C:
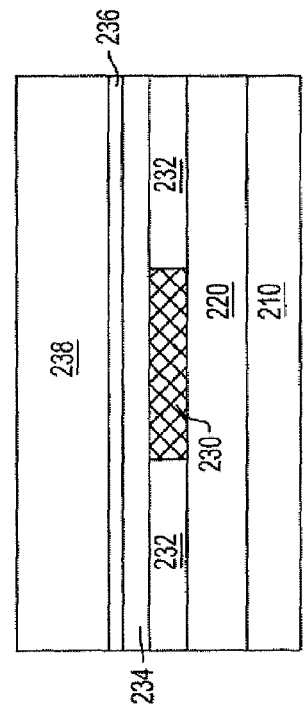

Referring to FIGS. 17A-17C, a first oxide layer 234 is deposited to a preferred thickness ranging from about 30 nm to about 70 nm, preferably by chemical vapor deposition (CVD). The first oxide layer 234 comprises an oxide, and may be, for example, a silicon oxide. The first oxide layer 234 serves as an insulating layer under a gate conductor to be subsequently formed, and reduces a parasitic capacitance between the gate conductor and the SOI layer 230. An etch stop nitride layer 236 is deposited on the oxide layer 234 to a thickness ranging from about 10 nm to about 30 nm. The etch stop nitride layer 236 comprises a nitride, and may be, for example, a silicon nitride. A second oxide layer 238 is deposited, preferably by chemical vapor deposition (CVD) on the etch stop nitride layer 236. The second oxide layer 238 comprises an oxide, and may be, for example, a silicon oxide. The second oxide layer 238, to a large extent, determines the height of a semiconductor fin to be subsequently formed, and ranges in thickness from about 100 nm to 500 nm, although thinner or thicker values are also contemplated. Optionally, a thin silicon nitride layer (not shown) having a thickness ranging from about 5 nm to about 20 nm may be deposited by CVD prior to the deposition of the first oxide layer 234 directly on the SOI layer 230 and the STI 232. The thin nitride layer may be employed as an etch stop during a subsequent etching of the first oxide layer 234.

Figure 18B:
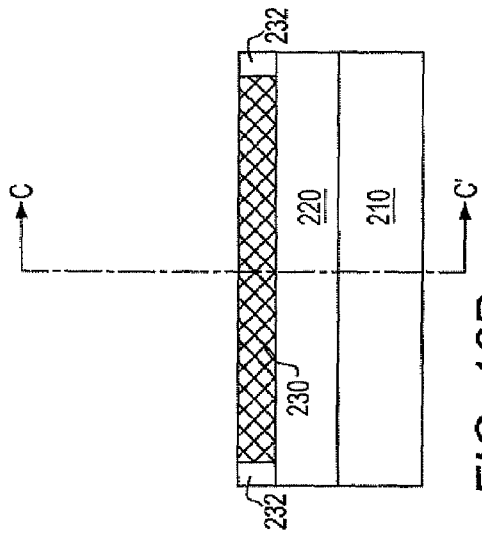
Figure 18A:
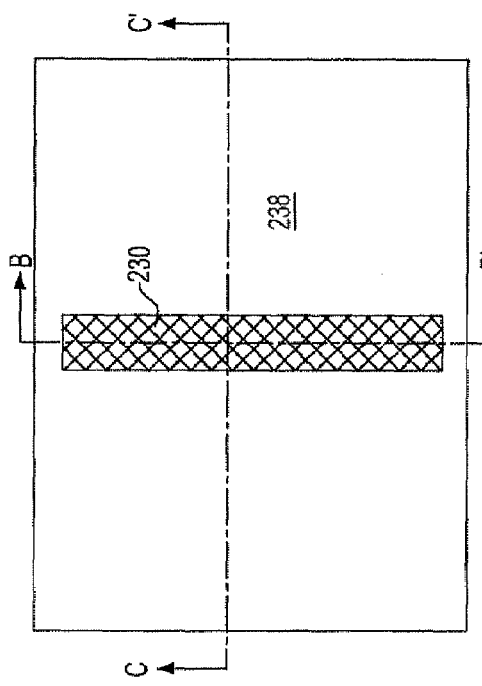
Figure 18C:
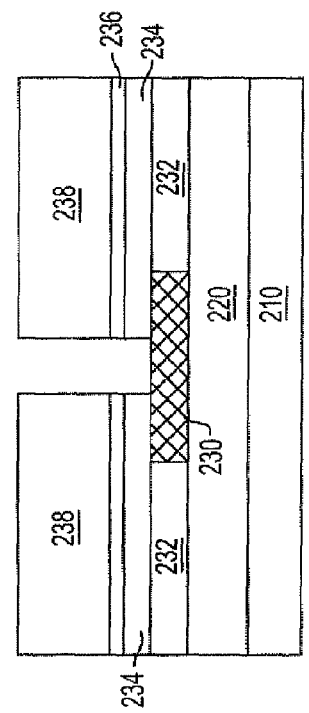

Referring to FIGS. 18A-18C, the stack of the second oxide layer 238, the etch stop nitride layer 236, and the first oxide layer 234 is lithographically patterned and etched to form an aperture in the shape of a trough through the stack. The etch may be a reactive ion etch and stops on the SOI layer 230.

Referring to FIGS. 19A-19C, a semiconductor material is grown from the SOI layer 230 by a selective epitaxy process to form a semiconductor fin 240. The semiconductor fin 240 and the SOI layer 230 may comprise the same material, in which case their lattice constants are matched, or alternatively, may comprise different materials having a lattice mismatch that is small enough to enable epitaxial alignment of the atoms of the semiconductor fin 240 the lattice of the SOI layer 230. For example, both the semiconductor fin 240 and the SOI layer 230 may be silicon. The semiconductor fin 240 may be p-doped or n-doped with a dopant concentration typically in the range from about $5.0 \times 10^{14}/cm^3$ to about $3.0 \times 10^{17}/cm^3$. The doping type of the semiconductor fin 240 is herein referred to as a first conductivity type.

During the selective epitaxy process, the semiconductor material of the semiconductor fin 240 grows only from a semiconductor surface. Growth of the semiconductor material does not occur on a dielectric surface since nucleation of semiconductor material on a dielectric surface is suppressed in a selective epitaxy process. The semiconductor fin 240 is epitaxially aligned to the SOI layer 230 and has the same crystallographic orientations as the SOI layer 230. The semiconductor fin 240 grows upward through the aperture, and then overgrows over the top surface of the second oxide layer 238. The overgrowth of the semiconductor material above the top surface of the second oxide layer 238 may be removed, for example, by chemical mechanical polishing (CMP).

Figure 20A:
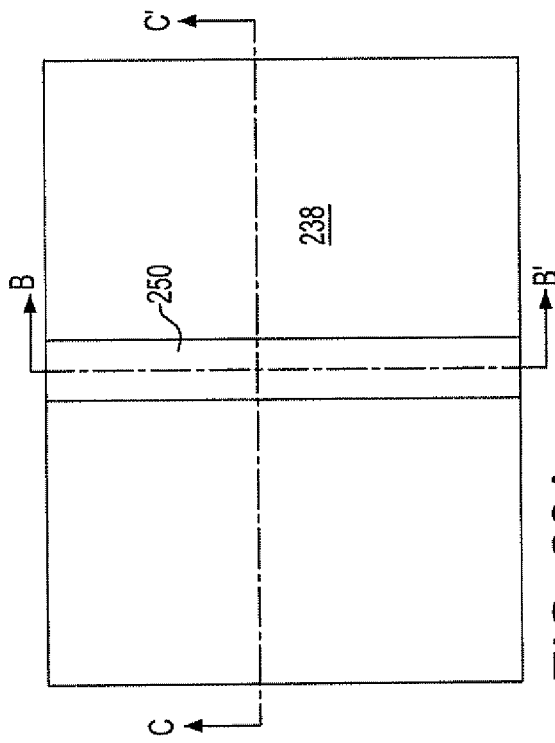
Figure 20B:
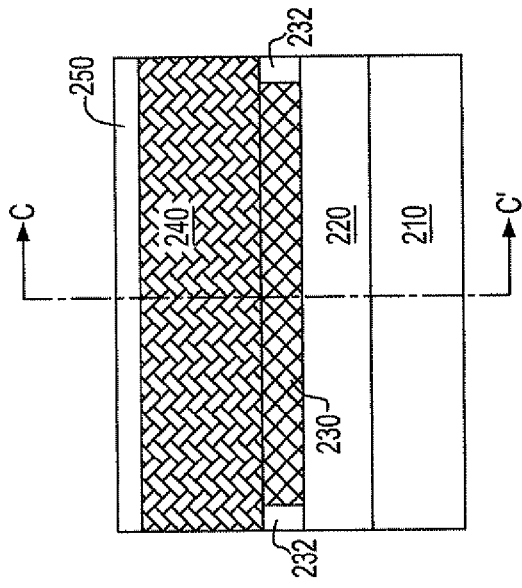
Figure 20C:
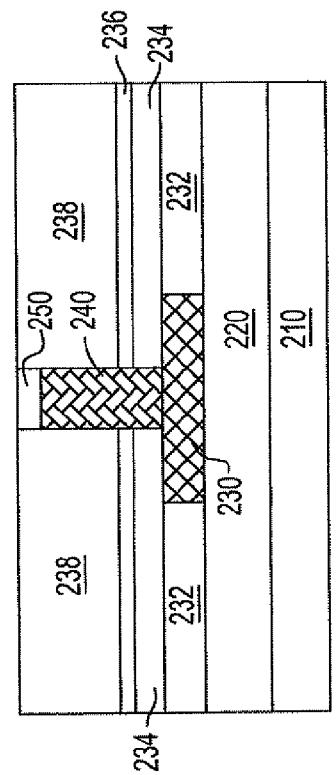

Referring to FIGS. 20A-20C, the top surface of the semiconductor fin 240 is recessed by a depth ranging from about 20 nm to about 50 nm below the top surface of the second oxide layer 238. A dielectric fin cap layer (not shown) is conformally deposited, for example, by CVD to fill the recessed region above the semiconductor fin 240. The dielectric fin cap layer may comprise a CVD nitride such as silicon nitride. The material of the dielectric fin cap layer above the top surface of the second oxide layer 238 is removed by a reactive ion etch, chemical mechanical planarization, or a combination of both. A fin cap 250 comprising the same dielectric material as the original dielectric fin cap layer is formed below the top surface of the second oxide layer 238 and directly above the semiconductor fin 240. The fin cap 250 and the semiconductor fin 240 have substantially the same horizontal cross-sectional area.

Referring to FIGS. 21A-21C, the second oxide layer 238 is removed by a reactive ion etch (RIE) or a wet etch that is selective to the dielectric material of the fin cap 250. The RIE is preferably selective to the etch stop nitride layer 236 and to the semiconductor fin 240. Further, the etch stop nitride layer 236 is removed by another wet etch or another reactive ion etch that is selective to the dielectric material of the fin cap 250 and is preferably selective to the first oxide layer 234 and the semiconductor fin 240. If any of the two etch processes removes a portion of the fin cap 250, the recess depth of the semiconductor fin 240 and consequently, the thickness of the fin cap 250 are adjusted during the prior processing steps to account for the reduction in the thickness of the fin cap 250 due to the loss of the material during the etch processes.

Figure 22B:
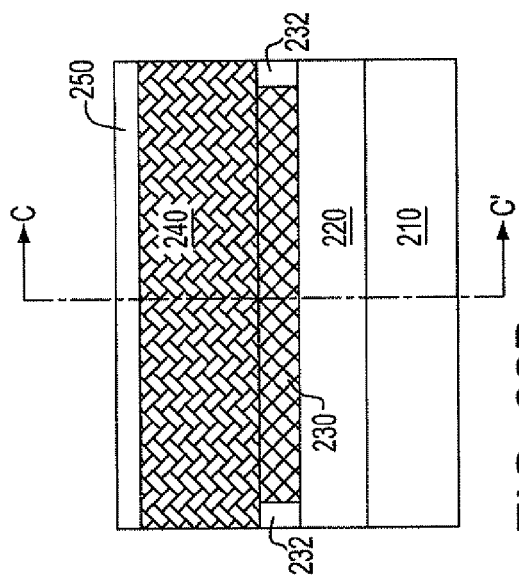
Figure 22A:
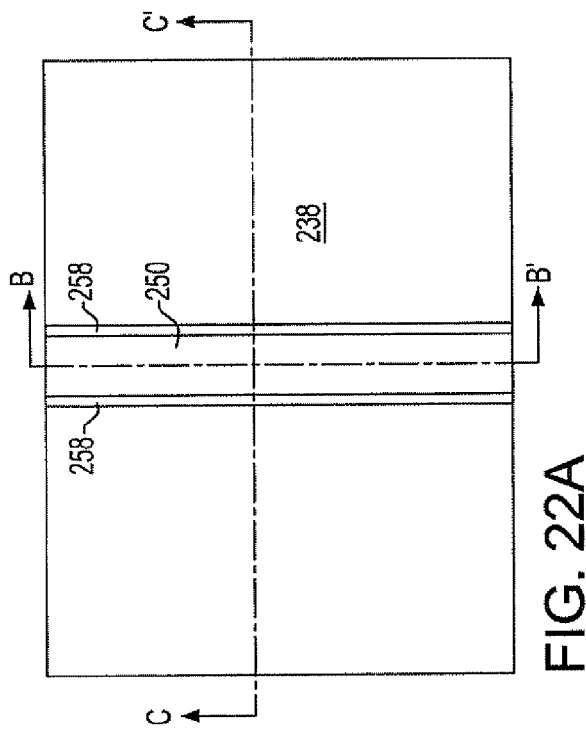
Figure 22C:
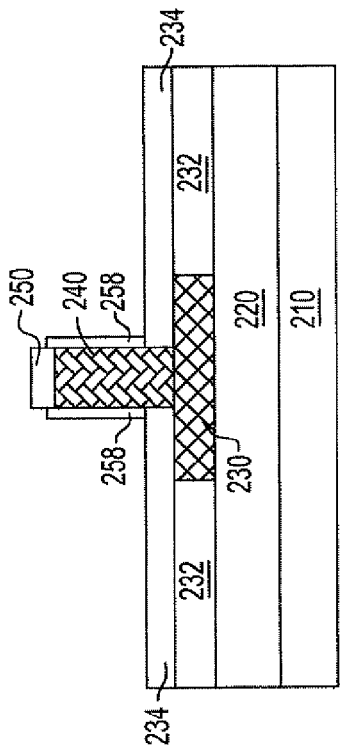
Figure 23A:
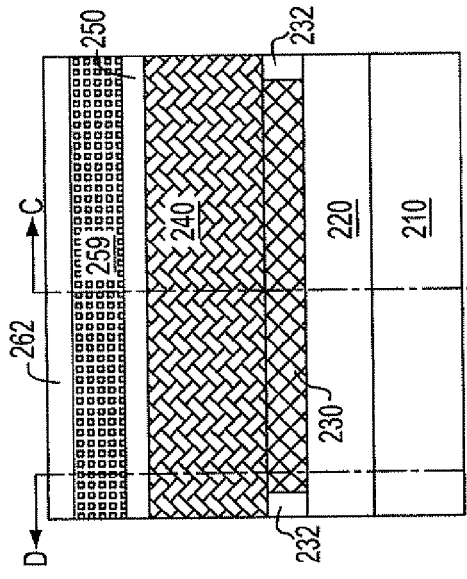
Figure 23B:
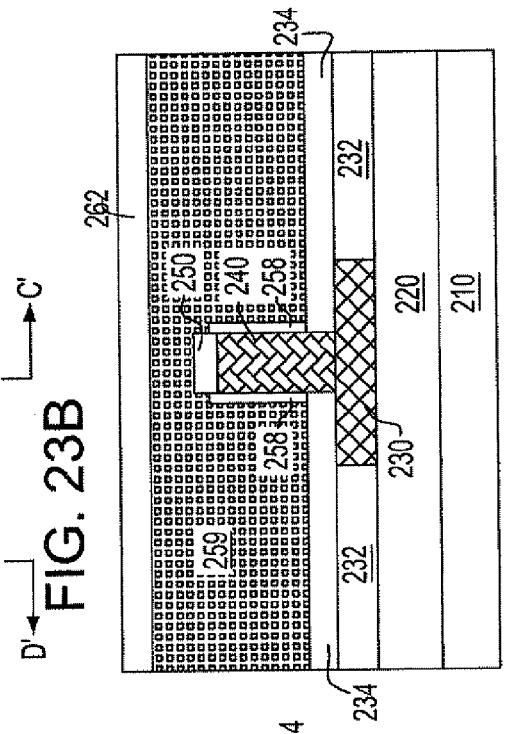
Figure 23C:
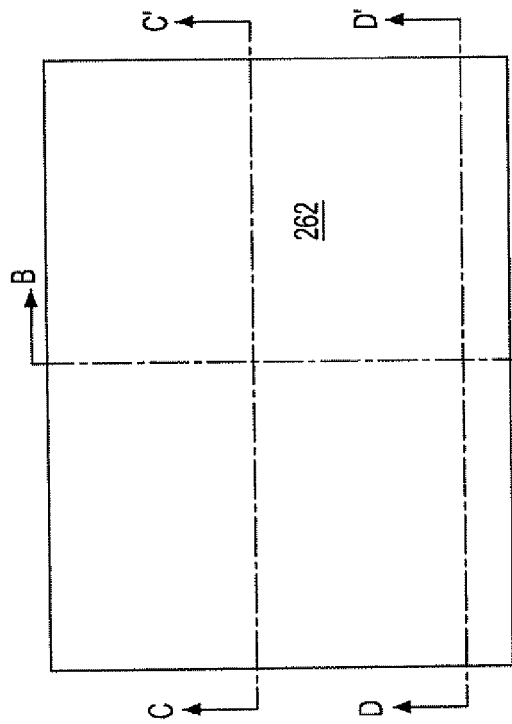
Figure 23D:
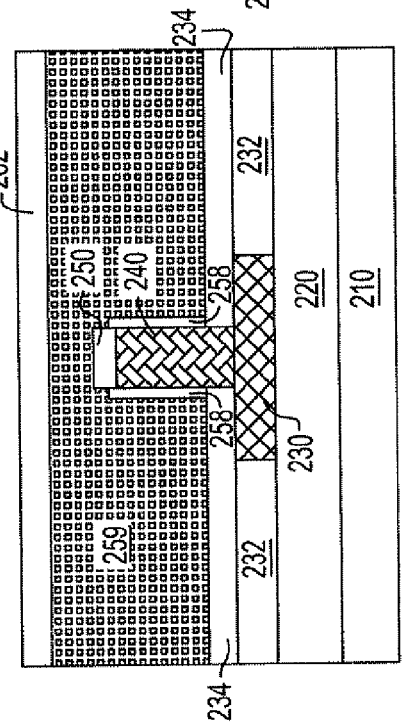
Figure 25A:
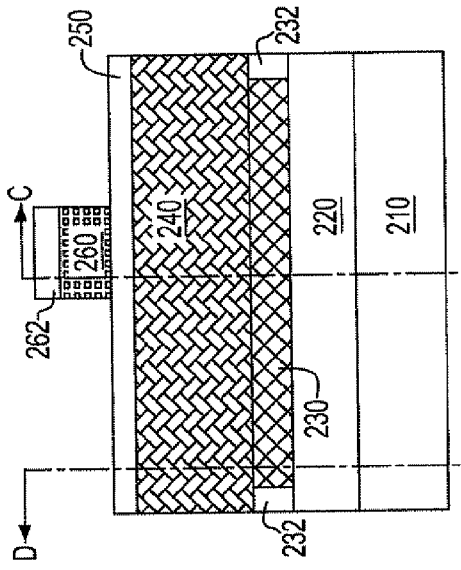
Figure 25B:
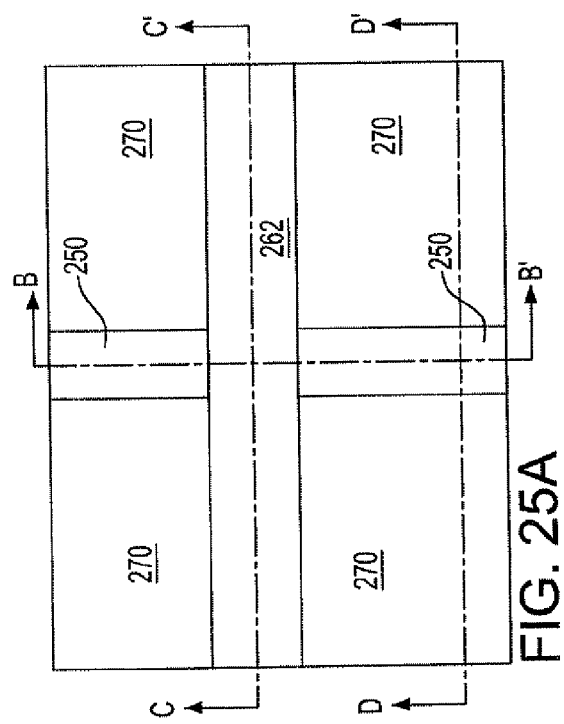
Figure 25C:
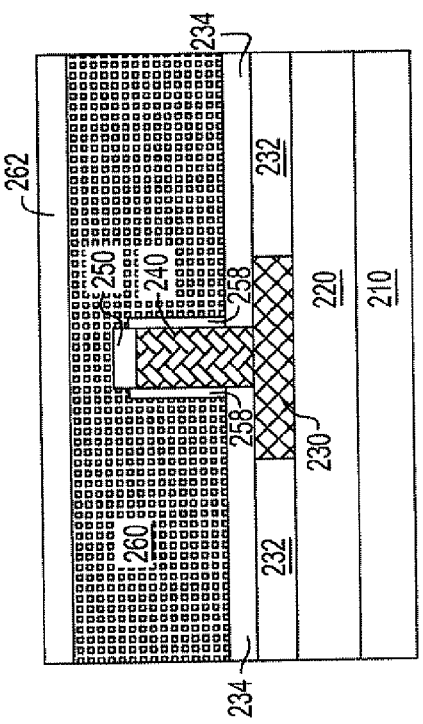
Figure 25D:
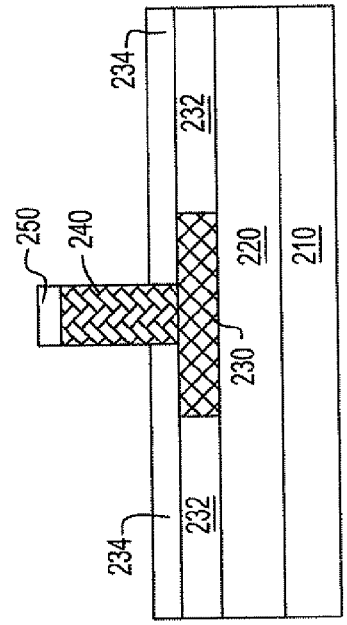

Referring to FIGS. 22A-22C, a gate dielectric 258 is formed on the sidewalls of the semiconductor fin 240. The gate dielectric 258 may comprise a thermally grown or conformally deposited silicon dioxide, nitridated silicon oxide, other suitable insulating materials such as high-K dielectric materials, or combinations thereof.

Referring to FIGS. 23A-23D, a gate conductor material is deposited and planarized by chemical mechanical polishing (CMP) at least up to the top surface of the fin cap 250 to form a gate conductor layer 259. The gate conductor material may be deposited and planarized such that it covers the fin cap 250 to assure that the gate conductor bridges across the semiconductor fin 240. Alternatively, the gate conductor layer 259 may be planarized such that it is completely removed from over the fin cap 250. In that case, independent control of each sidewall gate may be obtained.

The gate conductor layer 259 may comprise polysilicon, a silicide, a metal, other conductive materials, or combinations thereof. Choice of the gate conductor material is in part determined by the work function needs for the finFET device to be formed on the semiconductor fin 240.

A dielectric hard mask 262 is then deposited over the planarized gate conductor layer 259. The dielectric hard mask 262 may comprise, for example, silicon nitride and may have a thickness from about 10 nm to about 60 nm.

Referring to FIGS. 24A-24D, the dielectric hard mask 262 is lithographically patterned for a gate electrode to be subsequently formed. Specifically, the portion of the dielectric hard mask 262 located above the gate electrode to be formed is covered by a photoresist (not shown) while the rest of the dielectric hard mask 262 outside the area of the gate electrode is exposed and etched, for example, by a reactive ion etch. Employing the patterned dielectric hard mask 262 as a template, exposed portions of the gate conductor layer 259 is etched by a reactive ion etch (RIE). The RIE is preferably selective to the first oxide layer 234. The remaining portion of the gate conductor layer 259 underneath the patterned dielectric hard mask 262 forms a gate electrode 260. The gate dielectric 258 is exposed from portions of the semiconductor fin 240.

Referring to FIGS. 25A-25D, the exposed portions of the gate dielectric 258 is isotropically etched from the sidewalls of the semiconductor fin 240.

Referring to FIGS. 26A-26D, a third oxide layer 270 is deposited to fill the space around the semiconductor fin 240 at least up to the height of the top surface of the patterned dielectric hard mask 262. The third oxide layer 270 is subsequently planarized and recessed by a depth R such that the recessed surface of the third oxide layer 270 is located beneath a bottom surface of the fin cap 250.

Optionally, block masks may be used to select the recess depth R locally, i.e., to enable multiple recess depths R across the same semiconductor substrate, thus enabling a concurrent formation of both body contacted finFETs and non-body-contacted FinFETs. Once the top of the semiconductor fin 240 is exposed, an optional body contact doping implant with dopants of the first conductivity type may be performed into the exposed portion of the semiconductor fin 240.

Figure 27A:
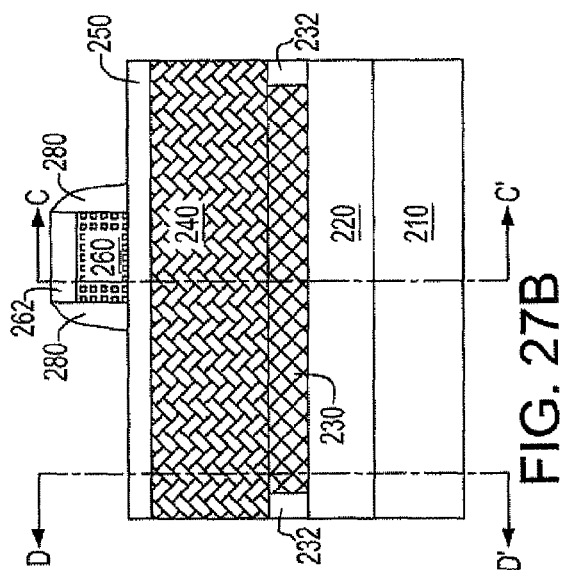
Figure 27B:
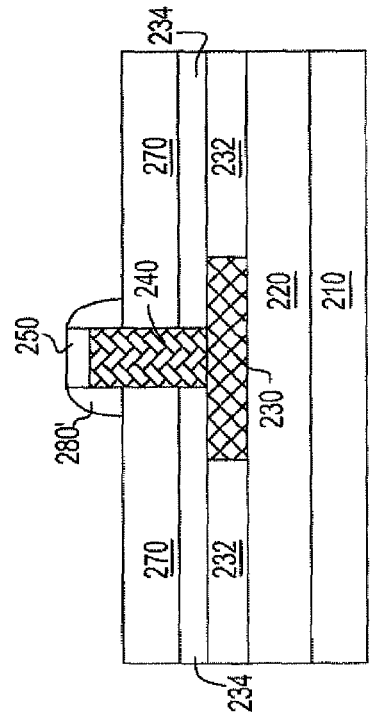
Figure 27C:
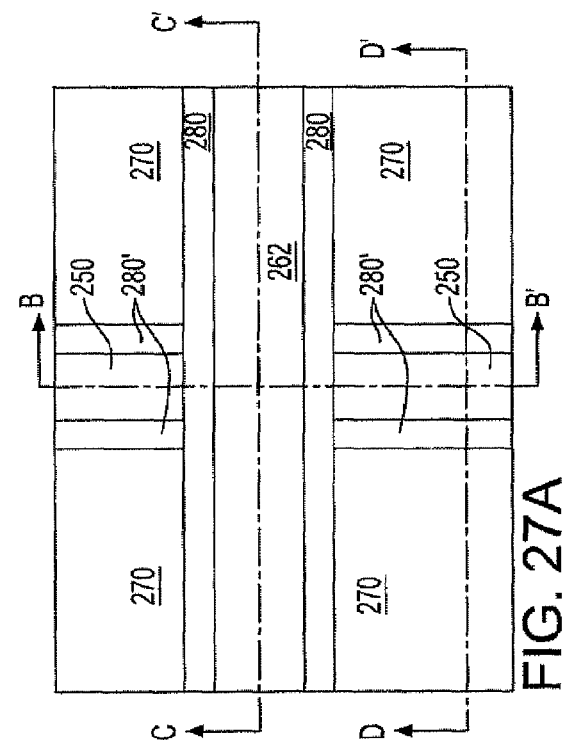
Figure 27D:
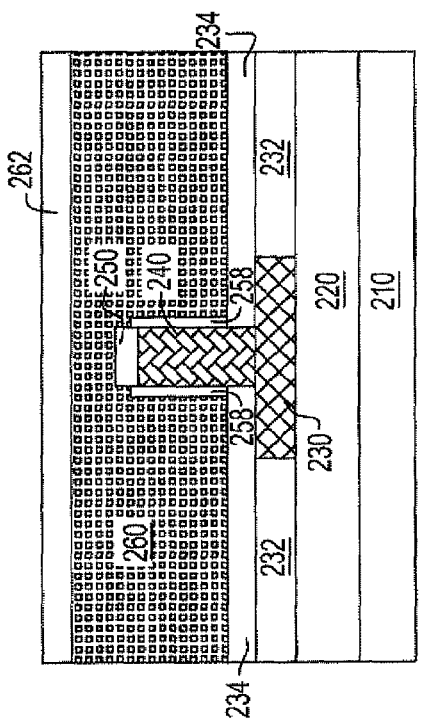
Figure 29B:
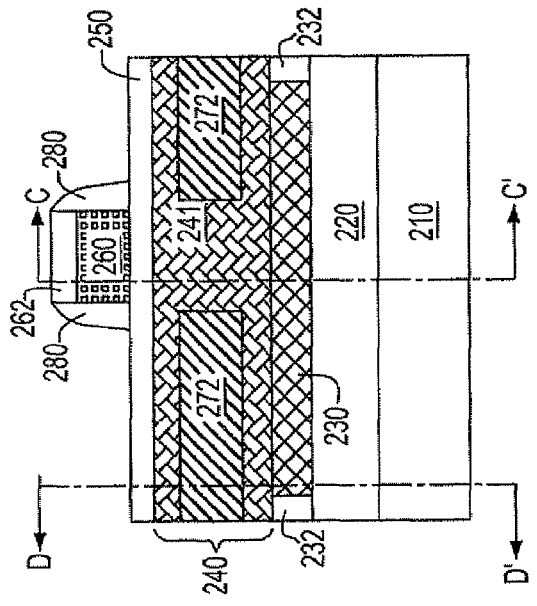
Figure 29A:
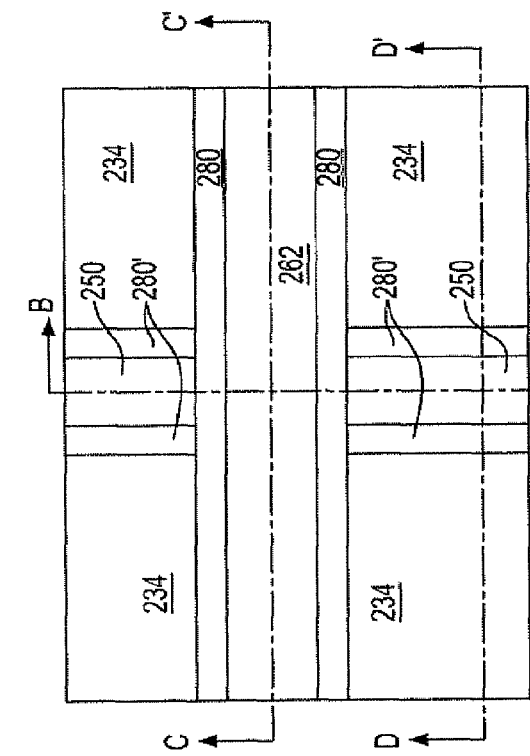
Figure 29D:
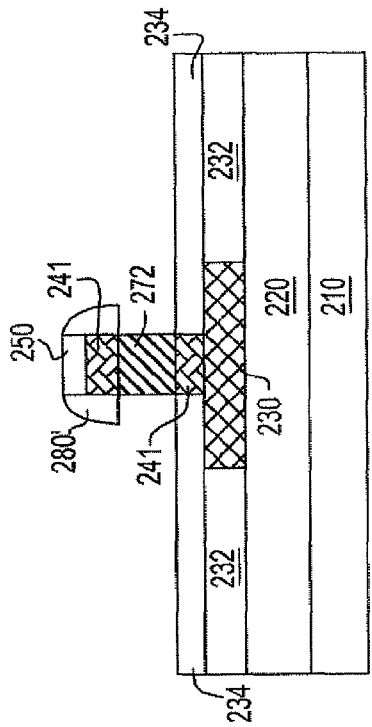
Figure 29C:
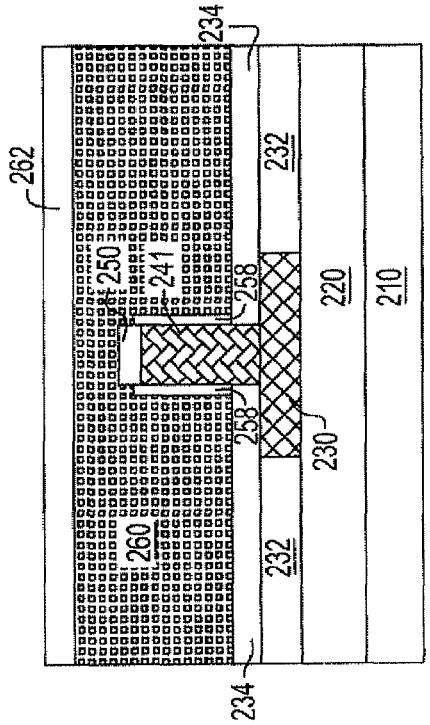
Figure 30B:
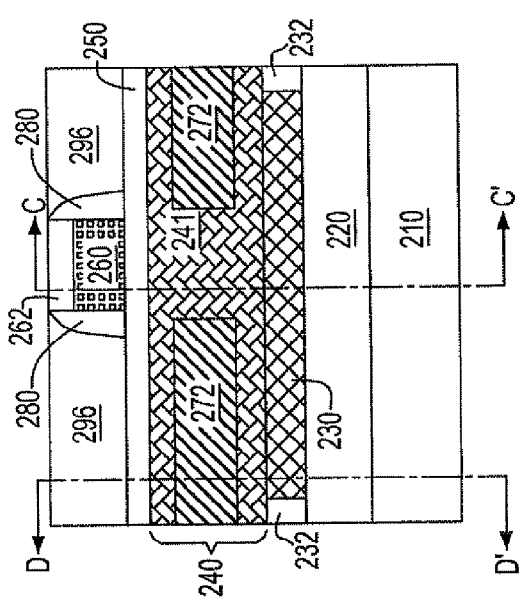
Figure 30A:
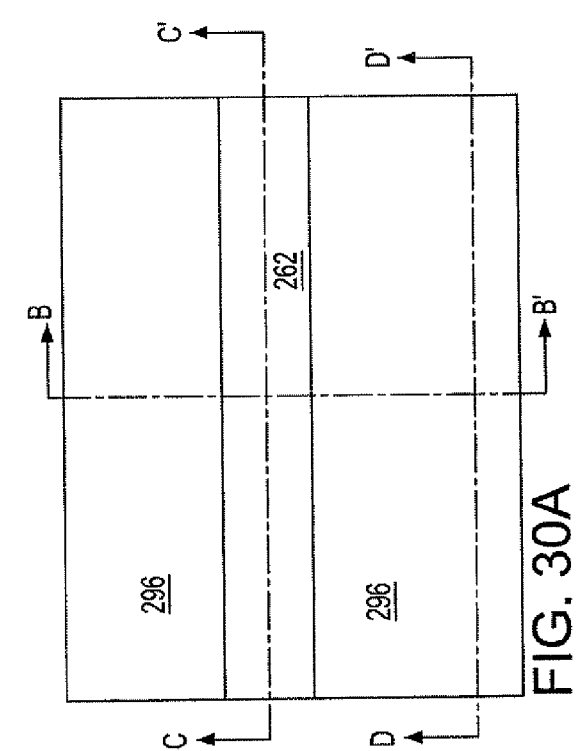
Figure 30D:
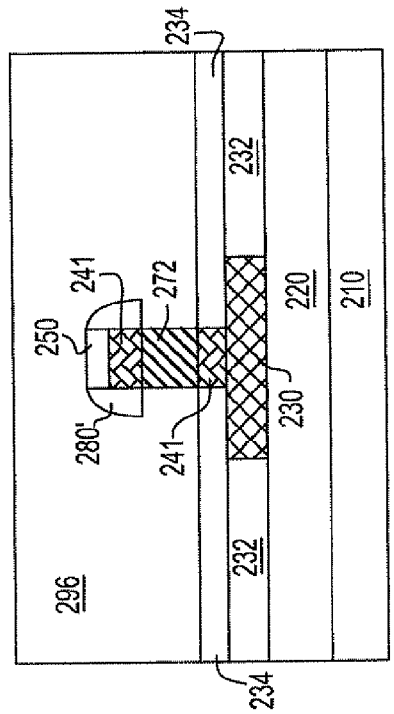
Figure 30C:
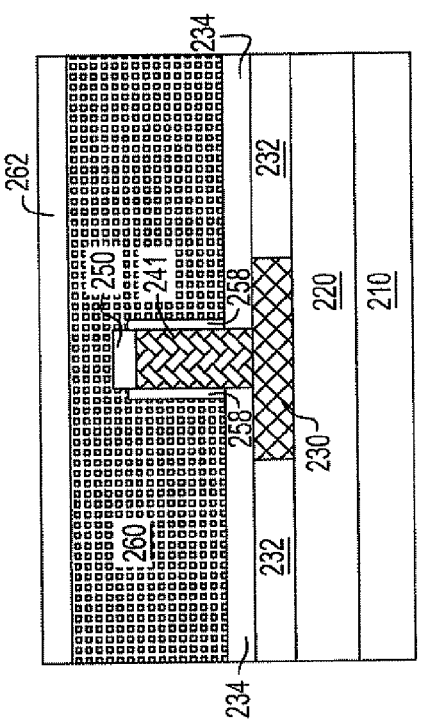
Figure 32A:
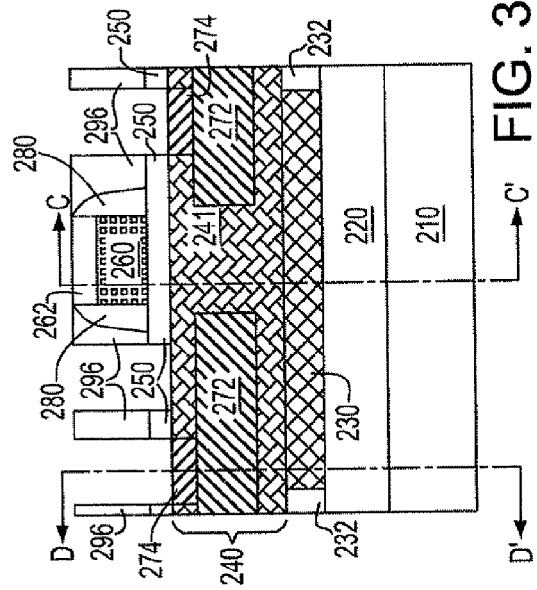
Figure 32B:
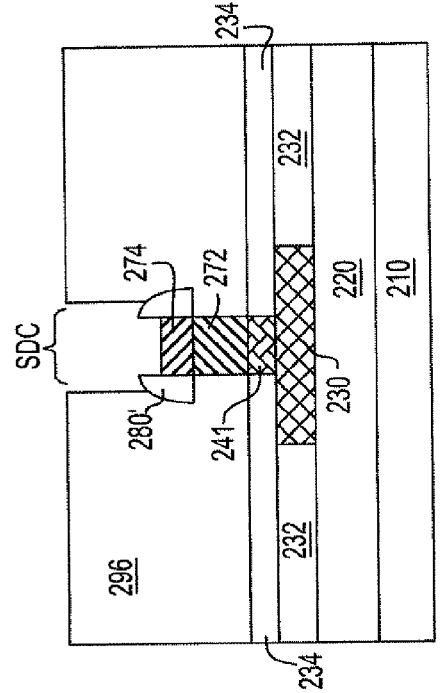
Figure 32C:
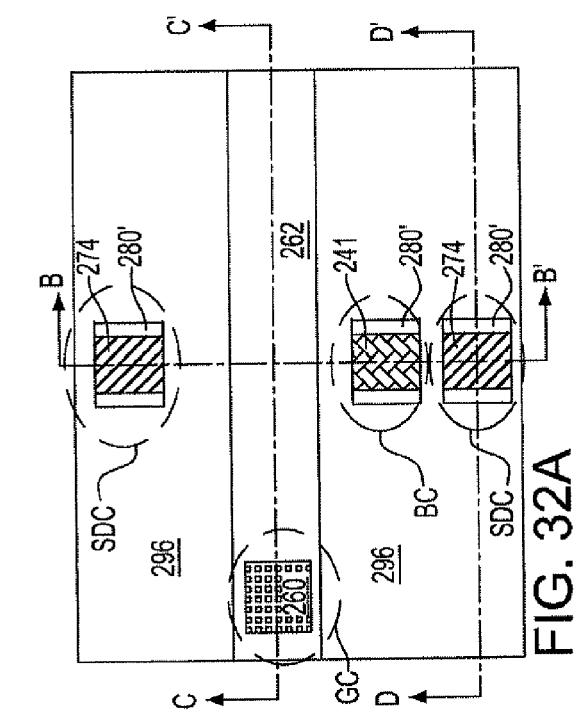
Figure 32D:
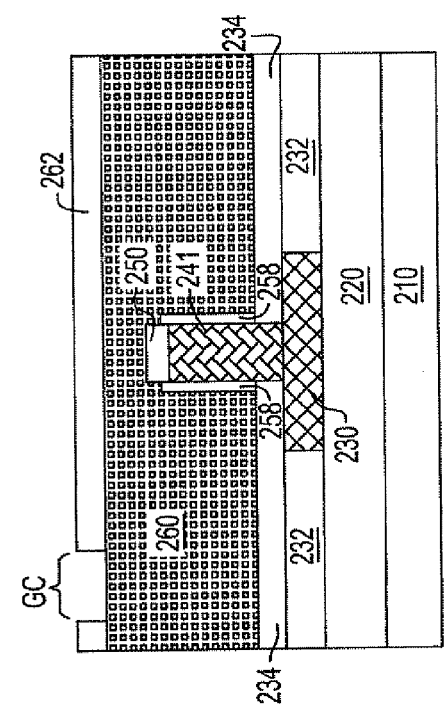

Referring to FIGS. 27A-27C, a gate spacer 280 is formed on the sidewalls of the patterned dielectric hard mask 262 and the sidewalls of the gate electrode 260. Further, fin spacers 280' are formed on exposed upper portions of the sidewalls of the semiconductor fin 240. The gate spacer 280 and the fin spacers 280' comprise the same dielectric material, such as silicon nitride. The dielectric spacer 280 has a width preferably between 10 nm and 50 nm, although narrower or wider dielectric spacers 280 are also contemplated. The dielectric spacer 280 protects the upper portion of the semiconductor fin 240 from subsequent doping of source and drain regions to be formed.

Referring to FIGS. 28A-28D, the third oxide layer 270 is removed selectively to the semiconductor material of the semiconductor fin 240 and the dielectric material of the gate spacer 280 and the fin spacers 280'. A dry or wet isotropic etch may be employed to remove the material of the third oxide layer 270 from under the fin spacers 280'. The etch may remove all of the third oxide layer 270 and stop on the first oxide layer 234. Alternatively, the etch may stop within the third oxide layer 270 or within the first oxide layer 234. The depth of the etch below the bottom surface of the fin spacers 280' determines the height of the source and drain regions to be formed.

Referring to FIGS. 29A-29D, source and drain regions 272 are formed in the exposed areas of the semiconductor fin 240. The source and drain regions 272 are doped with dopants of a second conductivity type, which is the opposite conductivity of the first conductivity type. The source and drain regions 272 have a dopant concentration from about $3.0 \times 10^{19}/cm^3$ to about $5.0 \times 10^{21}/cm^3$, and preferably from about $1.0 \times 10^{20}/cm^3$ to about $1.0 \times 10^{21}/cm^3$. The doping of the source and drain regions 272 may be achieved by angled ion implantation, gas phase doping, plasma immersion doping, or other suitable methods.

The portion of the semiconductor fin 240 that is not implanted with additional dopants during the source and drain doping processing step forms a body 241. The body 241 maintains the doping of the first conductivity type of the semiconductor fin 240 as originally grown by the selective epitaxy process. The top surface, the bottom surface, and a side surface of each of the source and drain regions 272 abut the body 241.

Referring to FIGS. 30A-30D, a planarization dielectric 296 is deposited to a height that is at least equal to the height of the patterned dielectric hard mask 262. The planarization dielectric 296 may be, for example, a CVD oxide. The CVD oxide may be an undoped silicate glass (USG), borosilicate glass (BSG), phosphosilicate glass (PSG), fluorosilicate glass (FSG), borophosphosilicate glass (BPSG), or a combination thereof. The planarization dielectric 296 is then planarized to the top of the patterned dielectric hard mask 262. The semiconductor fin 240 at this point comprises the body 241 having a doping of the first conductivity type and the source and drain regions 272 having a doping of the second conductivity type.

Referring to FIGS. 31A-31D, source and drain contact via holes are formed in a source/drain contact region SDC through the planarization dielectric 296 and the fin cap 250 onto the source and drain regions 272. This may be achieved by applying a photoresist (not shown) and employing a via mask to pattern the source and drain contact via holes in the photoresist. The pattern is subsequently transferred through the planarization dielectric 296 and the fin cap 250 by a reactive ion etch. The pattern for the source and drain contact via holes may overlap into the adjacent planarization dielectric 296 without causing any concern for electrical shorts with other semiconductor components. In this sense, the source and drain contact via holes are self-aligned to the semiconductor fin 240.

A heavy shallow ion implantation of the dopants of the second conductivity type is performed through the source and drain contact via holes into a top portion of the body 241 to form source and drain reach-through regions 274. The source and drain reach-through regions 274 have substantially the same level of doping concentration as the source and drain regions 272. The source and drain reach-through regions 274 enables low resistance electrical contact between the source and drain regions 272 and the source and drain contact via to be subsequently formed.

Referring to FIGS. 32A-32D, a gate contact via is formed in a gate contact region GC through the patterned dielectric hard mask 262 onto the gate conductor 250. At the same time, a body contact via is formed in a body contact region BC through the planarization dielectric 296 and the fin cap 250 onto the body 241. The pattern for the gate contact via hole may overlap into the adjacent planarization dielectric 296 without causing any concern for electrical shorts with other semiconductor components due to the gate spacer 280. In this sense, the gate contact via hole is self-aligned to the patterned hard mask 262, and consequently, to the gate electrode 260. As with the source and drain contact via holes, the body contact via is self aligned to the semiconductor fin 240.

Referring to FIGS. 33A-33D, the various contacts via holes are filled with metal and planarized. Source and drain contact vias 297 are formed directly on the source and drain reach-through regions 274. A gate contact via 298 is formed directly on the gate electrode 260. A body contact via 299 is formed directly on the portion of the body 241 that is located direct above one of the source and drain regions 272. The body contact via 299 is vertically offset, from the source and drain reach-through regions 274, i.e., does not overlap in a top-down view with the source and drain reach-through regions 274. The various contact vias (297, 298, and 299) may comprise a conductive metal such as Ti, Ta, W, Cu, or Al. Also, the various contact vias (297, 298, and 299) may also comprise a metal compound liner such as TaN, TiN, and WN to improve adhesion or other structural and electrical properties of the contact vias.

The second exemplary structure comprises a semiconductor fin 240 located on a buried insulator layer 220 of a semiconductor-on-insulator (SOI) substrate. The second exemplary structure has source and drain regions 272 disjoined from a top surface of the semiconductor fin, source and drain reach-through regions 272 abutting the source and drain regions 272 and the top surface of the semiconductor fin 240, and a body 241 separating the source and drain regions 272, abutting the top surface of the semiconductor fin 240, and having an extended portion E above the source and drain regions 272. The top surface of the semiconductor fin is also the interface between the semiconductor fin 240 and the fin cap 250. The second semiconductor structure further comprises a body contact via 298 abutting the extended portion E of the body 241.

The second exemplary semiconductor structure further comprises source and drain contact vias 297 abutting the source and drain reach-through regions 274. The second exemplary semiconductor structure further comprises a gate dielectric 258 located on two sidewalls of the body 241 of the semiconductor fin 240, a gate conductor 250 of unitary construction, i.e., in one piece, directly contacting the gate dielectric 258, and a gate contact via 298 contacting the gate conductor 250.

The second exemplary semiconductor structure further comprises fin spacers 280' contacting the extended portion E of the body 241 and the source, drain reach-through regions 274, the source and drain contact vias 297, and the body contact via 299. The second exemplary semiconductor structure further comprises a fin cap 250 contacting the top surface of the semiconductor fin 240 and the gate conductor 260 and comprising a dielectric material, and a dielectric hard mask 262 contacting a top surface of the gate conductor 260. The second exemplary semiconductor structure further comprises a gate spacer 280 contacting the gate conductor 260, the fin cap 250, and the dielectric hard mask 262.

The body 241 is doped with dopants of a first conductivity type, the source and drain regions 272 are doped with dopants of a second conductivity type, and the second conductivity type is the opposite of the first conductivity type.

Additional interlevel dielectric layers, metal wiring layers, and interconnect vias may then be formed and patterned by methods well known in semiconductor processing technology.

EMBODIMENT #3

Figure 34B:
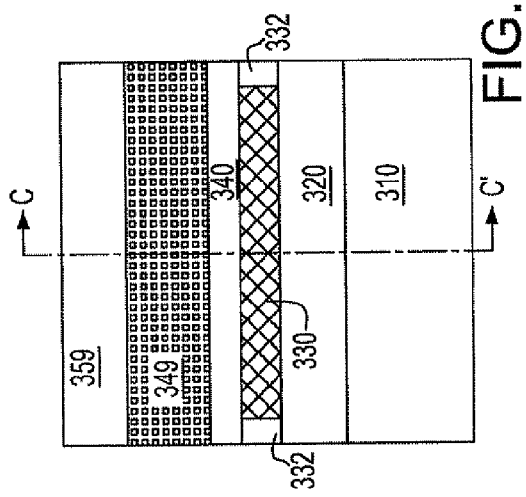
Figure 34A:
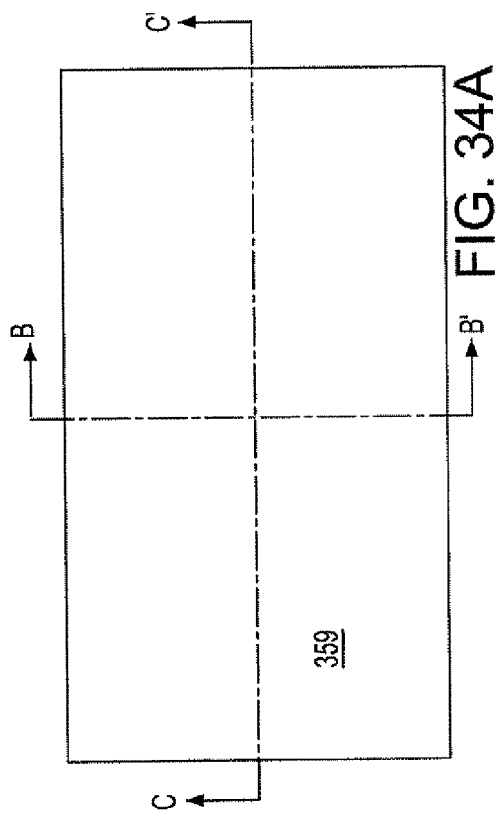
Figure 34C:
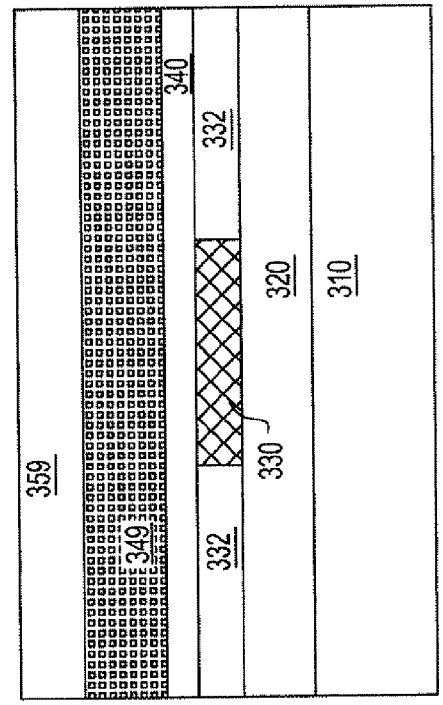

Referring to FIGS. 34A-34C, a third exemplary structure according to a third embodiment of the present invention comprises a semiconductor-on insulator (SOI) substrate including a handle substrate 310, a buried insulator layer 320, and a semiconductor-on-insulator (SOI) layer 330. The composition the SOI layer 330 may be the same as the SOI layer 129 of the first exemplary structure in the first embodiment. The SOI layer 330 may be doped with p-type dopants or with n-type dopants, or alternatively, may be substantially intrinsic. Shallow trench isolation (STI) 332 is formed by removing a portion of the SOI layer 330 and filling the resulting void with an insulator material using standard processes that are well known in the art. The STI 332 is planarized to the top surface of the SOI layer 330.

A first oxide layer 340 is deposited to a preferred thickness ranging from about 30 nm to about 70 nm, preferably by chemical vapor deposition (CVD). The first oxide layer 340 comprises an oxide, and may be, for example, a silicon oxide. The first oxide layer 340 serves as an insulating layer under a gate conductor to be subsequently formed, which reduces a parasitic capacitance between the gate conductor and the SOI layer 330. Next, a gate conductor layer 349 is deposited, for example, by chemical vapor deposition (CVD). The gate conductor layer 349 may comprise polysilicon, a silicide, a metal, other conductive materials, or combinations thereof. Choice of the gate conductor material is in part determined by the work function needs for the finFET device to be formed on the semiconductor fin 330.

The gate conductor layer 349, to a large extent, determines the height of a semiconductor fin to be subsequently formed, and has a thickness from about 100 nm to 300 nm, although thinner or thicker values of the thickness are also contemplated. A gate cap layer 359 is deposited to a thickness ranging from about 20 nm to about 50 nm. The gate cap layer 359 may comprise silicon nitride.

Figure 35B:
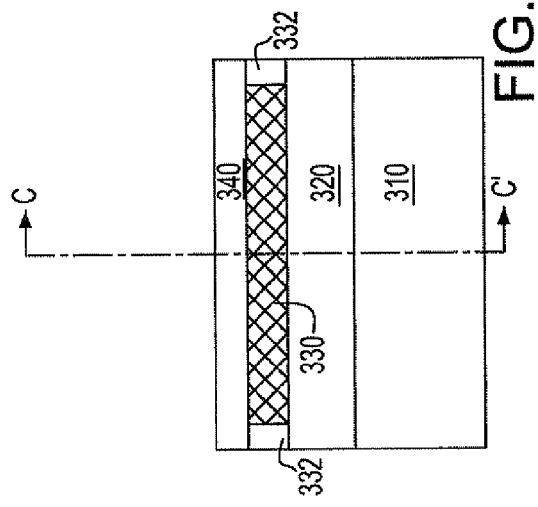
Figure 35A:
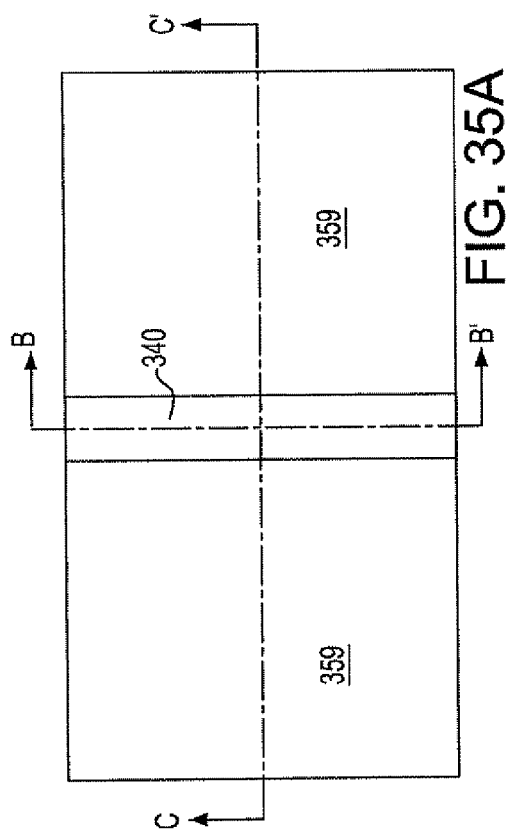
Figure 35C:
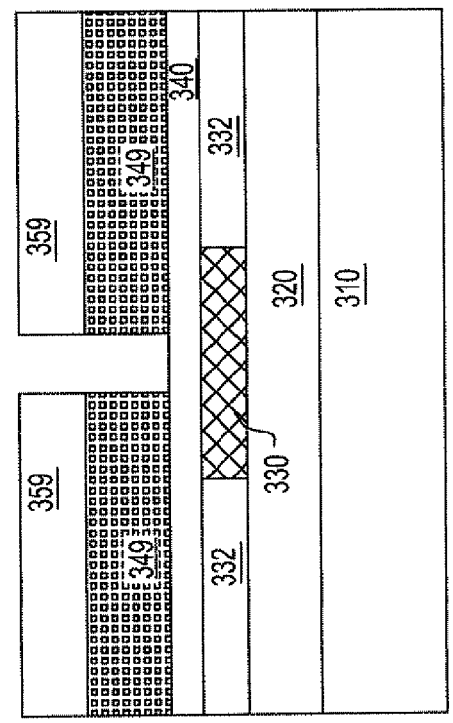

Referring to FIGS. 35A-35C, an aperture (not labeled) in the shape of a trough is etched through the gate cap layer 359 and a first oxide layer. The aperture is formed by lithographically patterning an applied photoresist (not shown) and transferring the pattern on the photoresist into the gate cap layer 359 and the gate conductor layer 349. Typically, a reactive ion etch is employed to transfer the pattern in the photoresist onto the gate cap layer 359 and the gate conductor layer 349. Preferably, the etch stops on the first oxide layer 340.

Figure 36B:
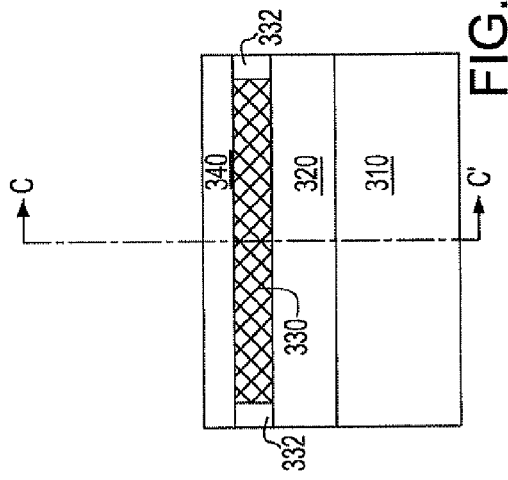
Figure 36A:
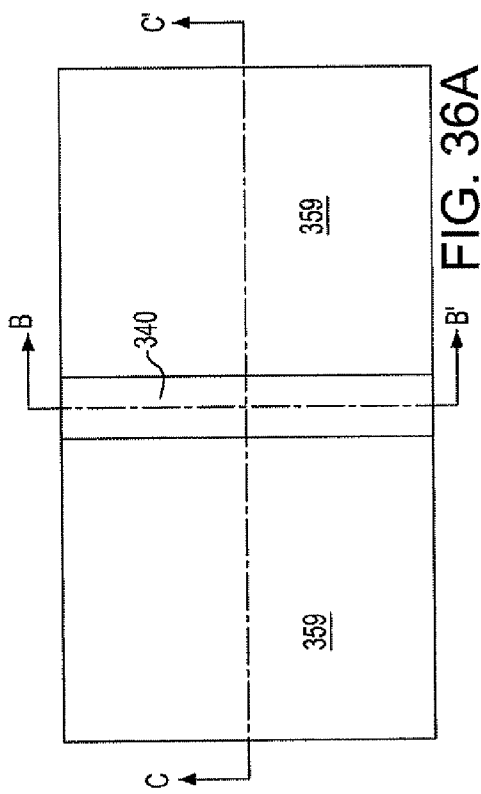
Figure 36C:
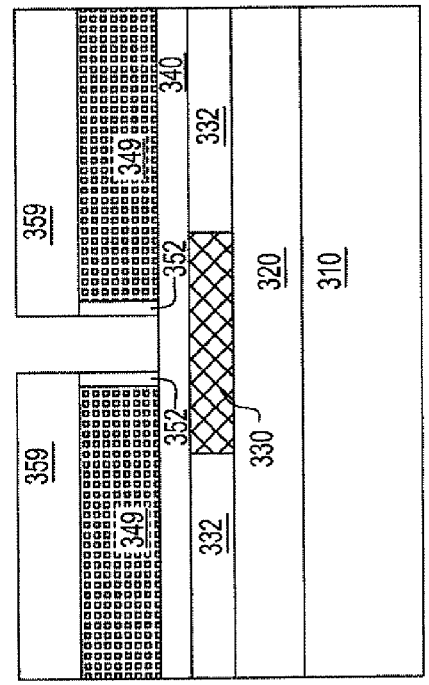

Referring to FIGS. 36A-36C, a gate dielectric 352 is formed on the exposed sidewalls of the gate conductor layer 349 within the aperture. The gate dielectric 352 may comprise a thermally grown or conformally deposited silicon dioxide, nitrided silicon oxide, other suitable insulating materials such as high-K dielectric materials, or combinations thereof.

Figure 37B:
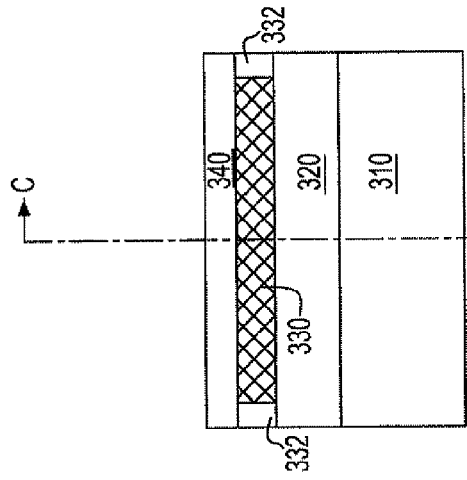
Figure 37A:
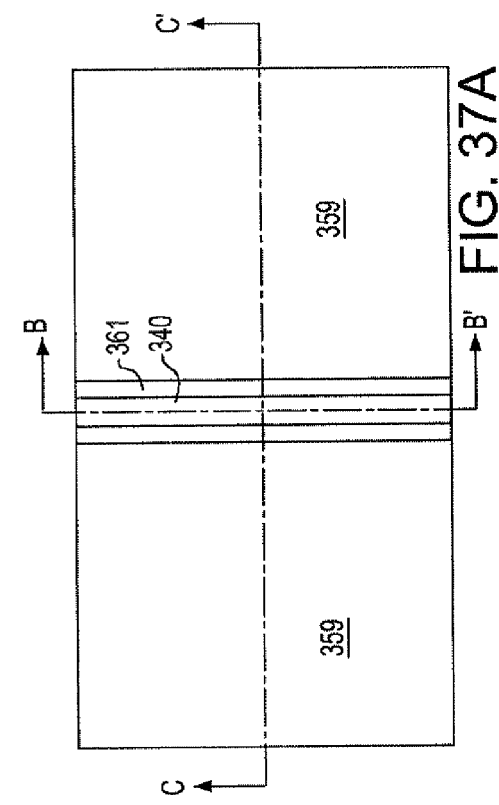
Figure 37C:
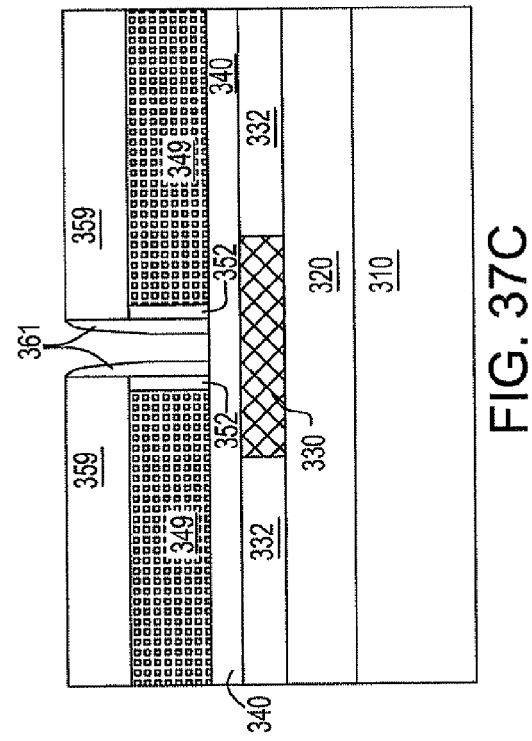
Figure 39B:
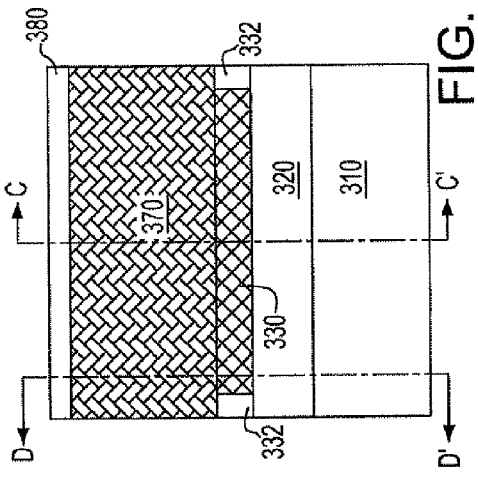
Figure 39D:
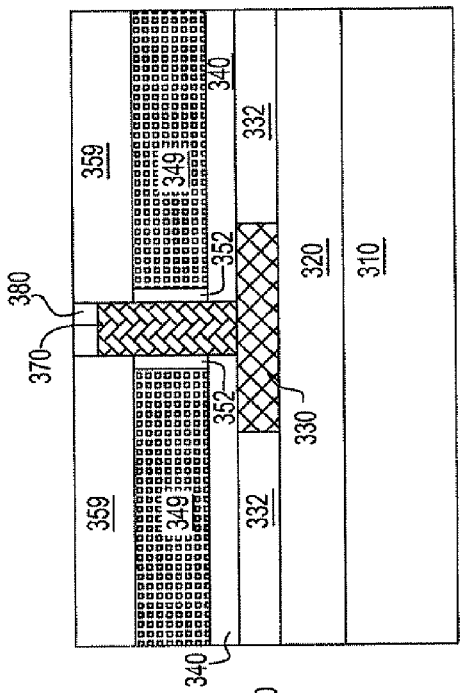
Figure 39A:
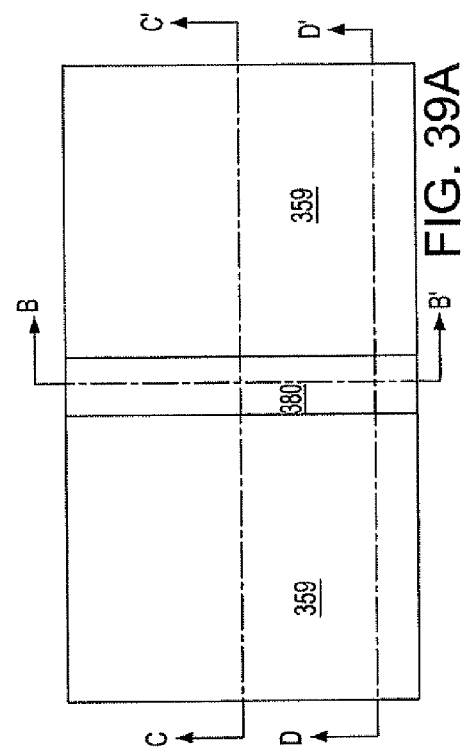
Figure 39C:
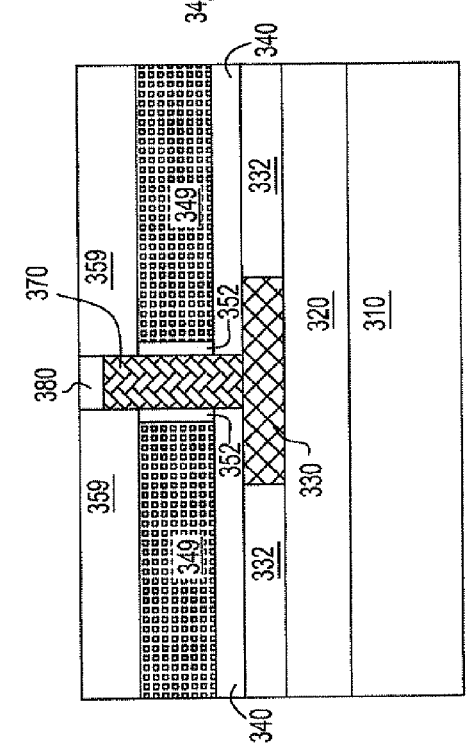
Figure 41B:
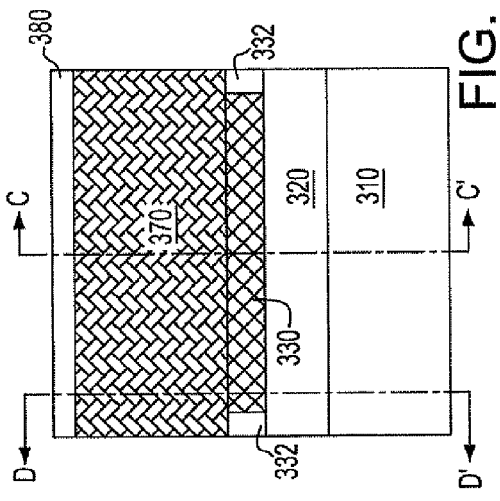
Figure 41D:
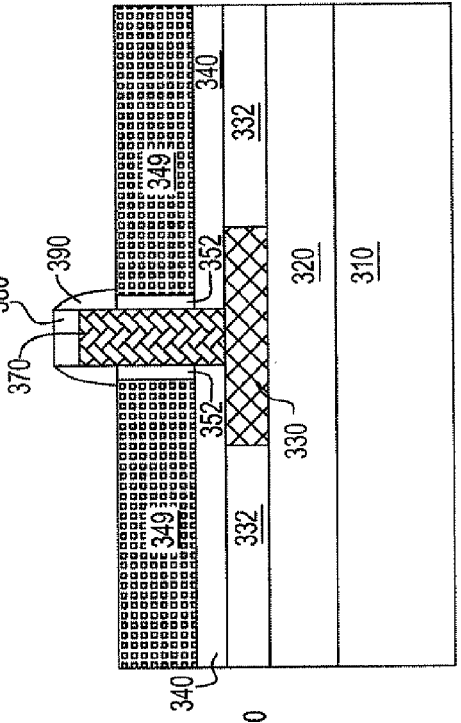
Figure 41A:
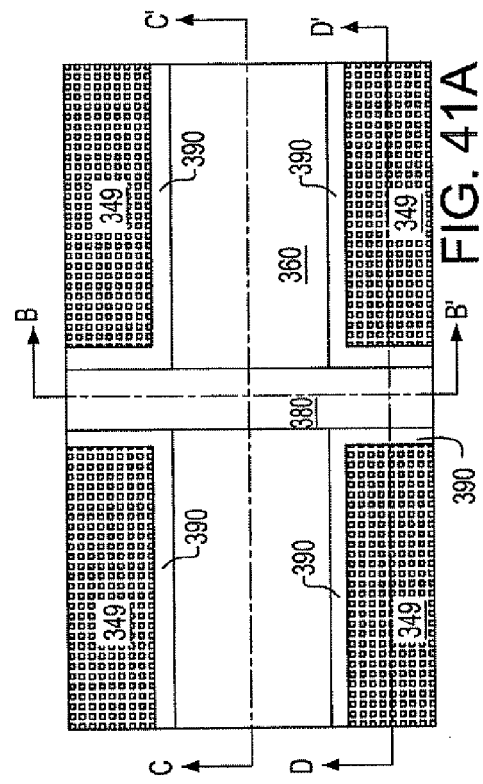
Figure 41C:
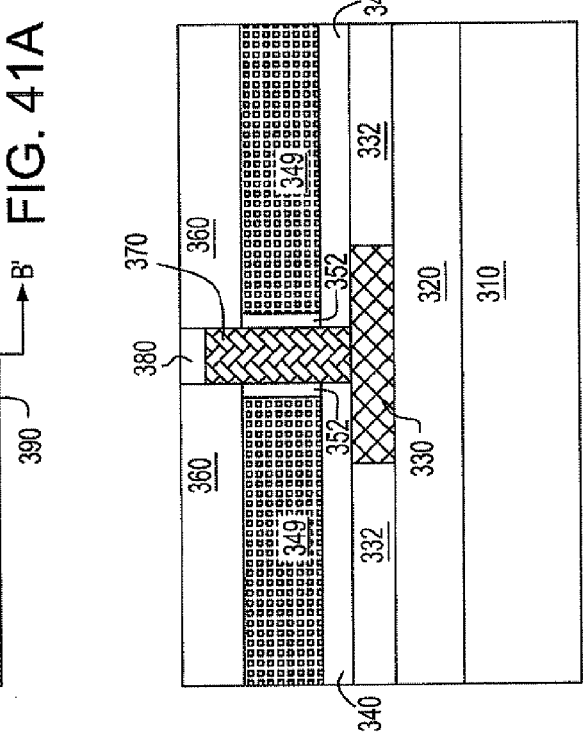
Figure 48B:
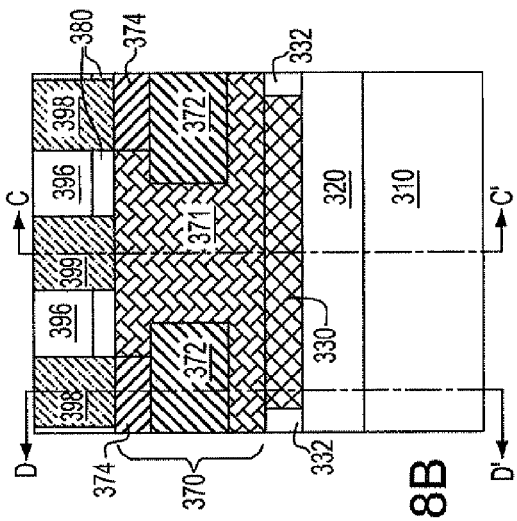
Figure 48D:
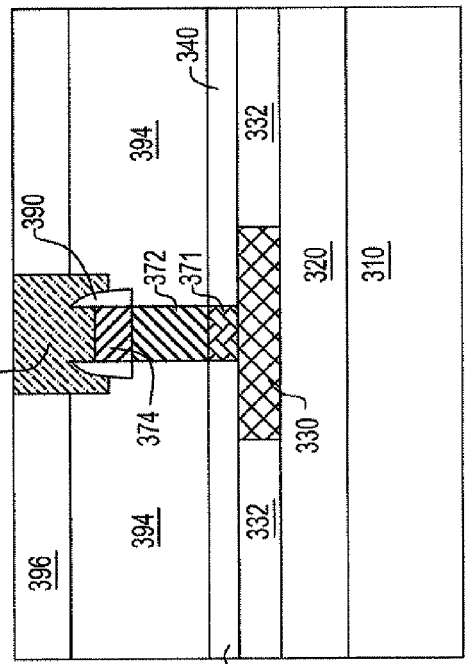
Figure 48A:
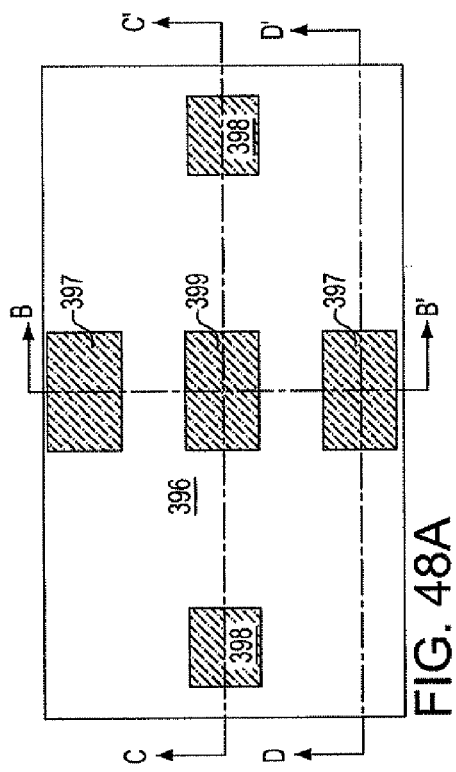
Figure 48C:
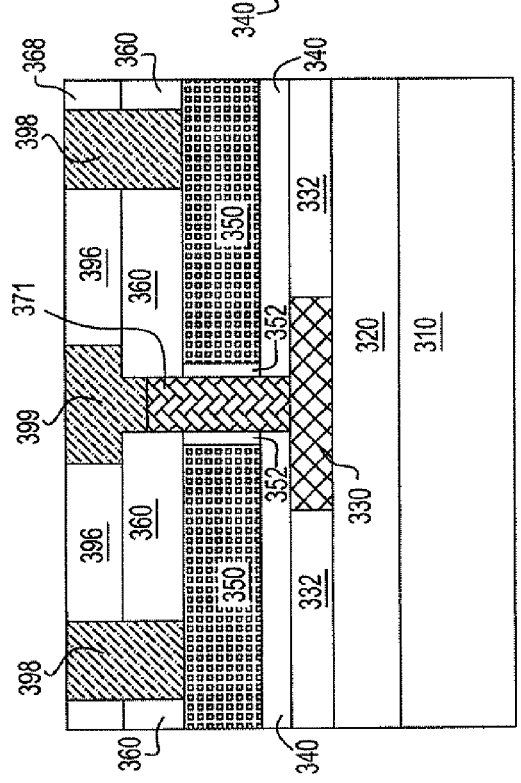

Referring to FIGS. 37A-37C, a layer of protective polymer may optionally be conformally deposited and etched by a reactive ion etch to form a polymer spacer coating 361 on the gate dielectric 352. The formation of the layer of protective polymer and the polymer spacer coating 361 may be omitted.

Referring to FIGS. 38A-38D, the first oxide layer 340 is etched through to expose a top surface of the SOI layer 30.

The optional polymer spacer coating 361 is removed, for example, by a wet etch that is selective to the gate dielectric 352.

Referring to FIGS. 39A-39D, a semiconductor material is grown from the SOI layer 330 by a selective epitaxy process to form a semiconductor fin 370. The semiconductor fin 370 and the SOI layer 330 may comprise the same material, in which case their lattice constants are matched, or alternatively, may comprise different materials having a lattice mismatch that is small enough to enable epitaxial alignment of the atoms of the semiconductor fin 370 the lattice of the SOI layer 330. For example, both the semiconductor fin 370 and the SOI layer 330 may be silicon. The semiconductor fin 370 may be p-doped or n-doped with a dopant concentration typically from about $5.0 \times 10^{14}/cm^3$ to about $3.0 \times 10^{17}/cm^3$. The doping type of the semiconductor fin 370 is herein referred to as a first conductivity type.

The process and structure for the semiconductor fin 370 according to the third embodiment is the same as in the second embodiment. During the selective epitaxy process, the semiconductor material of the semiconductor fin 370 grows only from a semiconductor surface. Growth of the semiconductor material does not occur on a dielectric surface since nucleation of semiconductor material on a dielectric surface is suppressed in a selective epitaxy process. The semiconductor fin 370 is epitaxially aligned to the SOI layer 330 and has the same crystallographic orientations as the SOI layer 330. The semiconductor fin 370 grows upward through the aperture, and then overgrows over the top surface of the gate cap layer 359. The overgrowth of the semiconductor material above the top surface of the gate cap layer 359 may be removed, for example, by chemical mechanical polishing (CMP).

A top surface of the semiconductor fin 370 is recessed by a depth ranging from about 20 nm to about 50 nm below the top surface of the gate cap layer 359. A dielectric fin cap layer (not shown) is conformally deposited, for example, by CVD to fill the recessed region above the semiconductor fin 370. The dielectric fin cap layer may comprise a CVD nitride such as silicon nitride. The material of the dielectric fin cap layer above the top surface of the gate cap layer 359 is removed by a reactive ion etch, chemical mechanical planarization, or a combination of both. A fin cap 380 comprising the same dielectric material as the original dielectric fin cap layer is formed below the top surface of the gate cap layer 359 and directly above the semiconductor fin 370. The fin cap 380 and the semiconductor fin 370 have substantially the same horizontal cross-sectional area.

Referring to FIGS. 40A-40D, the gate cap layer 359 is lithographically patterned for a gate electrode to be subsequently formed. Specifically, the portion of the gate cap layer 359 located above the gate electrode to be formed is covered by a photoresist (not shown) while the rest of the gate cap layer 359 outside the area of the gate electrode is exposed and etched, for example, by a reactive ion etch. The reactive ion etch is selective to the fin cap 380. The remaining patterned gate cap layer 359 forms a patterned gate cap 360, which has two portions located on each side of the semiconductor fin 370. At the end of the reactive ion etch, top surfaces of the gate conductor layer 349 are exposed. The photoresist is removed thereafter.

Referring to FIGS. 41A-41D, a dielectric spacer 390 is formed on the sidewalls of the gate cap layer 359 and the sidewalls of the fin cap 380. The dielectric spacer 390 has a width preferably between 10 nm and 50 nm, although narrower or wider dielectric spacers 390 are also contemplated.

The dielectric spacer 380 protects the upper portion of the semiconductor fin 390 from subsequent doping of source and drain regions to be formed.

Referring to FIGS. 42A-42D, exposed portions of the gate conductor layer 349 is etched by a reactive ion etch employing the patterned gate cap 360 as a hard mask. The portion of the gate conductor layer 349 underneath the dielectric spacer is removed by an isotropic etch, for example, a dry isotropic etch or a wet etch. The gate dielectric 352 on the exposed portions of the sidewalls of the semiconductor fin 370 is removed by an isotropic etch, for example, another dry isotropic etch or another wet etch.

Source and drain regions 372 are formed in the exposed areas of the semiconductor fin 370. The source and drain regions 372 are doped with dopants of a second conductivity type, which is the opposite conductivity of the first conductivity type. The source and drain regions 372 have a dopant concentration from about $3.0 \times 10^{19}/cm^3$ to about $5.0 \times 10^{21}/cm^3$, and preferably from about $1.0 \times 10^{20}/cm^3$ to about $1.0 \times 10^{21}/cm^3$. The doping of the source and drain regions 372 may be achieved by angled ion implantation, gas phase doping, plasma immersion doping, or other suitable methods.

The portion of the semiconductor fin 370 that is not implanted with additional dopants during the source and drain doping processing step forms a body 371. The body 371 maintains the doping of the first conductivity type of the semiconductor fin 370 as originally grown by the selective epitaxy process. The top surface, the bottom surface, and a side surface of each of the source and drain regions 372 abut the body 371.

Referring to FIGS. 43A-43D, a planarization dielectric 394 is deposited to a height that is at least equal to the height of the top surface of the fin cap 380 and the top surface of the patterned gate cap 360. The planarization dielectric 394 may be, for example, a CVD oxide. The CVD oxide may be an undoped silicate glass (USG), borosilicate glass (BSG), phosphosilicate glass (PSG), fluorosilicate glass (FSG), borophosphosilicate glass (BPSG), or a combination thereof. Then the planarization dielectric 394 is planarized to the top of the fin cap 380. The semiconductor fin 30 at this point comprises the body 371 having a doping of the first conductivity type and the source and drain regions 372 having a doping of the second conductivity type.

Referring to FIGS. 44A-44D, source and drain contact via holes are formed in a source/drain contact region SDC through the planarization dielectric 394 onto the semiconductor fin 370. This may be achieved by applying a photoresist (not shown) and employing a via mask to pattern the source and drain contact via holes in the photoresist. The pattern is subsequently transferred through the planarization dielectric 394 by a reactive ion etch. The pattern for the source and drain contact via holes may overlap into the adjacent planarization dielectric 394 without causing any concern for electrical shorts with other semiconductor components. In this sense, the source and drain contact via holes are self-aligned to the semiconductor fin 370.

A heavy shallow ion implantation of the dopants of the second conductivity type is performed through the source and drain contact via holes into a top portion of the body 371 to form source and drain reach-through regions 374. The source and drain reach-through regions 374 have substantially the same level of doping concentration as the source and drain regions 372. The source and drain reach-through regions 374 enables low resistance electrical contact between the source and drain regions 372 and the source and drain contact via to be subsequently formed.

Referring to FIGS. 45A-45D, two gate contact vias are formed in a gate contact region GC through the patterned gate cap 360 onto the gate conductor 350. The pattern for the gate contact via holes may fall outside the area of the gate conductor 350 without causing any concern for electrical shorts with other semiconductor components. In this sense, the gate contact via holes are self-aligned to the gate conductor 350.

Referring to FIGS. 46A-46D, a body contact via is formed through the fin cap 380 onto the body 371 in a body contact region BC by a reactive ion etch. Preferably, the reactive ion etch is selective to the planarization dielectric 394. In this case, the body contact via hole is confined between the two portions of the patterned gate cap 360 irrespective of overlay variations of the body contact via hole. In this sense, the body contact via is self aligned to the semiconductor fin 370.

Referring to FIGS. 47A-47D, the various contacts via holes are filled with metal and planarized. Source and drain contact vias 397 are formed directly on the source and drain reach-through regions 374. Two gate contact vias 398 are formed directly on the gate electrode 360. A body contact via 399 is formed directly on the portion of the body 371 that is located direct above the channel region that is located between the source and drain regions 372. The various contact vias (397, 398, and 399) may comprise a conductive metal such as Ti, Ta, W, Cu, or Al. Also, the various contact vias (397, 398, and 399) may also comprise a metal compound liner such as TaN, TiN, and WN to improve adhesion or other structural and electrical properties of the contact vias.

Note that a gate contact via 398 is formed on both portions of the gate conductor 350 on each side of the semiconductor fin 370. Therefore, each of the gate electrode 350 is independently controllable.

The third exemplary semiconductor structure comprises a semiconductor fin 370 located on a buried insulator layer 320 of a semiconductor-on-insulator (SOI) substrate. The semiconductor fin 370 has source and drain regions 372 disjoined from a top surface of the semiconductor fin 370, source and drain reach-through regions 374 abutting the source and drain regions 372 and the top surface of the semiconductor fin 370, a body separating the source and drain regions 372 and abutting the top surface of the semiconductor fin 370. The third exemplary semiconductor structure further comprises a body contact via 399 abutting the body 371 at the top surface of the semiconductor fin 370.

The third exemplary semiconductor structure further comprises source and drain contact vias 397 abutting the source and drain reach-through regions 374. The third exemplary semiconductor structure further comprises a gate dielectric 352 located on two sidewalls of the body 371 of the semiconductor fin 370, two disjoined portions of a gate conductor 350 directly contacting the gate dielectric 352, and two gate contact vias 398, each of which contacting one of the two disjoined portions of the gate conductor 350.

The third exemplary semiconductor structure further comprises dielectric spacers 390 contacting the body 371, the source and drain reach-through regions 374, and the source and drain contact vias 398. Two disjoined portions of a patterned gate cap 360 abut the body contact via 399 and the two disjoined portions of the gate conductor 350. A fin cap 380 abuts the top surface of the semiconductor fin 370, the two disjoined portions of the patterned gate cap 360, the body contact via 399, and the source and drain contact vias 397. The fin cap 380 is disjoined from the two disjoined portions of the gate conductor 350.

The body contact via 399 is self aligned to an intersection of the semiconductor fin and the two disjoined portions of the gate conductor 350.

Referring to FIGS. 48A-48D, a variation of the third exemplary structure is shown, in which a middle-of-line (MOL) dielectric layer 396 is formed on top of the planarization dielectric 394 to increase the height of the various contact vias.

Additional interlevel dielectric layers, metal wiring layers, and interconnect vias may then be formed and patterned by methods well known in semiconductor processing technology.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A semiconductor structure comprising:
a semiconductor fin located on a buried insulator layer of a semiconductor-on-insulator (SOI) substrate and having a width that is substantially the same throughout said semiconductor fin;
source and drain regions disjoined from a top surface of said semiconductor fin;
source and drain reach-through regions abutting said source and drain regions and said top surface of said semiconductor fin;
a body separating said source and drain regions and abutting said top surface of said semiconductor fin;
a body contact via abutting said body at said top surface of said semiconductor fin;
source and drain contact vias abutting said source and drain reach-through regions;
a gate dielectric located on two sidewalls of said body of said semiconductor fin;
two disjoined portions of a gate conductor directly contacting said gate dielectric; two gate contact vias, each of which contacting one of said two disjoined portions of said gate conductor;
dielectric spacers contacting said body, said source and drain reach-through regions, and said source and drain contact vias;
two disjoined portions of a patterned gate cap abutting said body contact via and said two disjoined portions of said gate conductor; and
a fin cap abutting said top surface of said semiconductor fin, said two disjoined portions of said patterned gate cap, said body contact via, and said source and drain contact vias and disjoined from said two disjoined portions of said gate conductor, wherein said body contact via is self aligned to an intersection of said semiconductor fin and said two disjoined portions of said gate conductor.

* * * * *